(12) United States Patent
Yoshihara et al.

(10) Patent No.: US 8,536,670 B2
(45) Date of Patent: Sep. 17, 2013

(54) SEMICONDUCTOR DEVICE, MANUFACTURING METHOD THEREFOR, AND ELECTRONIC APPARATUS

(75) Inventors: Ikuo Yoshihara, Kanagawa (JP); Taku Umebayashi, Kanagawa (JP); Hiroshi Takahashi, Kumamoto (JP); Hironobu Yoshida, Tokyo (JP)

(73) Assignee: Sony Corporation (JP)

( * ) Notice: Subject to any disclaimer, the term of this patent is extended or adjusted under 35 U.S.C. 154(b) by 93 days.

(21) Appl. No.: 13/216,654

(22) Filed: Aug. 24, 2011

(65) Prior Publication Data

US 2012/0056288 A1   Mar. 8, 2012

(30) Foreign Application Priority Data

Sep. 2, 2010   (JP) .................................. 2010-196639

(51) Int. Cl.
*H01L 31/04* (2006.01)
*H01L 21/66* (2006.01)
*H01L 23/538* (2006.01)

(52) U.S. Cl.
USPC ............. 257/431; 257/777; 257/E21.521; 257/E23.169; 257/E31.001; 438/15

(58) Field of Classification Search
USPC ............... 257/431, 777, E31.001, E23.169, 257/E21.521; 438/15
See application file for complete search history.

(56) References Cited

U.S. PATENT DOCUMENTS

| | | |
|---|---|---|
| 2004/0157410 A1 | 8/2004 | Yamaguchi |
| 2005/0227403 A1 | 10/2005 | Muramatsu |
| 2006/0023109 A1 | 2/2006 | Mabuchi et al. |
| 2006/0197007 A1 | 9/2006 | Iwabuchi et al. |
| 2007/0228544 A1 | 10/2007 | Jung et al. |
| 2009/0020842 A1 | 1/2009 | Shaiau et al. |

FOREIGN PATENT DOCUMENTS

| | | |
|---|---|---|
| JP | 05-268535 | 10/1993 |
| JP | 2006-049361 | 2/2006 |
| JP | 2006-013089 | 1/2007 |

OTHER PUBLICATIONS

European Search Report dated Jan. 27, 2012, issued in connection with counterpart EP Application No. 11 00 6356.

*Primary Examiner* — David S Blum
(74) *Attorney, Agent, or Firm* — Sheridan Ross P.C.

(57) ABSTRACT

A semiconductor device includes: a first semiconductor chip; and a second semiconductor chip that is stacked on the first semiconductor chip. The first semiconductor chip includes a first wiring portion of which a side surface is exposed at a side portion of the first semiconductor chip. The second semiconductor chip includes a second wiring portion of which a side surface is exposed at a side portion of the second semiconductor chip. The respective side surfaces of the first wiring portion and the second wiring portion, which are exposed at the side portions of the first semiconductor chip and the second semiconductor chip, are covered by a conductive layer, and the first wiring portion and the second wiring portion are electrically connected to each other through the conductive layer.

16 Claims, 40 Drawing Sheets

(e)

(f)

(i)

(j)

(k)

(m)

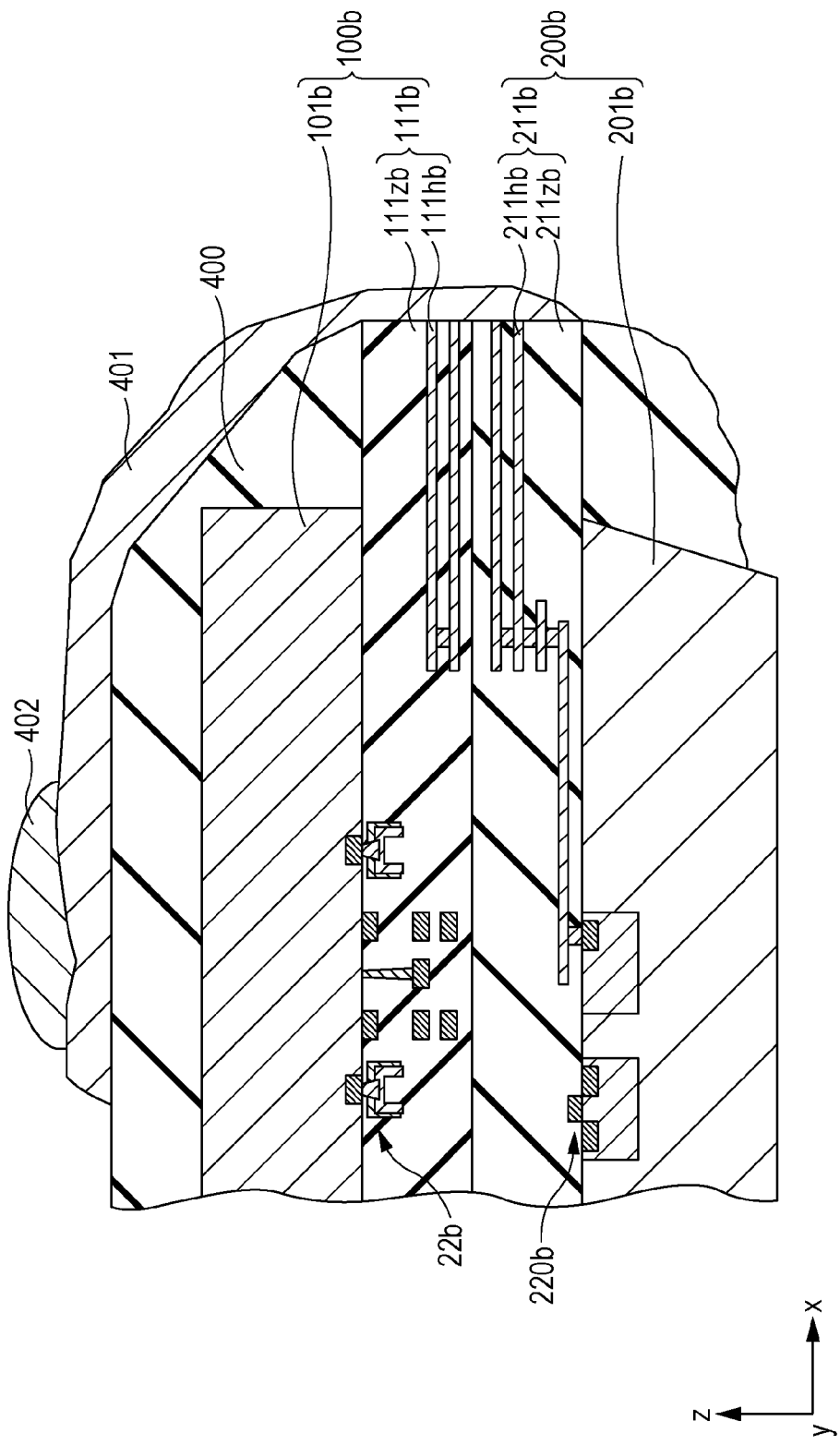

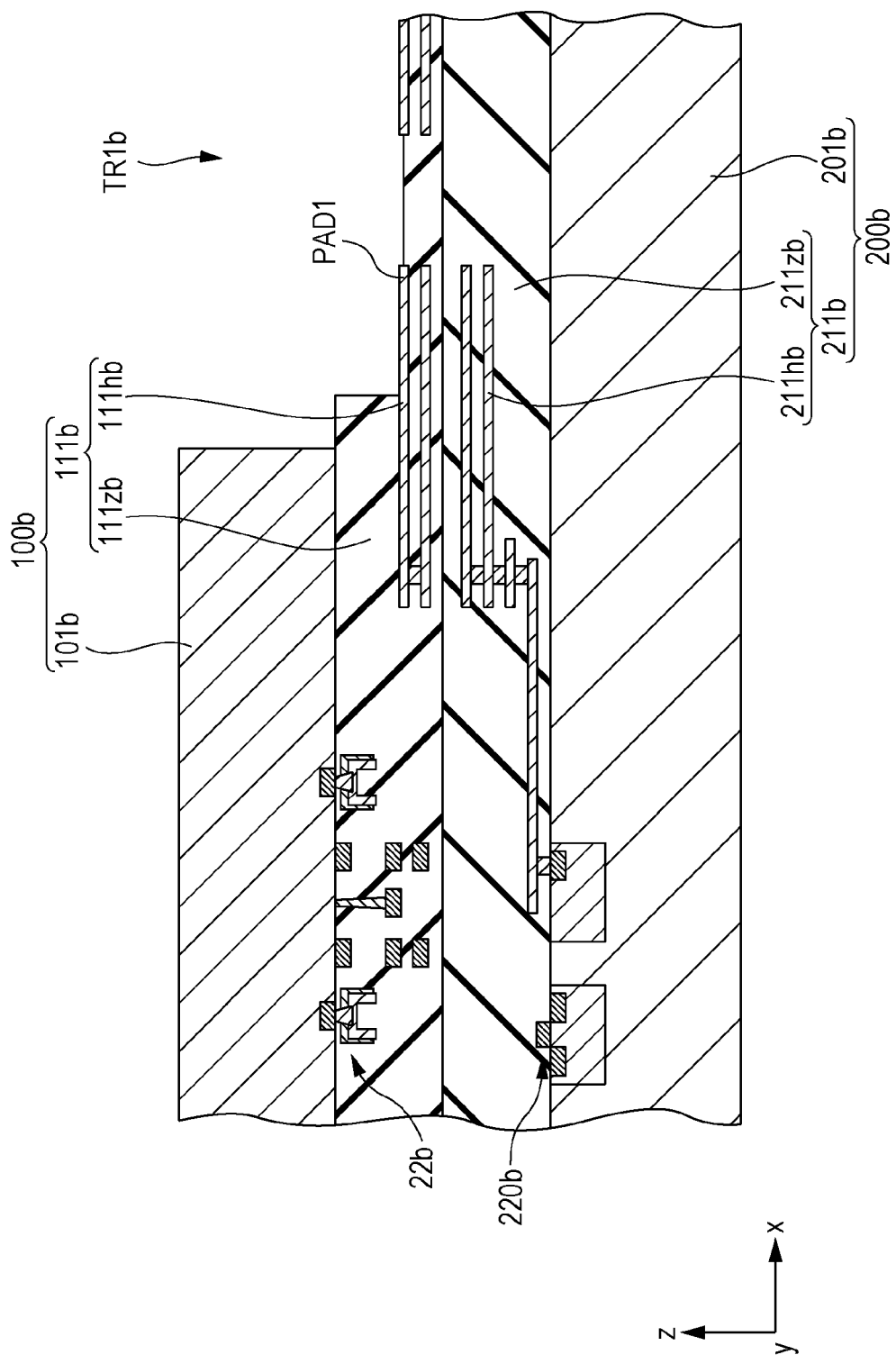

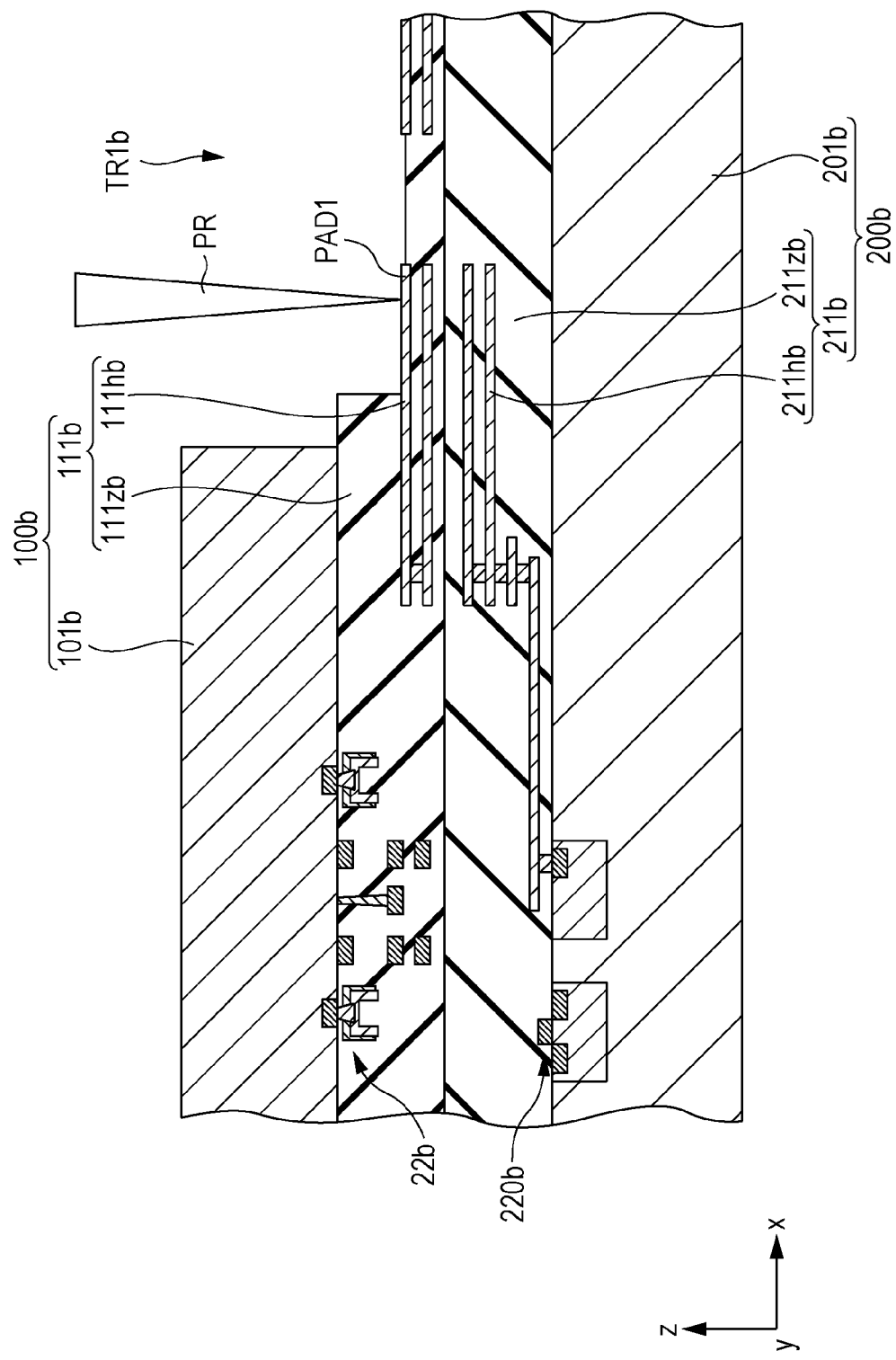

(g)

(i)

(a)

(d)

(h)

(j)

SEMICONDUCTOR DEVICE, MANUFACTURING METHOD THEREFOR, AND ELECTRONIC APPARATUS

BACKGROUND

The present disclosure relates to a semiconductor device such as a solid-state imaging device and a manufacturing method therefore. Further, the disclosure relates to an electronic apparatus such as a camera including a solid-state imaging device.

Electronic apparatuses such as a digital video camera and a digital still camera include semiconductor devices such as a solid-state imaging device. For example, examples of the solid-state imaging device include a CMOS (Complementary Metal Oxide Semiconductor) image sensor and a CCD (Charge Coupled Device) image sensor.

The solid-state imaging device is configured such that a plurality of pixels are formed in an array on a surface of a semiconductor substrate. Each pixel is provided with a photoelectric conversion portion. The photoelectric conversion portion is, for example, a photodiode, and receives light, which is incident through an external optical system, in a light receiving surface and photoelectrically converts the light, thereby generating a signal charge.

In the solid-state imaging device, the CMOS image sensor is configured such that each pixel includes not only the photoelectric conversion portion but also a pixel transistor. The pixel transistor includes a plurality of transistors, and reads out the signal charge, which is generated by the photoelectric conversion portion, and outputs the signal charge as an electric signal to a signal line. The CMOS image sensor has low power consumption, and is thus mostly used in mobile apparatuses such as a camera-mounted mobile phone and a PDA (Personal Digital Assistant).

As the above-mentioned semiconductor device, there is proposed a "3-dimensional multilayer chip structure" in which a plurality of semiconductor chips having different functions are stacked and electrically connected to each other.

In the "3-dimensional multilayer chip structure", each circuit can be optimally formed so as to correspond to the function of the each semiconductor chip, and thus it is possible to achieve a high-functional apparatus. For example, a sensor circuit and a logic circuit are optimally formed so as to correspond to the respective functions of the semiconductor chip, which includes the sensor circuit, and the semiconductor chip, which includes the logic circuit provided with a circuit for processing signals, whereby it is possible to manufacture a high-functional solid-state imaging device. Here, by providing penetration electrodes in the substrate of the semiconductor chip, the plurality of semiconductor chips are electrically connected (For example, refer to Japanese Unexamined Patent Application Publication Nos. 2006-49361 and 2007-13089).

SUMMARY

As it is, in the case of a "3-dimensional multilayer chip structure", it is necessary to make deep through-holes which penetrate through a substrate while securing insulation, and thus it is difficult to improve manufacturing efficiency.

For example, in order to form a small hole of which the size is 1 μm, it is necessary to thin the substrate. However, in this case, it is necessary to separately perform processes such as a process of bonding the substrate to a supporting substrate before the thinning. Hence, since it is difficult to improve manufacturing efficiency, costs may increase. Further, in order to embed a conductive material in the hole with a high aspect ratio, it is necessary to use a conductive material, which is excellent in covering property, such as tungsten. Therefore, sometimes there may be a restriction in the selection of the conductive material.

Further, in a case where each semiconductor chip achieves electrical connection by bonding the surfaces of the circuits to each other, if the substrate is thick (for example, a thickness of several hundreds of μm), a process of forming deep holes, a process of forming extraction electrodes, a process of forming solder balls, and the like are necessary. Hence, costs may increase.

Further, the stress, which occurs at the time of the bonding, may be concentrated on a weak part of the bonded surfaces, and cracks may occur on the part. Thus, reliability of the apparatus may deteriorate. When a semiconductor wafer is divided into a plurality of pieces through dicing, cracks may also occur between the bonded surfaces. Thus, the reliability of the apparatus may also deteriorate.

Otherwise, since it is necessary to secure electrical connection between a plurality of semiconductor wafers, it is difficult to miniaturize the electrode pads, and thus it is also difficult to miniaturize the chip.

As described above, in the "3-dimensional multilayer chip structure", it may be difficult to improve manufacturing efficiency and lower costs. Otherwise, in the "3-dimensional multilayer chip structure", it may be difficult to improve reliability of the apparatus and achieve miniaturization.

Consequently, the disclosure provides a semiconductor device, a manufacturing method therefor, and an electronic apparatus capable of improving manufacturing efficiency, lowering costs, improving reliability of the apparatus, and achieving miniaturization.

According to an embodiment of the disclosure, a semiconductor device includes: a first semiconductor chip; and a second semiconductor chip that is stacked on the first semiconductor chip. The first semiconductor chip includes a first wiring portion of which a side surface is exposed at a side portion of the first semiconductor chip. The second semiconductor chip includes a second wiring portion of which a side surface is exposed at a side portion of the second semiconductor chip. The respective side surfaces of the first wiring portion and the second wiring portion, which are exposed at the side portions of the first semiconductor chip and the second semiconductor chip, are covered by a conductive layer, and the first wiring portion and the second wiring portion are electrically connected to each other through the conductive layer.

It is preferable that the first semiconductor chip should be thinner than the second semiconductor chip. It is also preferable that the second semiconductor chip should be provided as a supporting substrate which supports the first semiconductor chip.

It is preferable that, in the first semiconductor chip, pixels, each of which includes a photoelectric conversion portion, should be formed. It is also preferable that the photoelectric conversion portion should be provided to receive incident light which is incident from a surface of the first semiconductor chip on a side opposite to a surface thereof on which the second semiconductor chip is stacked.

It is preferable that the first semiconductor chip should include a semiconductor memory element.

It is preferable that the first semiconductor chip includes a semiconductor element which is formed on an SOI (Silicon on Insulator) substrate.

It is preferable that the second semiconductor chip should include a signal processing circuit.

It is preferable that the first semiconductor chip should have a first semiconductor substrate, and a first wiring layer which is stacked on the first semiconductor substrate and of which the first wiring portion is formed in an insulation layer. It is also preferable that the second semiconductor chip should have a second semiconductor substrate, and a second wiring layer which is stacked on the second semiconductor substrate and of which the second wiring portion is formed in an insulation layer. It is preferable that the first wiring layer and the second wiring layer should be opposed to each other, and the opposed surfaces of the first semiconductor chip and the second semiconductor chip should be bonded to each other.

According to another embodiment of the disclosure, a method of manufacturing a semiconductor device includes: a chip stacking process of stacking a second semiconductor chip on a first semiconductor chip; a side surface exposure process of exposing a side surface of a first wiring portion, which is formed on the first semiconductor chip, and a side surface of a second wiring portion, which is formed on the second semiconductor chip, at a side portion of a stacked body in which the first semiconductor chip and the second semiconductor chip are stacked; and a conductive layer formation process of electrically connecting the first wiring portion and the second wiring portion to each other by providing a conductive layer so as to cover the side surfaces of the first wiring portion and the second wiring portion which are exposed at side portions of the first semiconductor chip and the second semiconductor chip.

It is preferable that a process of forming the first semiconductor chip should include a first wiring layer formation process of stacking a first wiring layer, of which the first wiring portion is formed in an insulation layer, on a first semiconductor substrate. It is also preferable that a process of forming the second semiconductor chip should include a second wiring layer formation process of stacking a second wiring layer, of which the second wiring portion is formed in an insulation layer, on a second semiconductor substrate. It is also preferable that, in the chip stacking process, the first wiring layer and the second wiring layer should be opposed to each other, and the opposed surfaces of the first semiconductor chip and the second semiconductor chip should be bonded to each other.

It is preferable that the process of forming the first semiconductor chip should further include a thinning process of thinning the first semiconductor substrate. It is also preferable that, in the thinning process, the first semiconductor substrate should be thinned after the second semiconductor chip is stacked and supported on the first semiconductor chip in the stacking of the second semiconductor chip.

It is preferable that the method should further include: a first pad surface exposure process of exposing a surface of a first pad electrode which is formed so as to be electrically connected to the first wiring portion at the side portion of the first semiconductor chip; and a first chip test process of testing the first semiconductor chip by using the first pad electrode. It is also preferable that the first pad surface exposure process and the first chip test process should be performed before the side surface exposure process. It is also preferable that, when the side surfaces of the first wiring portion and the second wiring portion are exposed in the side surface exposure process, the first pad electrode should be removed.

It is preferable that the method further includes: a second pad surface exposure process of exposing a surface of a second pad electrode which is formed so as to be electrically connected to the second wiring portion at the side portion of the second semiconductor chip; and a second chip test process of testing the second semiconductor chip by using the second pad electrode. It is also preferable that the second pad surface exposure process and the second chip test process should be performed before the side surface exposure process. It is also preferable that, when the side surfaces of the first wiring portion and the second wiring portion are exposed in the side surface exposure process, the second pad electrode should be removed.

It is preferable that the method should further include: a substrate provision process of providing a substrate such that the substrate is opposed to a surface of the first semiconductor chip opposite to a surface thereof on which the second semiconductor chip is stacked. It is also preferable that the substrate provision process should be performed between the first chip test process and the second pad surface exposure process.

According to a further embodiment of the disclosure, an electronic apparatus includes: a first semiconductor chip; and a second semiconductor chip that is stacked on the first semiconductor chip. The first semiconductor chip includes a first wiring portion of which a side surface is exposed at a side portion of the first semiconductor chip. The second semiconductor chip includes a second wiring portion of which a side surface is exposed at a side portion of the second semiconductor chip. The respective side surfaces of the first wiring portion and the second wiring portion, which are exposed at the side portions of the first semiconductor chip and the second semiconductor chip, are covered by a conductive layer, and the first wiring portion and the second wiring portion are electrically connected to each other through the conductive layer.

According to the embodiments of the disclosure, it is possible to provide a semiconductor device, a manufacturing method therefor, and an electronic apparatus capable of improving manufacturing efficiency, lowering costs, improving reliability of the apparatus, and achieving miniaturization.

BRIEF DESCRIPTION OF THE DRAWINGS

FIG. 21 is a diagram illustrating principal sections of a semiconductor device according to embodiment 2 of the disclosure;

FIG. 24 is a diagram illustrating the method of manufacturing the semiconductor device according to embodiment 2 of the disclosure;

FIG. 25 is a diagram illustrating the method of manufacturing the semiconductor device according to embodiment 2 of the disclosure;

DETAILED DESCRIPTION OF EMBODIMENTS

Embodiments of the disclosure will be described with reference to the accompanying drawings.

Furthermore, description will be given in order of the following items.

1. Embodiment 1 (Image Sensor Chip+Logic Circuit Chip)
2. Embodiment 2 (Memory Chip+Logic Circuit Chip)
3. Embodiment 3 (SOI High-Speed Device Chip+Logic Circuit Chip)
4. Embodiment 4 (Image Sensor Chip+Memory Chip+Logic Circuit Chip)
5. Others 1. Embodiment 1

(A) Configuration of Device (A-1) Configuration of Principal Sections of Camera

Figure 1:
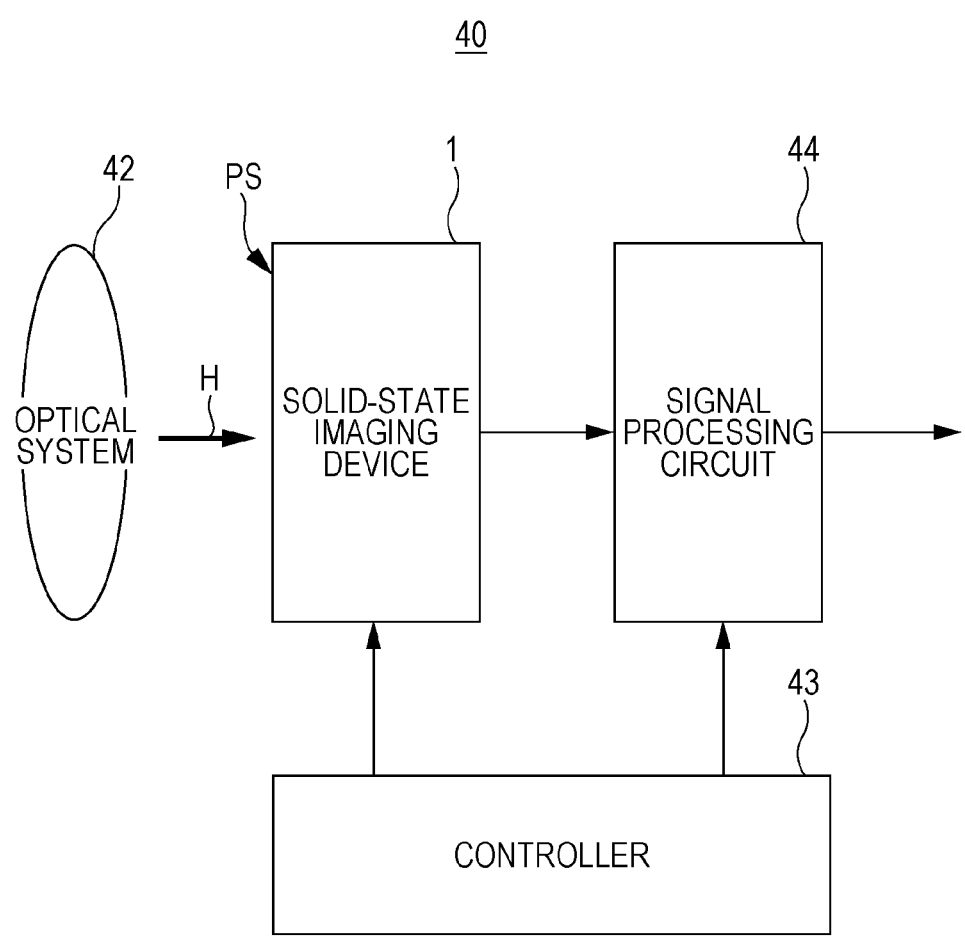
FIG. 1 is a configuration diagram illustrating a configuration of a camera 40 according to embodiment 1 of the disclosure.

FIG. 1 is a configuration diagram illustrating a configuration of a camera 40 according to embodiment 1 of the disclosure.

As shown in FIG. 1, the camera 40 has a solid-state imaging device 1, an optical system 42, a driving circuit section 43, and a signal processing section 44. The respective sections will be described in order of precedence.

The solid-state imaging device 1 receives, by an imaging surface PS thereof, incident light H (an object image) which is incident through the optical system 42, and photoelectrically converts the light to generate a signal charge. Here, the solid-state imaging device 1 is driven on the basis of a control signal which is output from the driving circuit section 43. The signal charge is then read and output as raw data.

The optical system 42 includes optical members such as an imaging lens and an aperture diaphragm, and is disposed to concentrate the incident light H onto the imaging surface PS of the solid-state imaging device 1.

The driving circuit section 43 outputs various control signals to the solid-state imaging device 1 and the signal processing section 44, thereby controlling and driving the solid-state imaging device 1 and the signal processing section 44.

The signal processing section 44 is configured to perform signal processing on electric signals which are output from the solid-state imaging device 1, thereby generating a digital image.

(A-2) Configuration of Principal Sections of Solid-State Imaging Device

The entire configuration of the solid-state imaging device 1 will be described.

Figure 2:
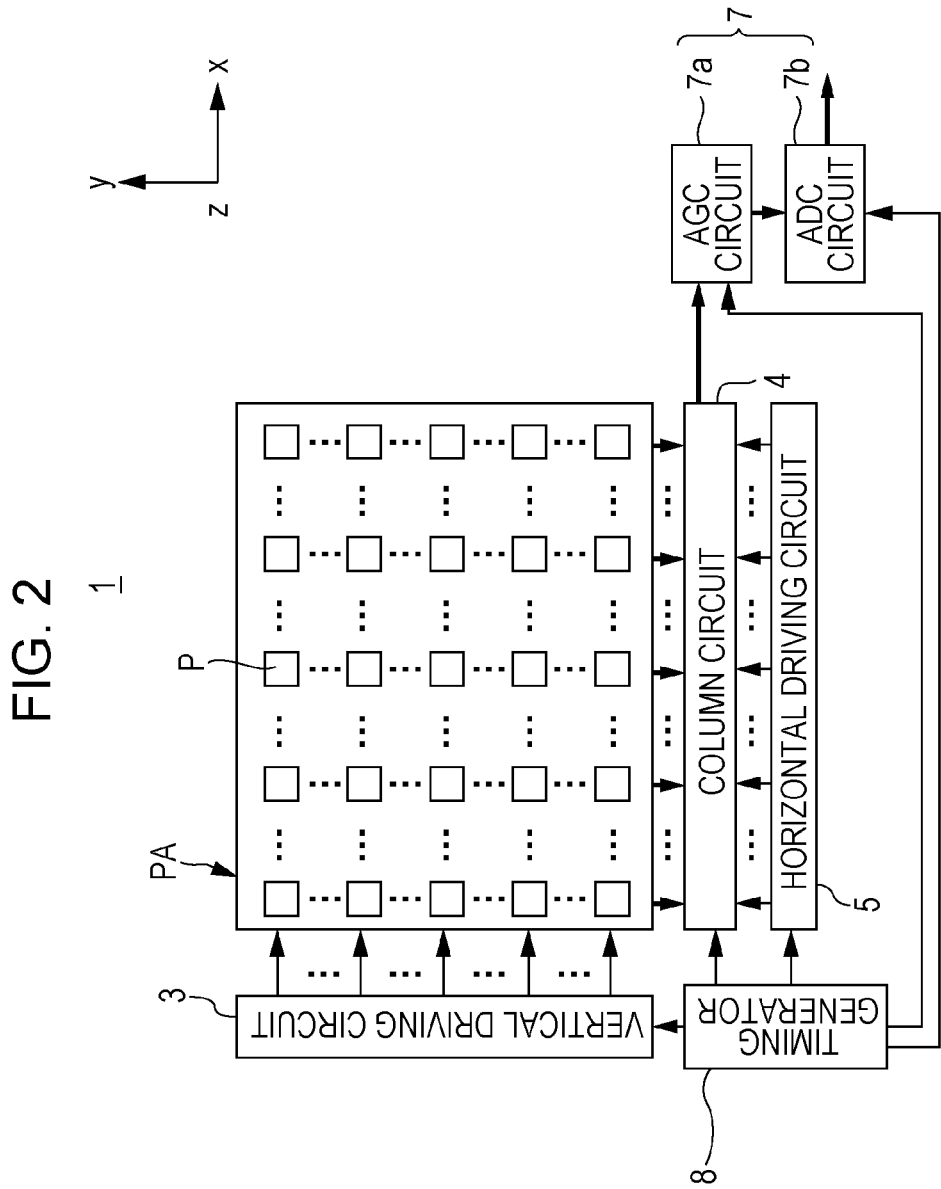
FIG. 2 is a block diagram illustrating an entire configuration of a solid-state imaging device 1 according to embodiment 1 of the disclosure.

FIG. 2 is a block diagram illustrating the entire configuration of the solid-state imaging device 1 according to embodiment 1 of the disclosure.

As shown in FIG. 2, the solid-state imaging device 1 is provided with a pixel area PA.

The pixel area PA has, as shown in FIG. 2, a rectangular shape, and a plurality of pixels P are arranged in each of the horizontal direction x and the vertical direction y. That is, the pixels P are arranged in the form of a matrix. In addition, the pixel area PA corresponds to the imaging surface PS shown in FIG. 1. The detailed description of the pixel P will be described later.

Otherwise, the solid-state imaging device 1 is provided with, as shown in FIG. 2, a vertical driving circuit 3, a column circuit 4, a horizontal driving circuit 5, an external output circuit 7, and a timing generator 8 as peripheral circuits.

As shown in FIG. 2, the vertical driving circuit 3 is electrically connected to each row of the plurality of pixels P arranged in the horizontal direction x in the pixel area PA.

The column circuit 4 is configured, as shown in FIG. 2, so as to perform signal processing on the signals which are output from the pixels P in units of columns. Here, the column circuit 4 includes a CDS (Correlated Double Sampling) circuit (not shown in the drawing), and performs the signal processing for removing fixed pattern noise.

As shown in FIG. 2, the horizontal driving circuit 5 is electrically connected to the column circuit 4. The horizontal driving circuit 5 includes, for example, a shift register, and sequentially outputs signals, which are retained for each column of the pixels P in the column circuit 4, to the external output circuit 7.

As shown in FIG. 2, the external output circuit 7 is electrically connected to the column circuit 4, performs signal processing on the signals which are output from the column circuit 4, and then outputs to the outside. The external output circuit 7 includes an AGC (Automatic Gain Control) circuit 7a and an ADC circuit 7b. In the external output circuit 7, the AGC circuit 7a applies a gain to signals, and then the ADC circuit 7b converts analog signals into digital signals, and outputs the converted signals to the outside.

As shown in FIG. 2, the timing generator 8 is electrically connected to each of the vertical driving circuit 3, the column circuit 4, the horizontal driving circuit 5, and the external output circuit 7. The timing generator 8 generates various pulse signals, and outputs the signals to the vertical driving circuit 3, the column circuit 4, the horizontal driving circuit 5, and the external output circuit 7, thereby performing driving control on the respective sections.

Figure 3:
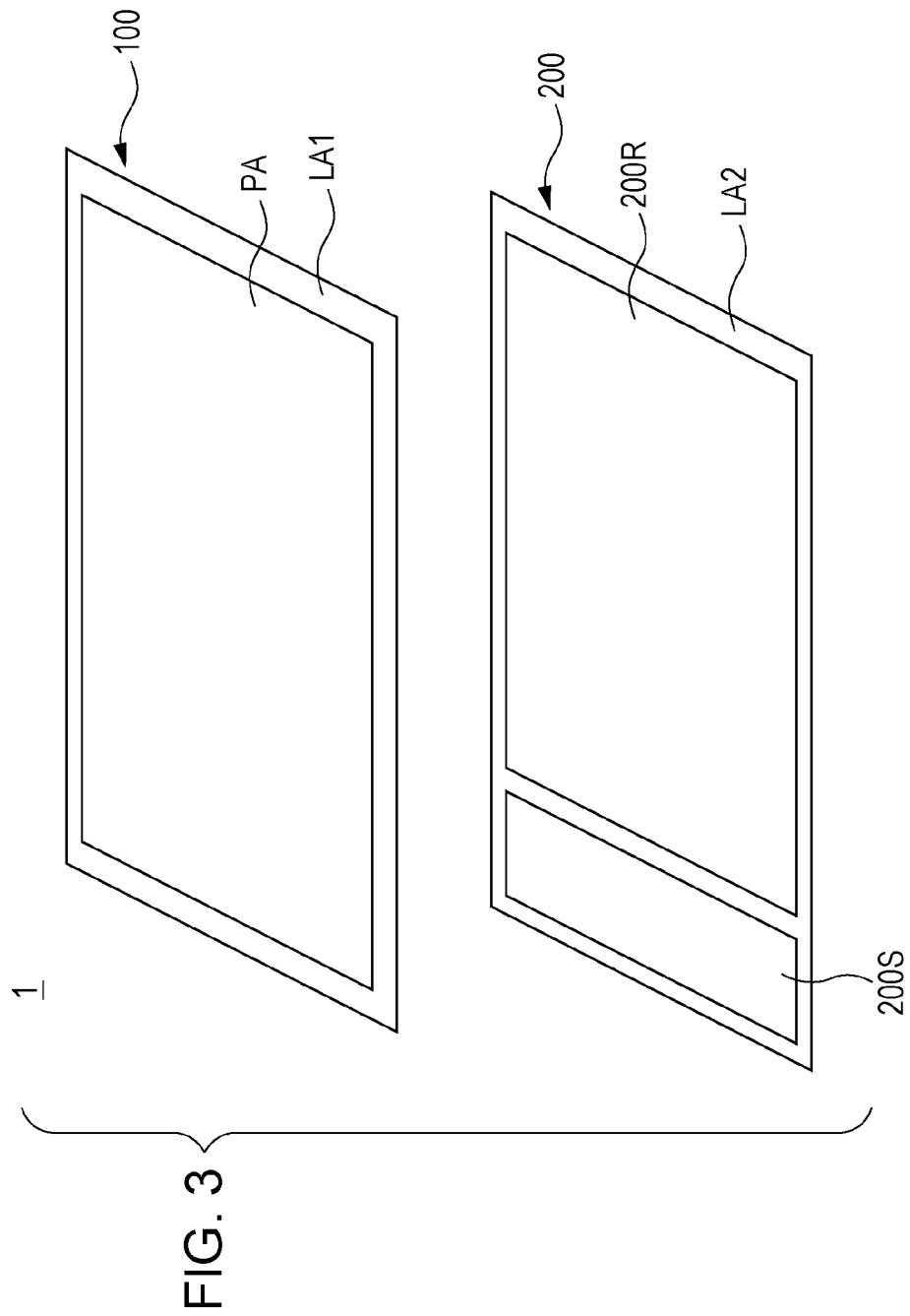
FIG. 3 is a perspective view illustrating the entire configuration of the solid-state imaging device 1 according to embodiment 1 of the disclosure.

FIG. 3 is a perspective view illustrating the entire configuration of the solid-state imaging device 1 according to embodiment 1 of the disclosure.

As shown in FIG. 3, in the embodiment, the solid-state imaging device 1 has a first semiconductor chip 100 and a second semiconductor chip 200. The first semiconductor chip 100 and the second semiconductor chip 200 are opposed to each other. Although a detailed description will be given later, the opposed surfaces of the chips are bonded to each other (in the case of the description in FIG. 3, the chips are separated from each other). In addition, the first semiconductor chip 100 and the second semiconductor chip 200 are electrically connected to each other.

Here, as shown in FIG. 3, the first semiconductor chip 100 is provided with the pixel area PA. That is, similarly to the above description in FIG. 2, there is provided the pixel area PA in which the plurality of pixels P are arranged in each of the horizontal direction x and the vertical direction y.

Compared with this, as shown in FIG. 3, the second semiconductor chip 200 is provided with a control circuit area 200S and a logic circuit area 200R.

The control circuit area 200S is provided with, for example, the vertical driving circuit 3 and the timing generator 8 described above in FIG. 2.

In addition, the logic circuit area 200R is provided with, for example, the column circuit 4, the horizontal driving circuit 5, and the external output circuit 7 described above in FIG. 2.

As described above, in the embodiment, the solid-state imaging device 1 has a "3-dimensional multilayer chip structure", and the first semiconductor chip 100 and the second semiconductor chip 200 are stacked.

Furthermore, the control circuit area 200S may be provided not in the second semiconductor chip 200 but in the first semiconductor chip 100. Further, the second semiconductor chip 200 may be provided with an ISP (image signal processing circuit) or a DSP.

Otherwise, in the solid-state imaging device 1, as shown in FIG. 3, the first semiconductor chip 100 and the second semiconductor chip 200 are respectively provided with scribe areas LA1 and LA2.

The scribe areas LA1 and LA2 are positioned, as shown in FIG. 3, in the peripheral portions on the surfaces (the xy plane) of the first semiconductor chip 100 and second semiconductor chip 200 opposed to each other. Here, the scribe areas LA1 and LA2 include portions which extend in the horizontal direction x and the vertical direction y, and are formed in a rectangular shape in the vicinity of the pixel area PA or the control circuit area 200S and the logic circuit area 200R.

Although a detailed description will be given later, in a wafer state before the dicing, a plurality of areas such as the pixel area PA are arranged alongside one another, and thus the scribe areas LA1 and LA2 extend in a line shape between the areas. In addition, a blade is likely to come into contact with the scribe areas LA1 and LA2, and thus the scribe areas LA1 and LA2 are divided in the solid-state imaging device 1, which has the areas such as the pixel area PA mentioned above, through dicing.

(A-3) Specific Configuration of Solid-State Imaging Device

A specific configuration of the solid-state imaging device according to the embodiment will be described.

Figure 4:
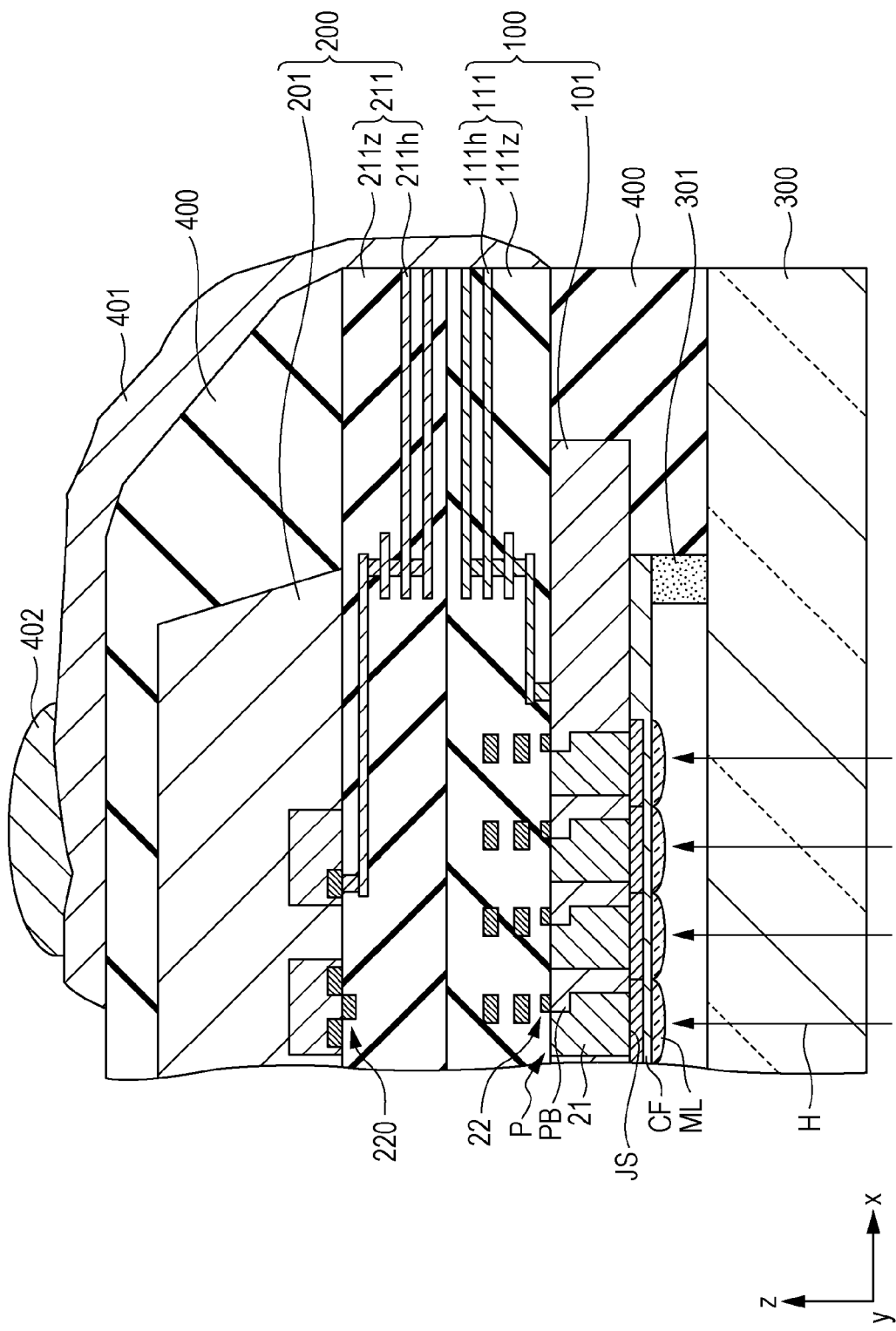
FIG. 4 is a diagram illustrating principal sections of the solid-state imaging device according to embodiment 1 of the disclosure.

FIG. 4 is a diagram illustrating principal sections of the solid-state imaging device according to embodiment 1 of the disclosure. FIG. 4 shows a cross-sectional surface of the end portion of the solid-state imaging device.

As shown in FIG. 4, the solid-state imaging device 1 includes the first semiconductor chip 100, the second semiconductor chip 200, a glass substrate 300, an insulation film 400, a conductive layer 401, and a bump 402.

The respective sections will be described in order of precedence.

(A-3-1) Regarding First Semiconductor Chip 100

The first semiconductor chip 100 includes, as shown in FIG. 4, a semiconductor substrate 101 and a wiring layer 111, where the wiring layer 111 is provided on the surface of the semiconductor substrate 101.

The first semiconductor chip 100 is opposed to the second semiconductor chip 200, and is bonded to the second semiconductor chip 200 through the surfaces opposed to each other. Here, in the second semiconductor chip 200, similarly to the first semiconductor chip 100, a wiring layer 211 is provided on the surface of a semiconductor substrate 201. Thus, the wiring layer 111 of the first semiconductor chip 100 is disposed to be opposed to the wiring layer 211 of the second semiconductor chip 200. In addition, the first semiconductor chip 100 and the second semiconductor chip 200 are bonded to each other through the surfaces on which the wiring layers 111 and 211 are opposed to each other.

Further, in the first semiconductor chip 100, as shown in FIG. 4, the glass substrate 300 is bonded to the surface of the first semiconductor chip 100 which is opposite to the surface thereof opposed to the second semiconductor chip 200.

Here, as shown in FIG. 4, in the first semiconductor chip 100, the glass substrate 300 is bonded by the adhesive layer 301 to the surface of the semiconductor substrate 101, which constitutes the first semiconductor chip 100, opposite to the surface thereof on which the wiring layer 111 is stacked.

In addition, in the first semiconductor chip 100, as shown in FIG. 4, the side portion of the semiconductor substrate 101 is covered by the insulation film 400. Further, in the first semiconductor chip 100, the side portion of the wiring layer 111 is covered by the conductive layer 401.

The first semiconductor chip 100 is formed to be thinner than the second semiconductor chip 200. Specifically, in the first semiconductor chip 100, the semiconductor substrate 101 is a silicon substrate, and is formed as, for example, a thin film with a thickness of about 1 to 20 μm.

In addition, as shown in FIG. 4, the semiconductor substrate 101 is provided with the pixels P.

Figure 5:
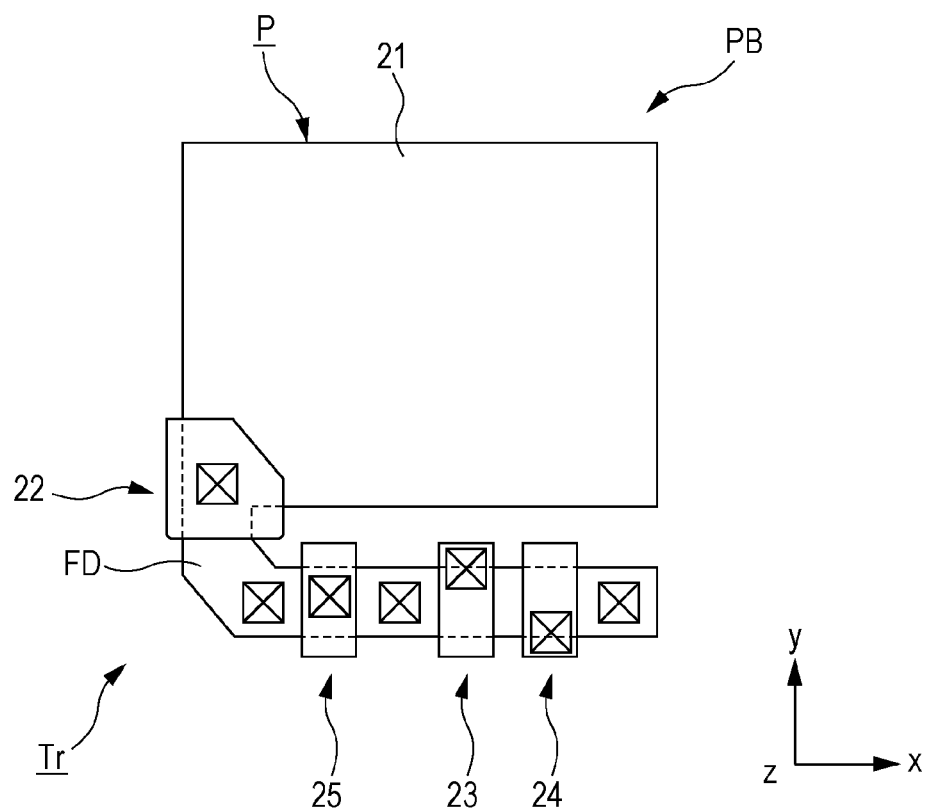
FIG. 5 is a diagram illustrating a pixel P according to embodiment 1 of the disclosure.
Figure 6:
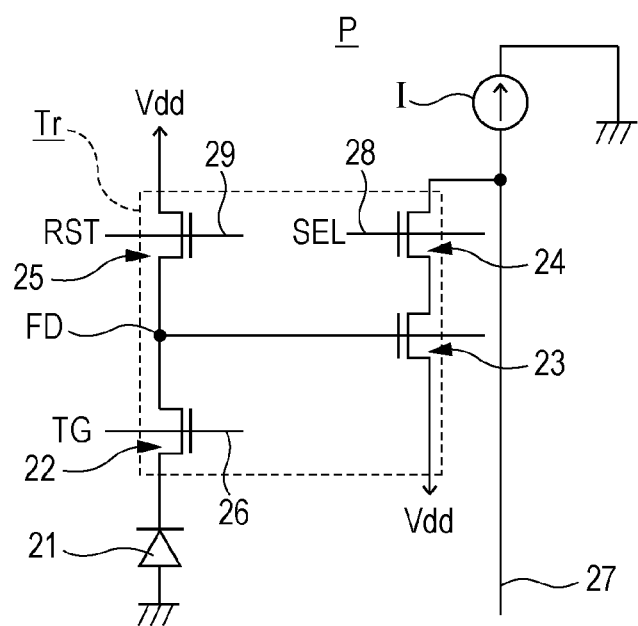
FIG. 6 is a diagram illustrating the pixel P according to embodiment 1 of the disclosure.

FIGS. 5 and 6 are diagrams illustrating the pixel P according to embodiment 1 of the disclosure.

Here, FIG. 5 is a diagram of the upper surface of the pixel P. Further, FIG. 6 is a diagram illustrating a circuit configuration of the pixel P.

As shown in FIGS. 5 and 6, the pixel P includes a photodiode 21 and a pixel transistor Tr. Here, the pixel transistor Tr includes a transfer transistor 22, an amplifier transistor 23, a selection transistor 24, and a reset transistor 25, and is configured to perform an operation of reading the signal charge from the photodiode 21.

(a) Photodiode 21

In the pixels P constituting the first semiconductor chip 100, a plurality of photodiodes 21 are arranged to correspond to the plurality of pixels P shown in FIG. 2. That is, on the imaging surface (the xy plane), the photodiodes 21 are arranged in each of the horizontal direction x and the vertical direction y orthogonal to the horizontal direction x.

The photodiodes 21 are provided, as shown in FIG. 4, in the semiconductor substrate 101, and receive the incident light H through a light receiving surface JS and photoelectrically convert the light, thereby generating the signal charge.

For example, in the semiconductor substrate 101, each photodiode 21 includes a charge storage area (not shown in the drawing) in which n-type impurities are dispersed. In addition, a hole storage area (not shown in the drawing), in which p-type impurities are dispersed, is formed to suppress occurrence of dark current on each interface on the upper and lower surface sides of the n-type charge storage area.

In the semiconductor substrate 101, as shown in FIG. 4, pixel isolation portions PB, in which p-type impurities are dispersed, are provided to electrically isolate the plurality of pixels P from each other. Thus, the photodiodes 21 are provided in areas partitioned by the pixel isolation portions PB.

For example, as shown in FIG. 5, the pixel isolation portions PB are formed to be interposed between the plurality of pixels P. That is, the pixel isolation portions PB are formed in a lattice shape in plan view, each photodiode 21 is formed in the area which is partitioned by each pixel isolation portion PB.

As shown in FIG. 6, the anode of the photodiode 21 is grounded, and thus the stored signal charge (here, electrons) is read out by the pixel transistor Tr, and is output as an electric signal to a vertical signal line 27. Specifically, the photodiode 21 is connected, as shown in FIG. 6, to the gate of the amplifier transistor 23 through the transfer transistor 22. In addition, in the photodiode 21, the stored signal charge is transferred as an output signal to a floating diffusion FD, which is connected to the gate of the amplifier transistor 23, by the transfer transistor 22.

As shown in FIG. 4, a color filter CF and an on-chip lens ML are provided on the rear surface opposite to the surface on which the wiring layer 111 is provided in the semiconductor substrate 101. Thus, the photodiode 21 receives the incident light H which is incident through the above-mentioned members. That is, the first semiconductor chip 100 is a "backside illuminated type" image sensor chip.

Furthermore, although not shown in the drawing, OPB pixels, in which a light shielding film (not shown in the drawing) is provided on the light receiving surfaces JS of the photodiodes 21, are provided around the pixel area PA, thereby obtaining a signal of a black reference level.

(b) Pixel Transistor Tr

In the pixels P constituting the first semiconductor chip 100, a plurality of pixel transistors Tr are arranged to correspond to the plurality of pixels P shown in FIG. 2.

Each pixel transistor Tr includes, as shown in FIGS. 5 and 6, the transfer transistor 22, the amplifier transistor 23, the selection transistor 24, and the reset transistor 25.

The transfer transistor 22 constituting the pixel transistor Tr is provided, as shown in FIG. 4, on the surface of the semiconductor substrate 101 covered by the wiring layer 111. Although the other transistors 23 to 25 constituting the pixel transistor Tr are not shown in FIG. 4, similarly to the transfer transistor 22, the transistors are also provided on the surface of the semiconductor substrate 101 covered by the wiring layer 111.

For example, the transistors 22 to 25 are formed, as shown in FIGS. 4 and 5, on the pixel isolation portion PB which isolates pixels P from each other in the semiconductor substrate 101.

For example, each of the transistors 22 to 25 is an N-channel MOS transistor, and each gate is formed of, for example, polysilicon. In addition, the transistors 22 to 25 are covered by the wiring layer 111.

In the pixel transistor Tr, the transfer transistor 22 is configured to output the signal charge, which is generated in the photodiode 21, as an electric signal to the gate of the amplifier transistor 23. Specifically, the transfer transistor 22 is provided, as shown in FIG. 6, so as to be interposed between the photodiode 21 and the floating diffusion FD. In addition, at the time of transferring the transfer signal from the transfer line 26 to the gate of the transfer transistor 22, the transfer transistor 22 transfers the signal charge, which is stored in the photodiode 21, as an output signal to the floating diffusion FD.

In the pixel transistor Tr, the amplifier transistor 23 is configured to amplify and output the electric signal which is output from the transfer transistor 22. Specifically, the gate of the amplifier transistor 23 is connected, as shown in FIG. 6, to the floating diffusion FD. Further, the drain of the amplifier transistor 23 is connected to a power-source potential supply line Vdd, and the source thereof is connected to the selection transistor 24. The amplifier transistor 23 is supplied with constant current from the constant-current source I when the selection transistor 24 performs selection so as to be turned on, and is thereby operated as a source follower. Hence, the amplifier transistor 23 amplifies the output signal, which is output from the floating diffusion FD, when a selection signal is supplied to the selection transistor 24.

In the pixel transistor Tr, the selection transistor 24 is configured to output the electric signal, which is output by the amplifier transistor 23, to the vertical signal line 27 when receiving an input of the selection signal. Specifically, the gate of the selection transistor 24 is connected, as shown in FIG. 6, to an address line 28 to which the selection signal is supplied. The selection transistor 24 is turned on when being supplied with the selection signal, and outputs the output signal, which is amplified by the amplifier transistor 23 as described above, to the vertical signal line 27.

In the pixel transistor Tr, the reset transistor 25 is configured to reset the gate potential of the amplifier transistor 23. Specifically, the gate of the reset transistor 25 is connected, as shown in FIG. 6, a reset line 29 to which a reset signal is supplied. Further, the drain of the reset transistor 25 is connected to the power-source potential supply line Vdd, and the source thereof is connected to the floating diffusion FD. In addition, the reset transistor 25 resets the gate potential of the amplifier transistor 23 to the power-source potential through the floating diffusion FD when the reset signal is supplied from the reset line 29 to the gate thereof.

Figure 7:
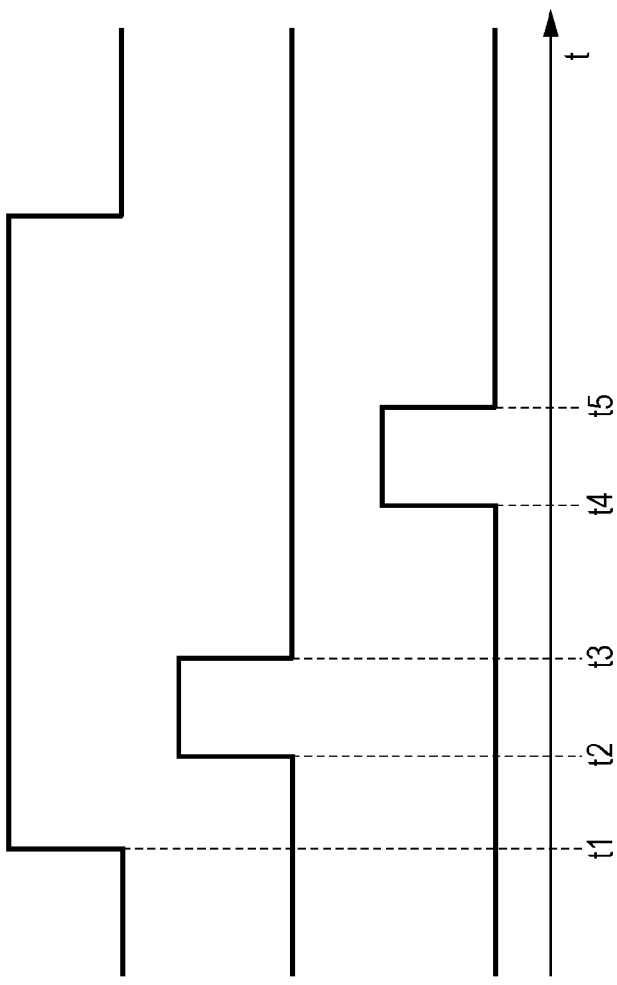
FIGS. 7A to 7C are timing charts illustrating pulse signals which are supplied to the respective sections when the signals are read out from the pixel P, according to embodiment 1 of the disclosure.

FIGS. 7A to 7C are timing charts illustrating pulse signals which are supplied to the respective sections when a signal is read out from each pixel P in embodiment 1 of the disclosure. FIG. 7A shows the selection signal, FIG. 7B shows the reset signal, and FIG. 7C shows the transfer signal.

First, as shown in FIGS. 7A to 7C, at the first time point t1, the selection transistor 24 becomes conductive. In addition, at the second time point t2, the reset transistor 25 becomes conductive. Thereby, the reset transistor 25 resets the gate potential of the amplifier transistor 23.

Next, at the third time point t3, the reset transistor 25 becomes nonconductive. In addition, thereafter, a voltage corresponding to the reset level is read out to the column circuit 4.

Next, at the fourth time point t4, the transfer transistor 22 becomes conductive, and then transfers the signal charge, which is stored in the photodiode 21, to the gate of the amplifier transistor 23.

Next, at the fifth time point t5, the transfer transistor 22 becomes nonconductive. In addition, thereafter, a voltage with a signal level, which corresponds to the amount of the stored signal charge, is read out to the column circuit 4.

The column circuit 4 performs differential processing on the reset level, which is read first, and the signal level which is read subsequently, and stores the signals. Thereby, fixed pattern noise, which is caused by fluctuation in Vth of each of the transistors provided for each pixel P, is canceled.

Since the respective gates of the transistors 22, 24, and 25 are connected in the row unit which is formed of the plurality of pixels P arranged in the horizontal direction x, the operation for driving the pixels as described above is simultaneously performed on the plurality of pixels P which are arranged in the row unit. Specifically, on the basis of the selection signal which is supplied by the above-mentioned vertical driving circuit 3, the selection is sequentially performed in the vertical direction in units of the horizontal lines (the pixel rows). In addition, on the basis of various timing signals which are output from the timing generator 8, the transistors of the pixels are controlled. Thereby, the output signals from pixels are read out to the column circuit 4 for each pixel column through the vertical signal line 27.

In addition, the signals, which are stored in the column circuit 4, are selected by the horizontal driving circuit 5, and are sequentially output to the external output circuit 7.

(c) Wiring Layer 111

In the first semiconductor chip 100, the wiring layer 111 is provided, as shown in FIG. 4, on the surface (the upper surface in FIG. 4) of the semiconductor substrate 101 opposite to the rear surface (the lower surface in FIG. 4) thereof on which the respective sections such as the color filter CF are provided.

The wiring layer 111 includes, as shown in FIG. 4, a plurality of wiring portions 111h and an insulation layer 111z, and is provided such that the plurality of wiring portions 111h are covered by the insulation layer 111z.

In the wiring layer 111, each wiring portion 111h is appropriately formed to be electrically connected to each pixel P.

Here, the respective wiring portions 111h are formed by stacking the wiring portions in the insulation layer 111z so as to function as wiring portions such as the transfer line 26, the address line 28, the vertical signal line 27, and the reset line 29 shown in FIG. 6.

Otherwise, in the side portion of the wiring layer 111, the wiring portions 111h are formed to extend from the inside of the wiring layer 111 to the side portion thereof. These wiring portions 111h are provided, as shown in FIG. 4, such that the side surfaces of the wiring portions 111h are exposed on the sidewall surface of the wiring layer 111.

In the embodiment, in the side portion of the wiring layer 111, the plurality of wiring portions 111h are provided to be stacked with intervals in the depth direction z. Accordingly, the plurality of wiring portions 111h are provided such that the respective side surfaces thereof are exposed.

(d) Color Filter CF

In the first semiconductor chip 100, the color filter CF is provided, as shown in FIG. 4, on the rear surface (the lower surface in FIG. 4) side of the semiconductor substrate 101. In addition, on-chip lenses ML are stacked on the color filter CF.

The color filter CF makes the incident light H have colors, and transmits the light onto the light receiving surfaces JS of the semiconductor substrate 101. For example, the color filter CF may be formed as follows. A coated film is formed by coating a coating liquid, which includes a color pigment and a photoresist resin, in a coating method such as a spin coat method, and then patterns are formed on the coated film by using a lithography technique, thereby forming the color filter CF.

Figure 8:
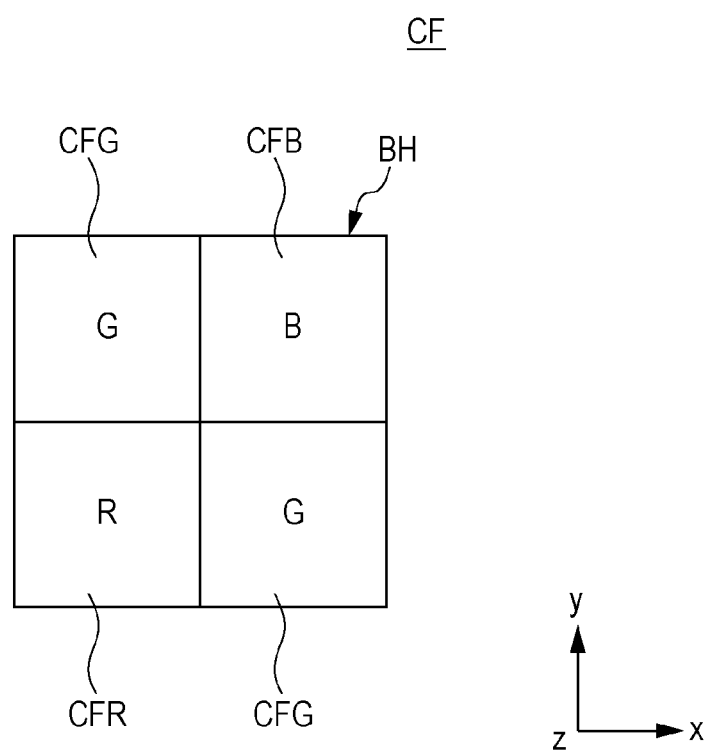
FIG. 8 is a diagram illustrating a color filter CF according to embodiment 1 of the disclosure.

FIG. 8 is a diagram illustrating the color filter CF according to embodiment 1 of the disclosure. FIG. 8 shows the upper surface of the color filter CF.

As shown in FIG. 8, the color filter CF includes a red filter layer CFR, green filter layers CFG, and a blue filter layer CFB. The red filter layer CFR, the green filter layers CFG, and the blue filter layers CFB are adjacent to each other, and each one thereof corresponds to each of the plurality of pixels P.

Here, as shown in FIG. 8, the red filter layer CFR, the green filter layers CFG, and the blue filter layer CFB are formed in a Bayer array BH. That is, the plurality of green filter layers CFG are arranged in a checkered pattern in the diagonal direction. In addition, the red filter layer CFR and the blue filter layer CFB are arranged in the diagonal direction symmetrically to that of the plurality of green filter layers CFG.

Specifically, in the color filter CF, the red filter layer CFR has a high optical transmittance in a wavelength region (for example, 625 to 740 nm) corresponding to the red color, and is configured to make the incident light have the red color and transmit the light onto the light receiving surface JS. For example, the red filter layer CFR is formed in a rectangular shape in plan view.

Further, in the color filter CF, the green filter layer CFG has a high optical transmittance in a wavelength region (for example, 500 to 565 nm) corresponding to the green color, and is configured to make the incident light have the green color and transmit the light onto the light receiving surface JS. For example, the green filter layer CFG is formed in a rectangular shape in plan view.

In the color filter CF, the blue filter layer CFB has a high optical transmittance in a wavelength region (for example, 450 to 485 nm) corresponding to the blue color, and is configured to make the incident light have the blue color and transmit the light onto the light receiving surface JS. For example, the blue filter layer CFB is formed in a rectangular shape in plan view.

(e) On-Chip Lens ML

In the first semiconductor chip 100, the on-chip lenses ML are provided, as shown in FIG. 4, on the rear surface (the lower surface in FIG. 4) of the semiconductor substrate 101.

Here, a plurality of on-chip lenses ML are provided to correspond to the respective pixels P on the upper surface of the color filter CF.

Each on-chip lens ML is a convex lens which is formed such that the center thereof is thicker than the periphery thereof above the light receiving surface JS, and is configured to concentrate the incident light H onto the light receiving surface JS of the photodiode 21.

For example, the on-chip lens ML is formed by forming patterns on a photosensitive resin film through a photolithography technique and subsequently forming the patterns in lens shapes through a reflow process. Otherwise, by forming a resist film having lens shapes on a lens material film and subsequently performing an etch-back process thereon, the on-chip lens ML may be formed.

(A-3-2) Regarding Second Semiconductor Chip 200

The second semiconductor chip 200 includes, as shown in FIG. 4, a semiconductor substrate 201 and a wiring layer 211, where the wiring layer 211 is provided on the surface of a semiconductor substrate 201.

The second semiconductor chip 200 is opposed to the first semiconductor chip 100, and is bonded to the first semiconductor chip 100 through the surfaces opposed to each other. Here, in the second semiconductor chip 200, the wiring layer 211 is disposed to be opposed to the wiring layer 111 of the first semiconductor chip 100. In addition, the opposed surfaces of the wiring layers 111 and 211 are bonded to each other. The second semiconductor chip 200 is provided to be thicker than the first semiconductor chip 100 and function as a supporting substrate which supports the first semiconductor chip 100 formed as a thin film.

In addition, in the second semiconductor chip 200, as shown in FIG. 4, the side portion of the semiconductor substrate 201 is covered by the insulation film 400. Further, in the second semiconductor chip 200, the area from the side portion of the wiring layer 211 to the upper surface is covered by the conductive layer 401.

(a) Semiconductor Element 220

In the second semiconductor chip 200, as shown in FIG. 4, semiconductor elements 220 are provided on the semiconductor substrate 201 which is a silicon substrate.

Each semiconductor element 220 is, for example, an MOS transistor, and the gate thereof is formed of, for example, polysilicon.

As shown in FIG. 3, the second semiconductor chip 200 is provided with a control circuit area 200S and a logic circuit area 200R, and the circuits (refer to FIG. 2) such as the vertical driving circuit 3 formed in the areas are constituted by the semiconductor elements 220.

In addition, the semiconductor elements 220 are covered, as shown in FIG. 4, by the wiring layer 211.

(b) Wiring Layer 211

In the second semiconductor chip 200, the wiring layer 211 is provided, as shown in FIG. 4, on the surface (the upper surface in FIG. 4) of the semiconductor substrate 201 on which the semiconductor elements 220 are provided.

The wiring layer 211 includes, as shown in FIG. 4, wiring portions 211h and an insulation layer 211z, and is formed such that the wiring portions 211h are electrically connected to the circuits (refer to FIG. 2) such as the vertical driving circuit 3 constituted by the semiconductor elements 220 in the insulation layer 211z.

Further, the respective wiring portions 211h are provided, as shown in FIG. 4, such that the side surfaces of the wiring portions 211h are exposed on the sidewall surface of the wiring layer 211. Specifically, in the side portion of the wiring layer 211, the plurality of wiring portions 211h are provided to be stacked with intervals in the depth direction z. Accordingly, the plurality of wiring portions 211h are provided such that the respective side surfaces thereof are exposed.

(A-3-3) Others

The insulation film 400 is provided, as shown in FIG. 4, so as to cover the side portion of the semiconductor substrate 101 constituting the first semiconductor chip 100. Further, the insulation film 400 is provided to cover the area from the side portion to the upper surface of the semiconductor substrate 201 constituting the second semiconductor chip 200.

The conductive layer 401 is formed, as shown in FIG. 4, to cover the side portion of the wiring layer 111 constituting the first semiconductor chip 100. Further, the conductive layer 401 is also formed to cover the side portion of the wiring layer 211 constituting the second semiconductor chip 200.

Specifically, as shown in FIG. 4, in the respective wiring layers 111 and 211 of the first semiconductor chip 100 and the second semiconductor chip 200, the side surfaces of the wiring portions 111h and 211h are exposed on the sidewall surface, and the exposed side surfaces of the wiring portions 111h and 211h are covered by the conductive layer 401. Here, the conductive layer 401 is integrally formed between both exposed side surfaces of the wiring portions 111h and 211h so as to electrically connect both wiring portions 111h and 211h on the sidewall surface.

Further, as shown in FIG. 4, the conductive layer 401 is formed to extend from the side portion to the upper surface of the wiring layer 211 constituting the second semiconductor chip 200 with the insulation film 400 interposed therebetween. In addition, in the semiconductor substrate 201 constituting the second semiconductor chip 200, a bump 402 is provided on the surface opposite to the surface, on which the wiring layer 211 is provided, with the insulation film 400 and the conductive layer 401 interposed therebetween.

(B) Manufacturing Method

Hereinafter, principal sections of a method of manufacturing the solid-state imaging device 1 will be described.

FIGS. 9A to 20 are diagrams illustrating a method of manufacturing a solid-state imaging device according to embodiment 1 of the disclosure.

Here, FIGS. 9A to 11J sequentially show processes of manufacturing the solid-state imaging device.

FIGS. 12E to 16J are diagrams illustrating principal sections of the solid-state imaging device which is formed by the processes shown in FIGS. 9A to 11J, and show, similarly to FIG. 4, the cross-sectional surface of the end portion of the solid-state imaging device.

Figure 10E:
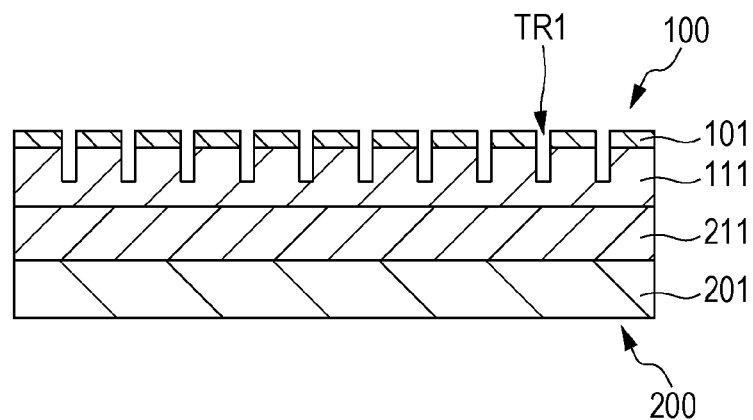
FIGS. 10E to 10G are diagrams illustrating the method of manufacturing the solid-state imaging device according to embodiment 1 of the disclosure.
Figure 12:
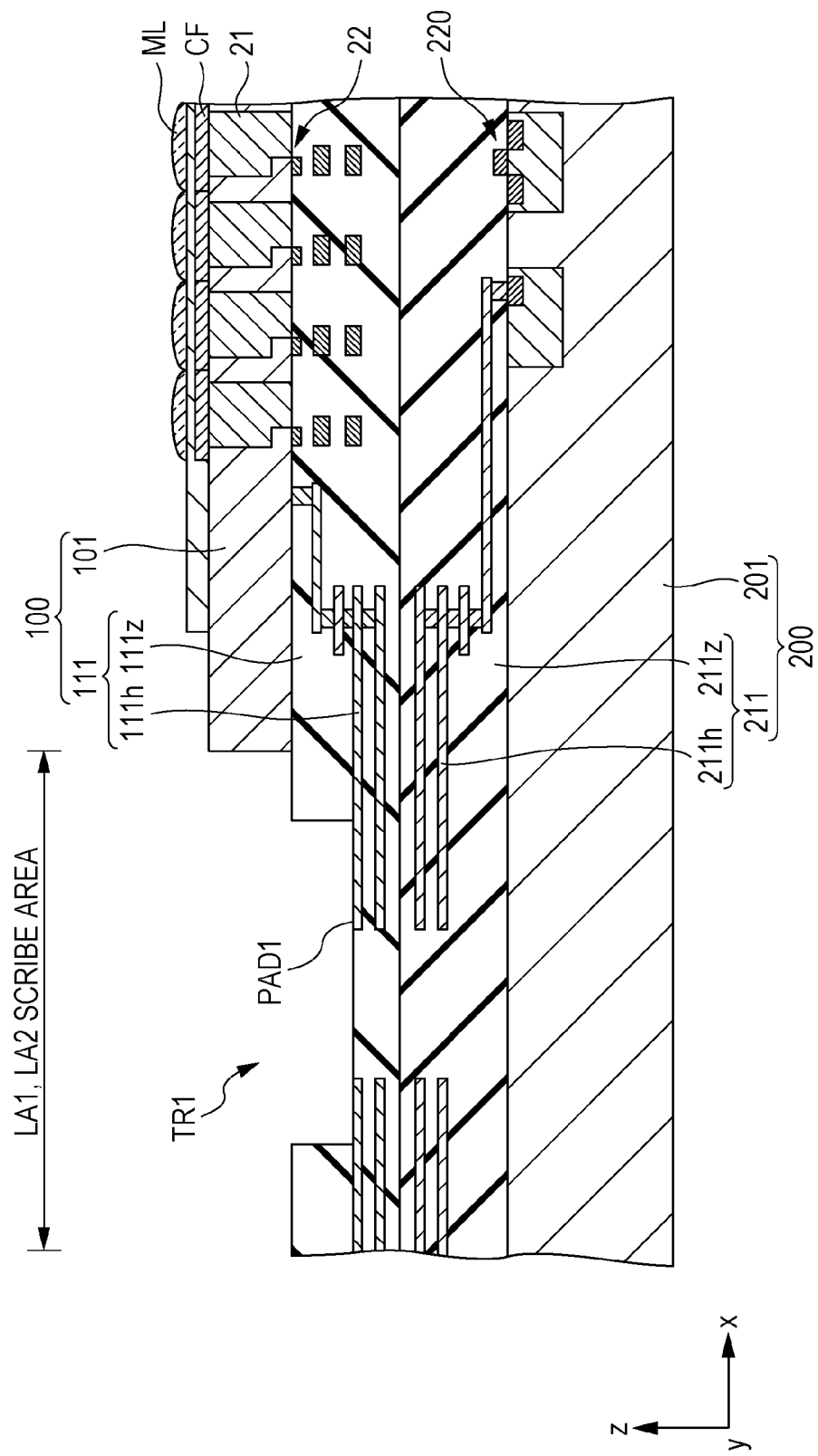
FIG. 12 is a diagram illustrating the method of manufacturing the solid-state imaging device according to embodiment 1 of the disclosure.
Figure 13:
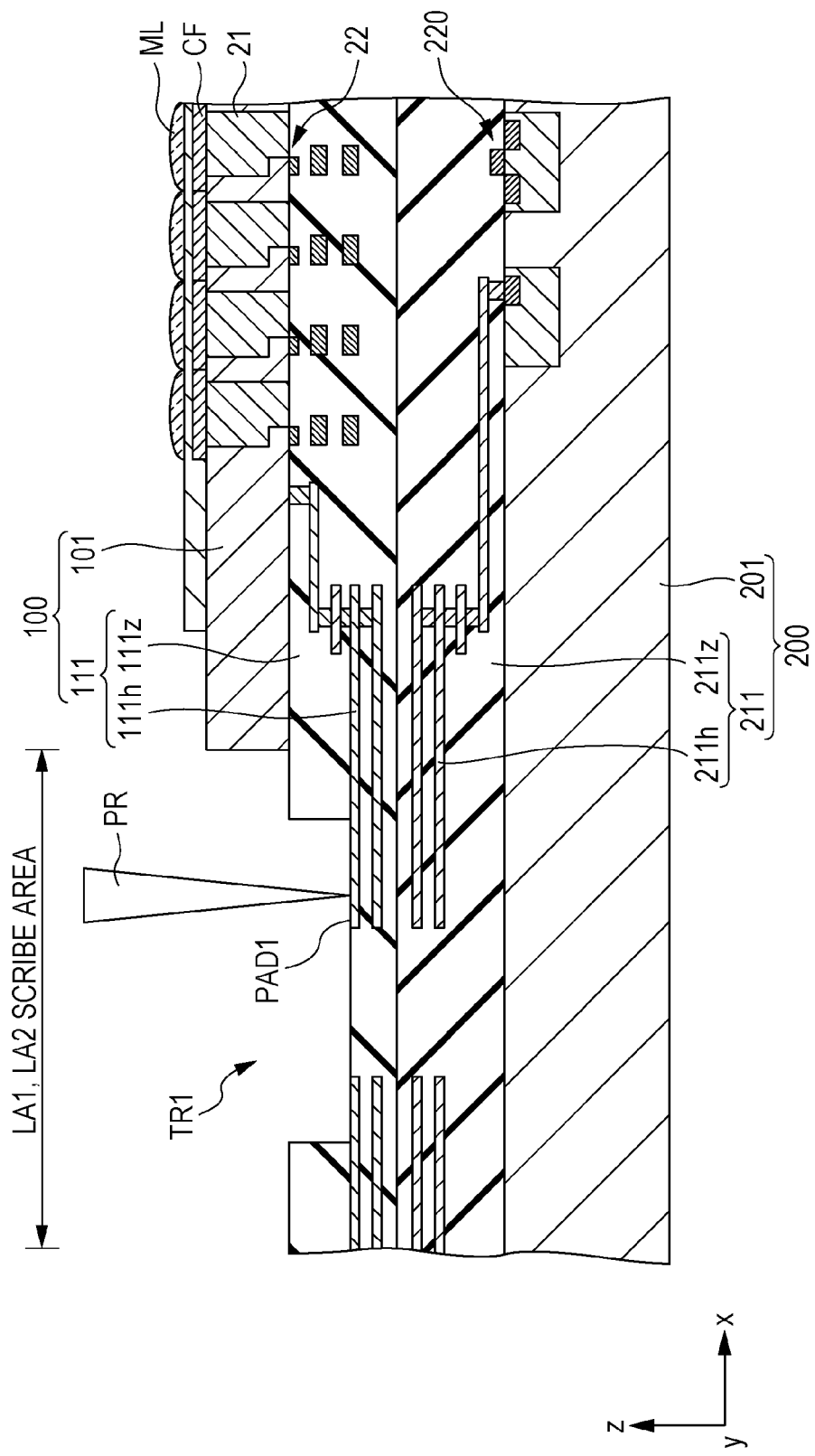
FIG. 13 is a diagram illustrating the method of manufacturing the solid-state imaging device according to embodiment 1 of the disclosure.
Figure 14:
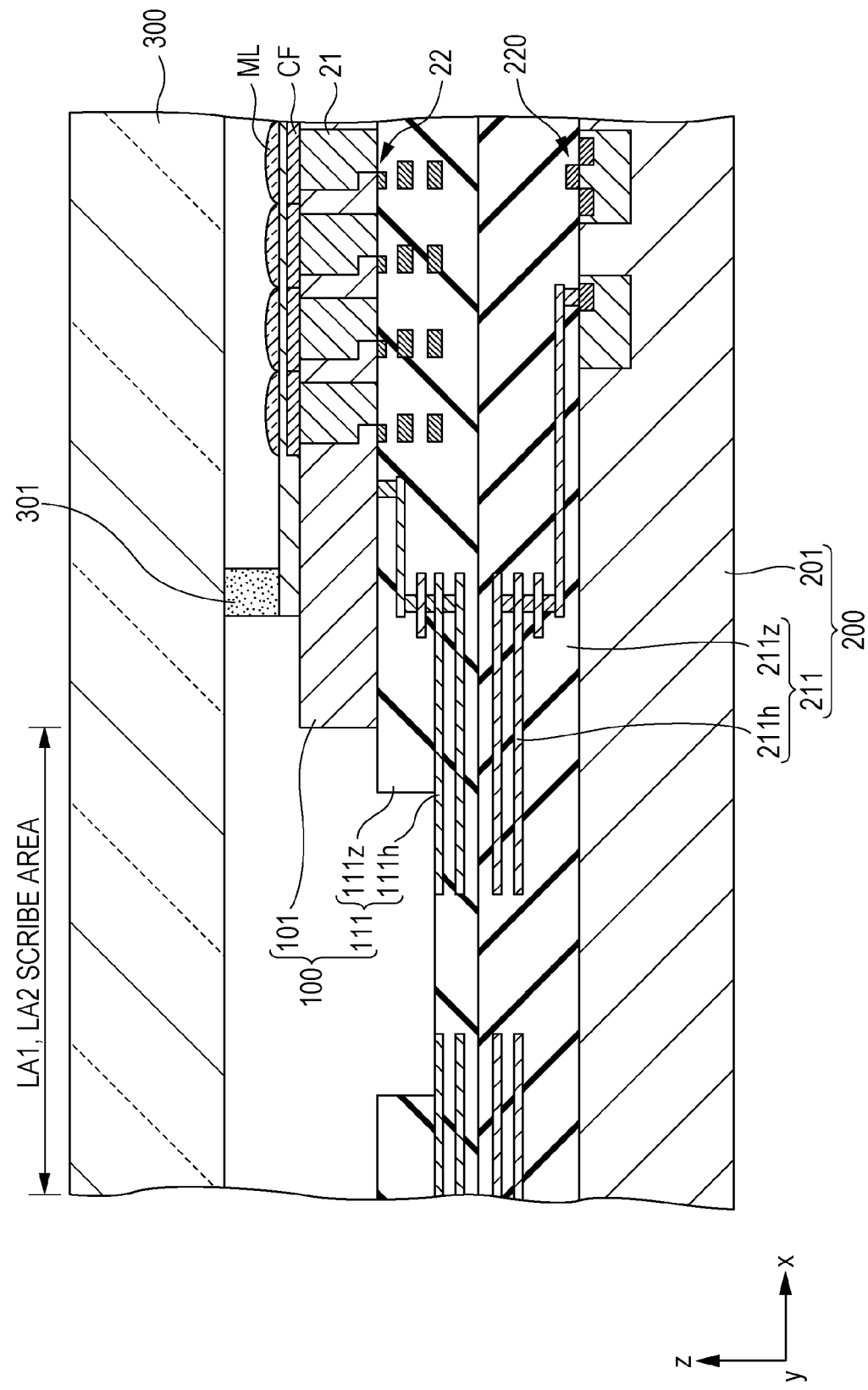
FIG. 14 is a diagram illustrating the method of manufacturing the solid-state imaging device according to embodiment 1 of the disclosure.
Figure 15:
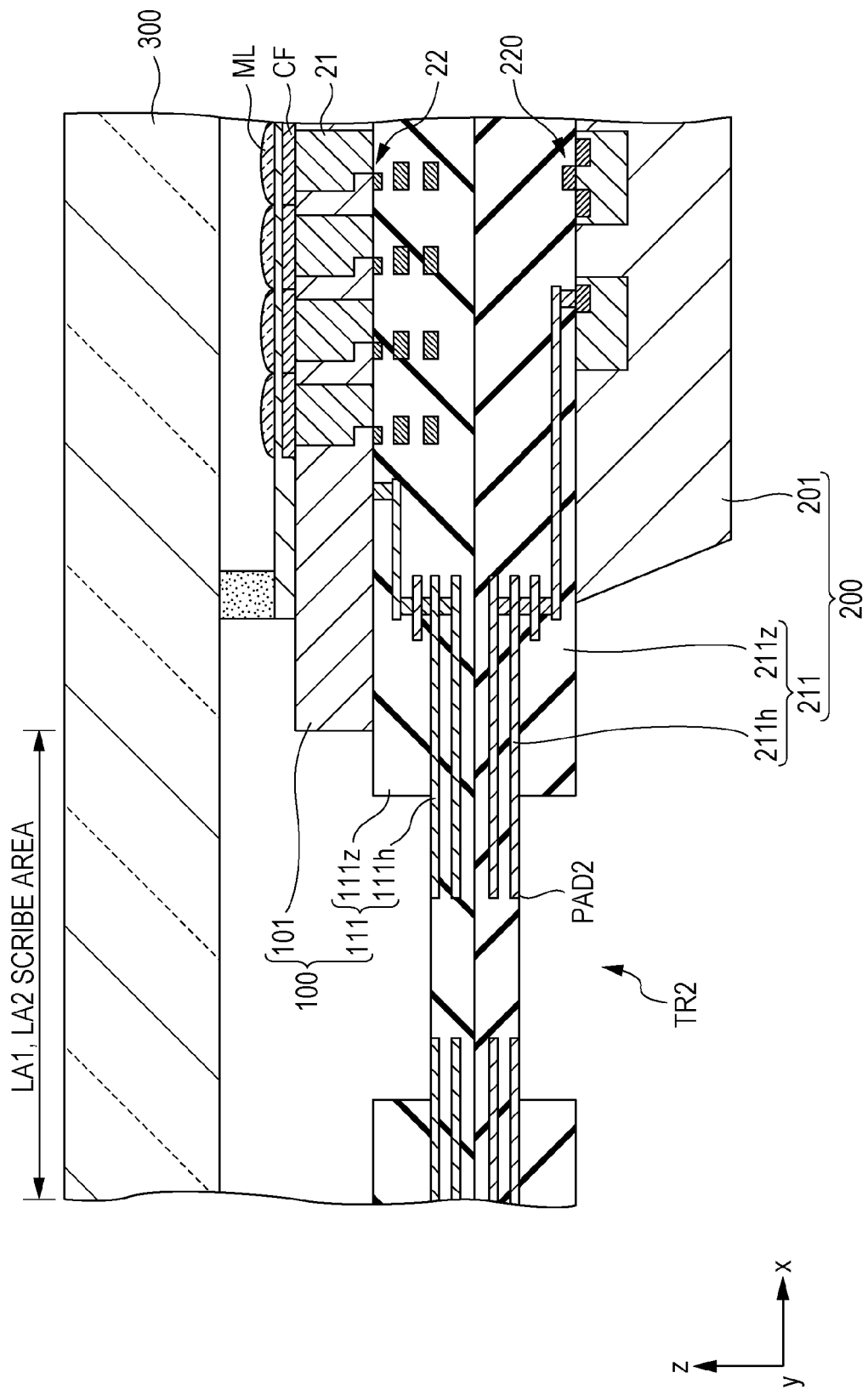
FIG. 15 is a diagram illustrating the method of manufacturing the solid-state imaging device according to embodiment 1 of the disclosure.
Figure 16:
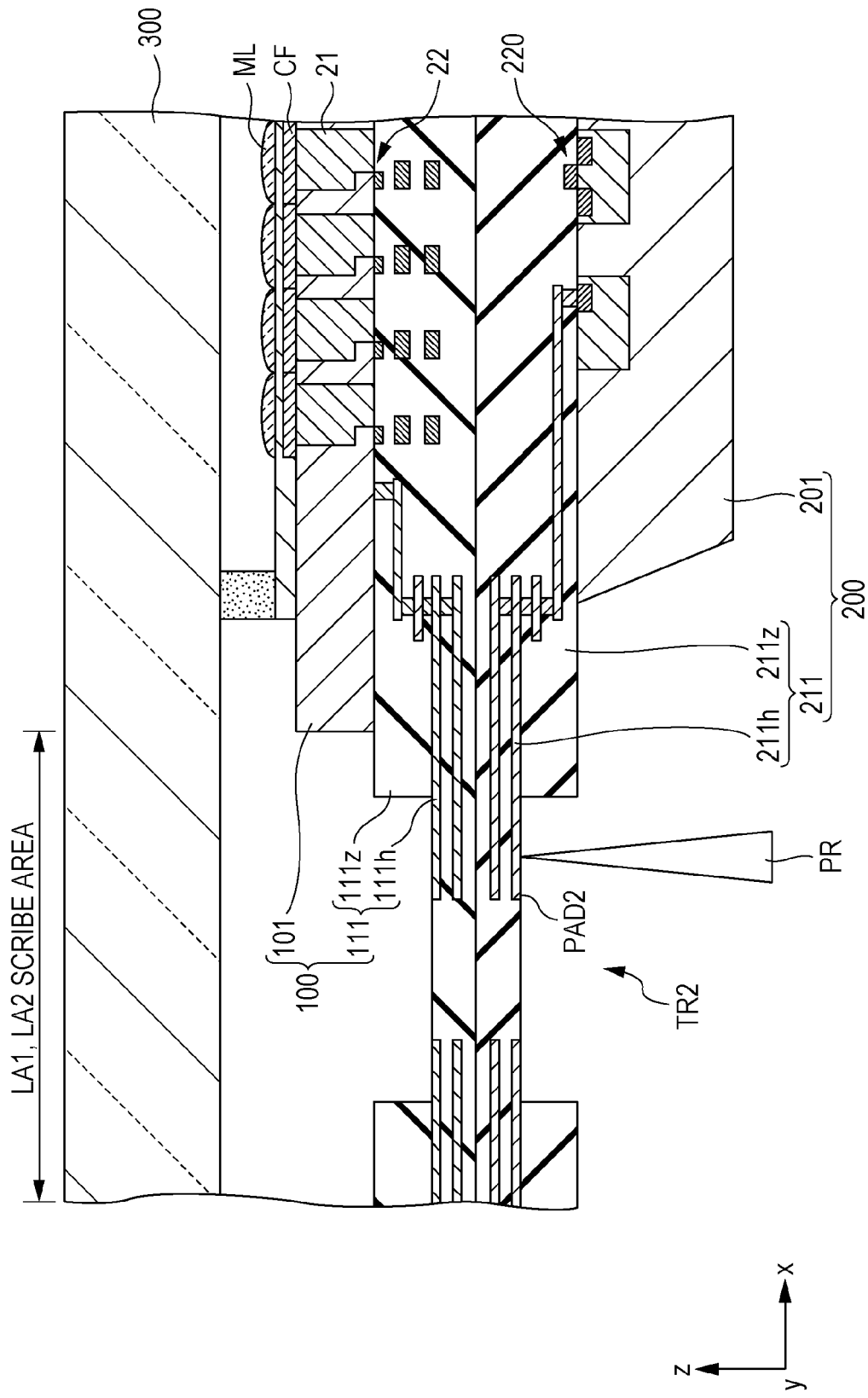
FIG. 16 is a diagram illustrating the method of manufacturing the solid-state imaging device according to embodiment 1 of the disclosure.
Figure 17:
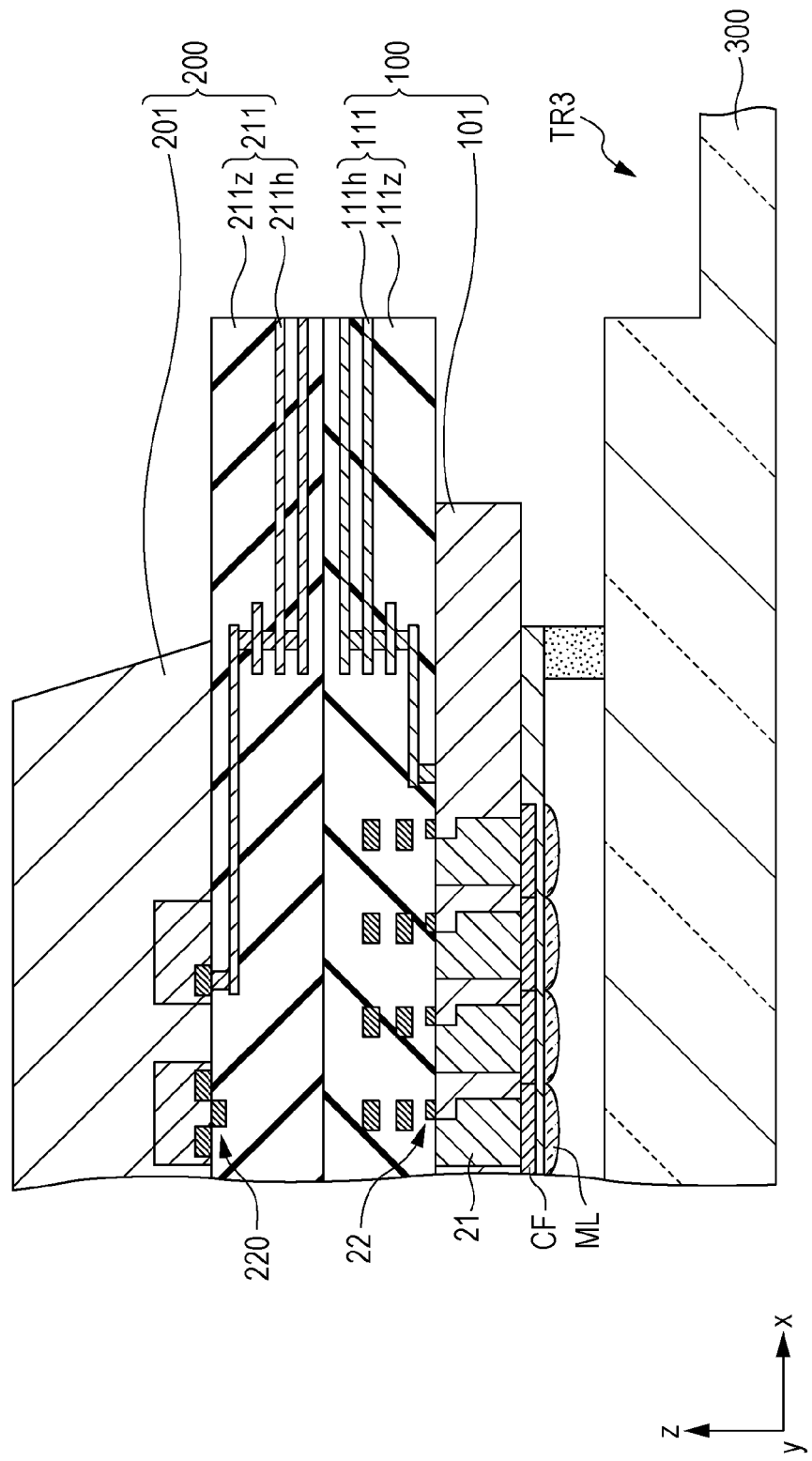
FIG. 17 is a diagram illustrating the method of manufacturing the solid-state imaging device according to embodiment 1 of the disclosure.

Specifically, FIG. 12 shows a part of the diagram shown in FIG. 10E in an enlarged manner. FIG. 13 shows a part of the diagram shown in FIG. 10F in an enlarged manner. FIG. 14 shows a part of the diagram shown in FIG. 10G in an enlarged manner. FIG. 15 shows a part of the diagram shown in FIG. 10H in an enlarged manner. FIG. 16 shows a part of the diagram shown in FIG. 10I in an enlarged manner. FIG. 17 shows a part of the diagram shown in FIG. 10J in an enlarged manner.

Figure 18:
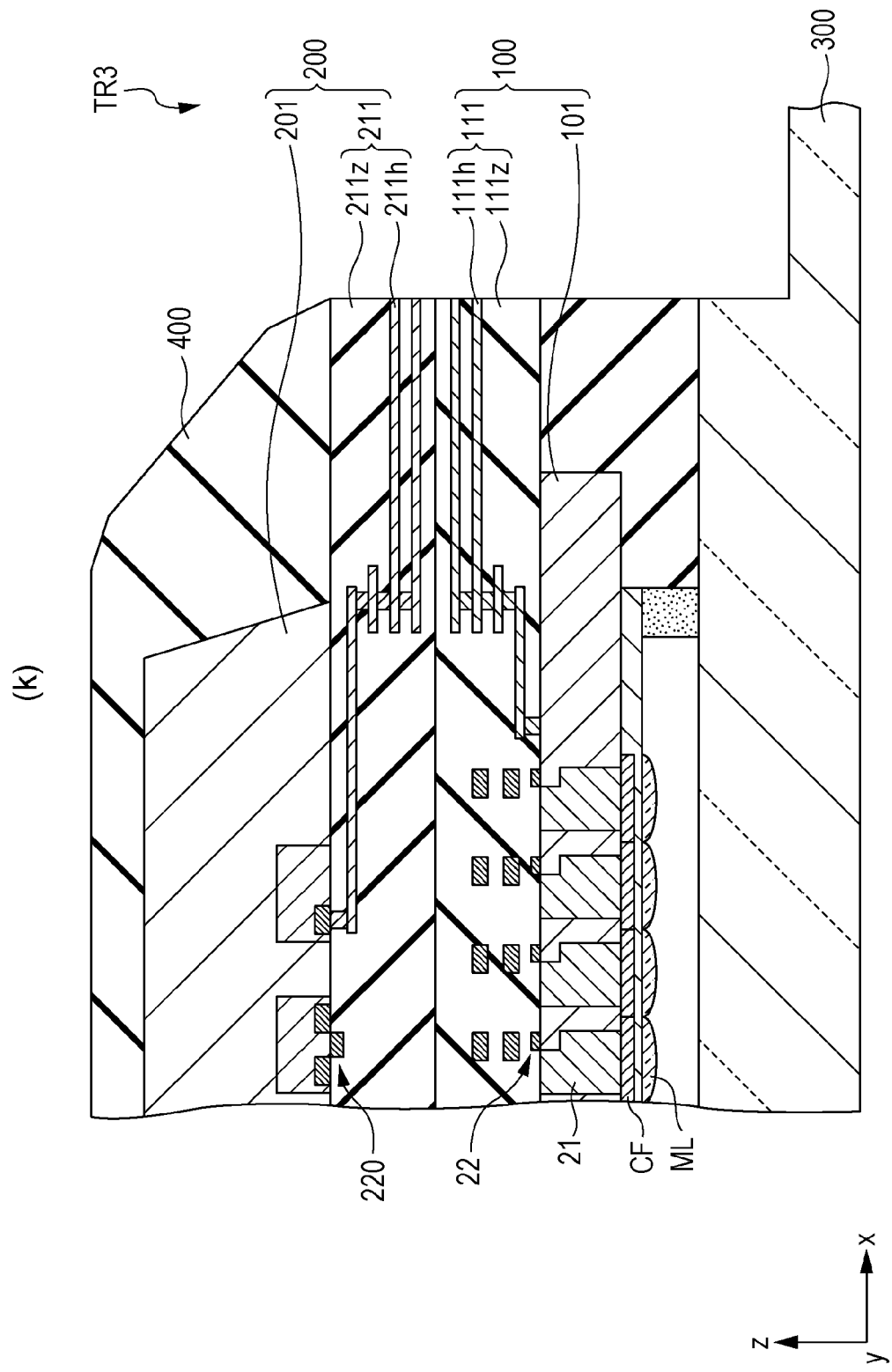
FIG. 18 is a diagram illustrating the method of manufacturing the solid-state imaging device according to embodiment 1 of the disclosure.
Figure 19:
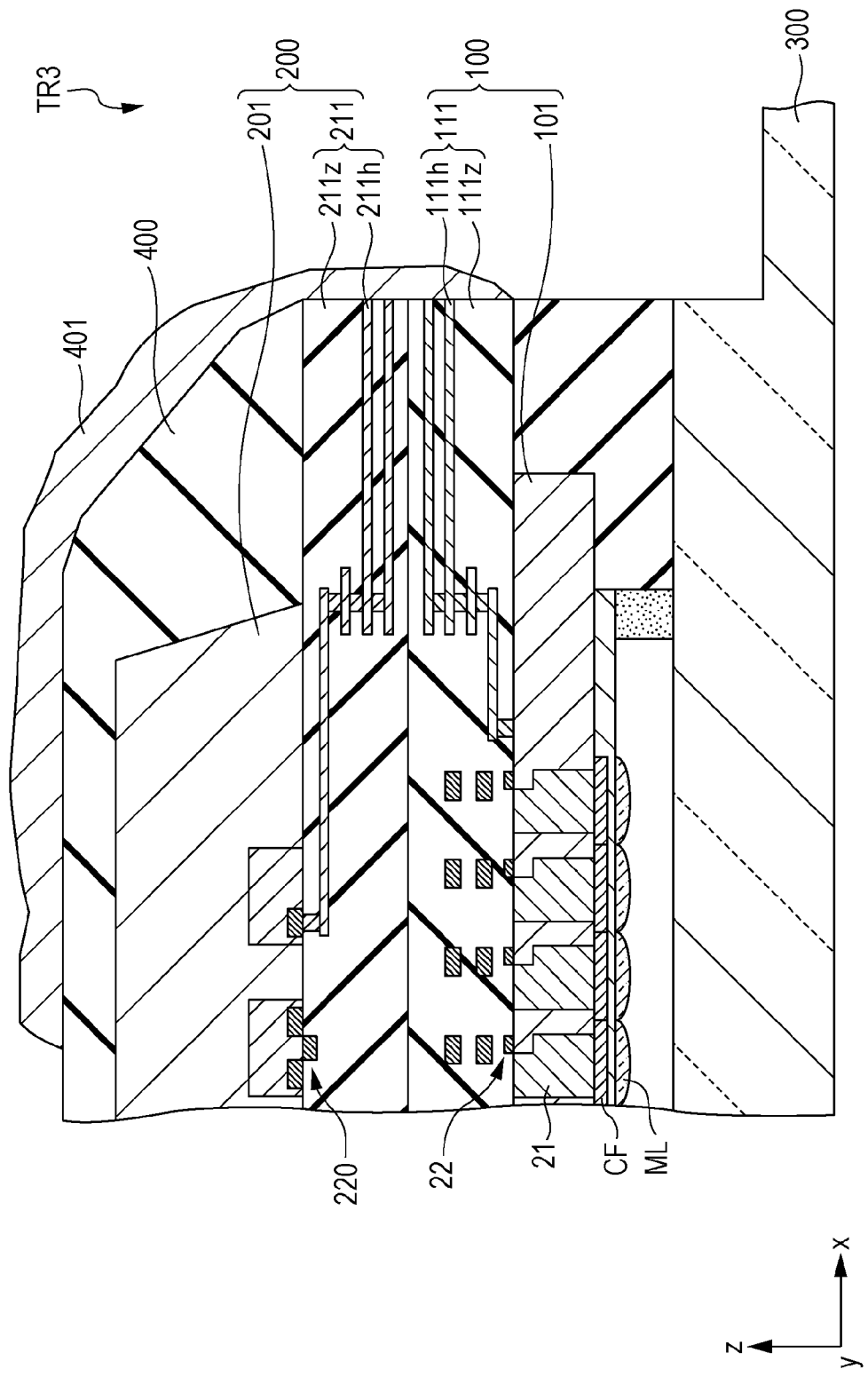
FIG. 19 is a diagram illustrating the method of manufacturing the solid-state imaging device according to embodiment 1 of the disclosure.
Figure 20:
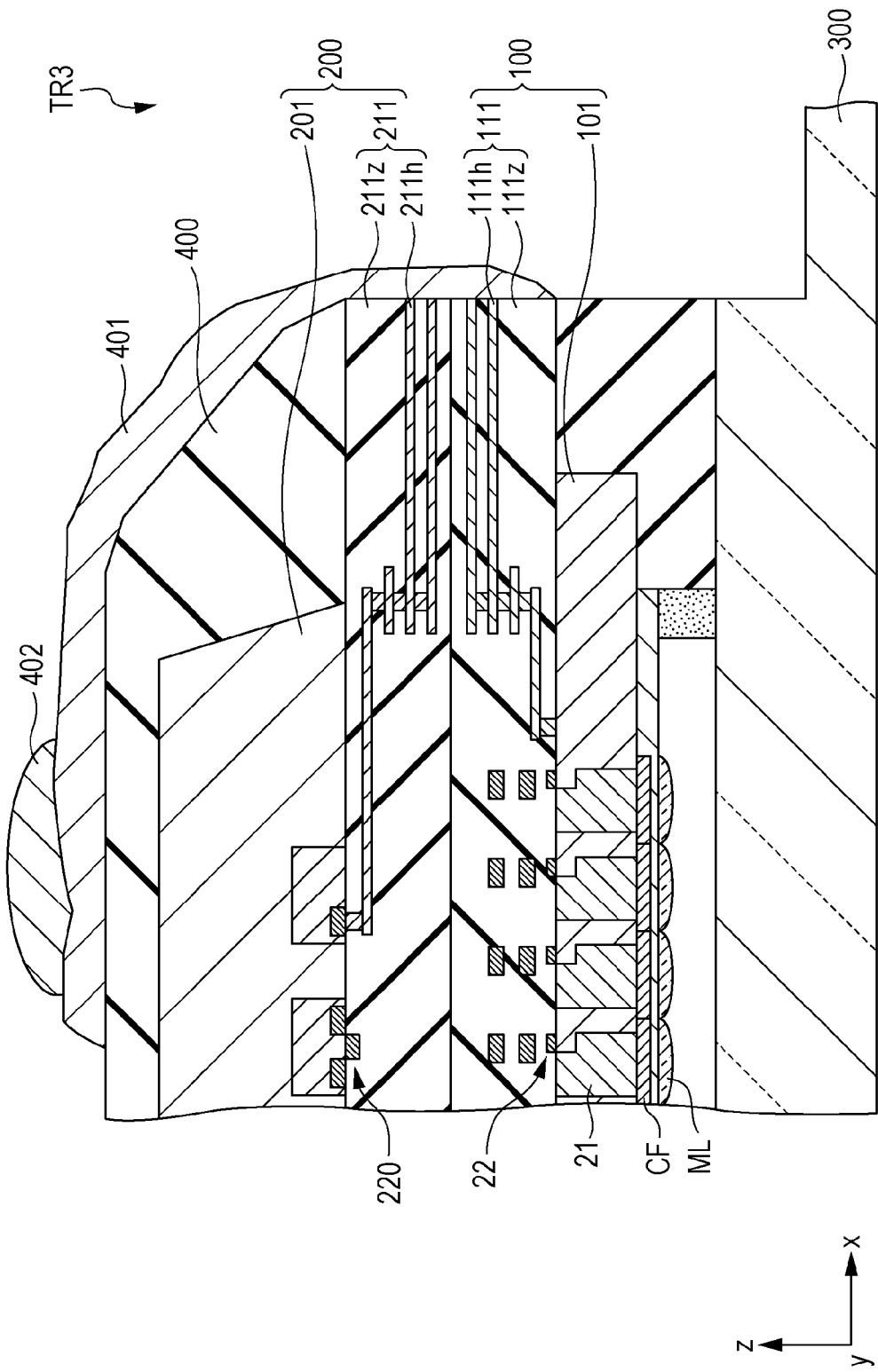
FIG. 20 is a diagram illustrating the method of manufacturing the solid-state imaging device according to embodiment 1 of the disclosure.

In addition, FIGS. 18 to 20 show processes of manufacturing the solid-state imaging device subsequent to the processes of FIGS. 9A to 11J. FIGS. 18 to 20 show, similarly to FIG. 4, a cross-sectional surface of the end portion of the solid-state imaging device.

In the embodiment, as shown in FIGS. 9A to 20, a wafer, in which a plurality of solid-state imaging devices 1 are provided, is divided through the processes of (a) to (m), and the solid-state imaging devices 1 shown in FIG. 4 and the like are manufactured.

The detailed description of the processes will be described.

(a) Formation of Wiring Layer 111 of First Semiconductor Chip 100

Figure 9A:
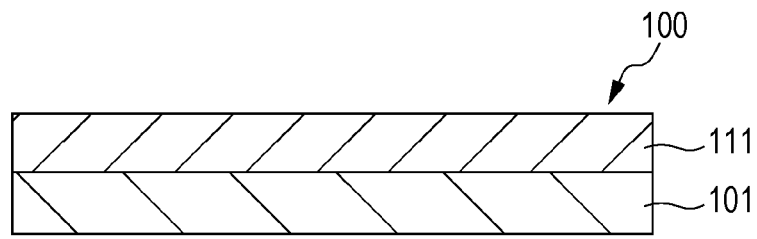
FIGS. 9A to 9D are diagrams illustrating a method of manufacturing a solid-state imaging device according to embodiment 1 of the disclosure.

First, as shown in FIG. 9A, the wiring layer 111 of the first semiconductor chip 100 is formed.

Although not shown in FIG. 9A, before formation of the wiring layer 111, the pixels P, which constitute the first semiconductor chip 100, are formed on the semiconductor substrate 101 of which the thickness is, for example, several hundreds of μm (refer to FIG. 4 and the like).

Here, the respective sections such as the photodiode 21 and the pixel transistor Tr, which include the transfer transistor 22 and the like, are formed in the semiconductor substrate 101 for each area for forming the plurality of first semiconductor chips 100. Specifically, the semiconductor substrate 101 undergoes a process of implanting ions of impurities and the like, thereby forming the respective sections such as the photodiode 21 and the pixel transistor Tr.

In addition, as shown in FIG. 9A, the wiring layer 111 is formed to cover one surface of the semiconductor substrate 101.

Here, as shown in FIG. 4, the wiring layer 111 is formed to also cover the surface on which the pixel transistor Tr such as the transfer transistor 22 is provided. Specifically, by alternately stacking the wiring portions 111h and the interlayer insulation film, the wiring layer 111 is formed.

In such a manner, by performing a "first wiring layer formation process" of stacking the wiring layer 111, in which the wiring portions 111h are formed in the insulation layer 111z, on the semiconductor substrate 101, a part of the first semiconductor chip 100 as an imaging sensor chip is formed.

(b) Formation of Wiring Layer 211 of Second Semiconductor Chip 200

Figure 9B:
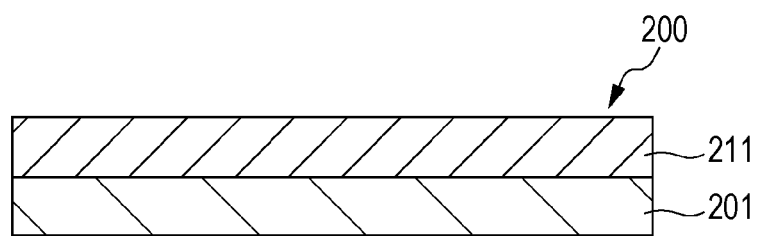

Next, as shown in FIG. 9B, the wiring layer 211 of the second semiconductor chip 200 is formed.

Although not shown in FIG. 9B, before formation of the wiring layer 211, the semiconductor elements 220, which constitute the second semiconductor chip 200, are formed on the semiconductor substrate 201 of which the thickness is, for example, several hundreds of μm (refer to FIG. 4 and the like).

Here, the semiconductor elements 220 such as MOS transistors are formed in the semiconductor substrate 201 for each area for forming the plurality of second semiconductor chips 200. Specifically, the semiconductor substrate 201 undergoes a process of implanting ions of impurities and the like, thereby forming the semiconductor elements 220.

In addition, as shown in FIG. 9B, the wiring layer 211 is formed to cover one surface of the semiconductor substrate 201.

Here, as shown in FIG. 4, the wiring layer 211 is formed to also cover the surface on which the semiconductor elements 220 such as the MOS transistors are provided. Specifically, by alternately stacking the wiring portions 211h and the interlayer insulation film, the wiring layer 211 is formed.

In such a manner, by performing a second wiring layer formation process of stacking the wiring layer 211, in which the wiring portions 211h are formed in the insulation layer 211z, on the semiconductor substrate 201, the second semiconductor chip 200 is formed.

(c) Bonding of Semiconductor Substrates 101 and 201

Figure 9C:
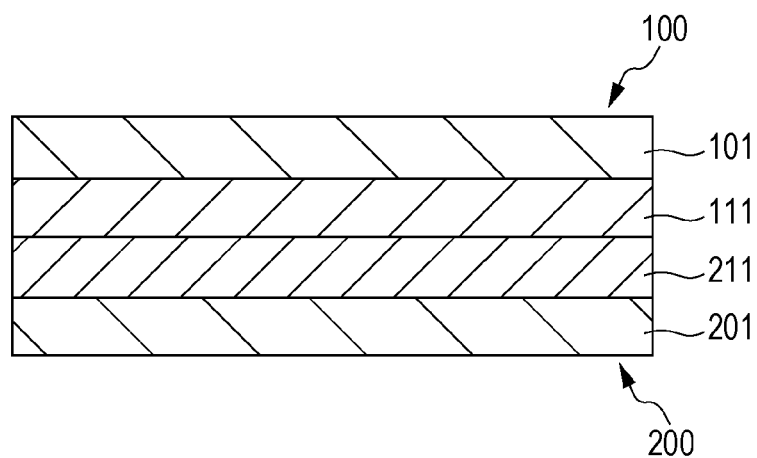

Next, as shown in FIG. 9C, two semiconductor substrates 101 and 201 are opposed and bonded to each other.

Here, the wiring layers 111 and 211 of the semiconductor substrates 101 and 201 are opposed to each other, and the opposed surfaces are bonded to each other. For example, both are bonded to each other by an adhesive.

Otherwise, the two semiconductor substrates 101 and 201 may be bonded by plasma bonding.

As described above, a "chip stacking process" of stacking the second semiconductor chip 200 on the first semiconductor chip 100 is performed.

(d) Thinning of Semiconductor Substrate 101

Figure 9D:
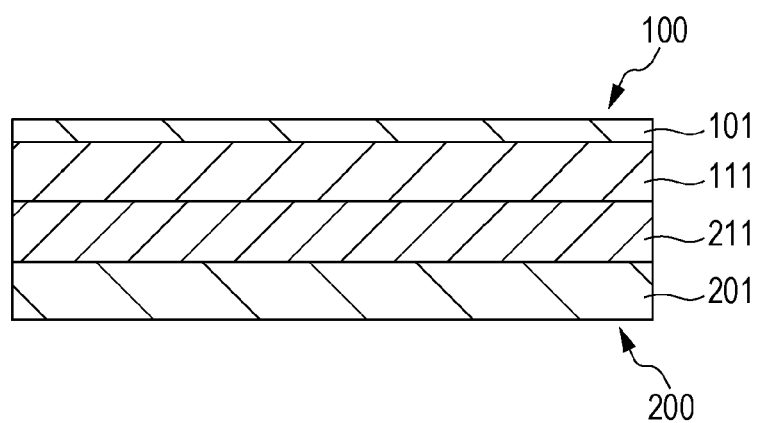

Next, as shown in FIG. 9D, the semiconductor substrate 101 is thinned.

Here, by polishing the rear surface of the semiconductor substrate 101 opposite to the surface thereof on which the wiring layer 111 is provided, a thinning process is performed on the semiconductor substrate 101. In the "thinning process", in a state where the second semiconductor chip 200 is stacked on and is supported by the first semiconductor chip 100 in the process, the thinning process is preformed on the semiconductor substrate 101. The treatment ends by using the insulation film, which is provided on the semiconductor substrate 101, or a high concentration impurity region as a stopper layer.

Thereby, for example, the semiconductor substrate 101 is thinned such that the thickness thereof is 2 to 10 μm.

Thereafter, although not shown in FIG. 9D, as shown in FIG. 4, the respective sections such as the color filter CF and the on-chip lens ML are formed.

(e) Formation of Groove TR1

Next, as shown in FIG. 10E, an etching process is performed on the semiconductor substrate 101 and the wiring layer 111, thereby forming grooves TR1.

Here, the etching process is performed on the semiconductor substrate 101 so as to make holes which penetrate the semiconductor substrate 101.

In addition, the etching process is performed on the wiring layer 111 so as to form recesses which do not penetrate the wiring layer 111.

Specifically, as shown in FIG. 12, the etching process is performed on the scribe areas LA1 and LA2 (refer to FIG. 3)

of the solid-state imaging device 1 so as to expose the surface of the pad electrode PAD1 connected to the wiring portions 111$h$, thereby providing the grooves TR1.

In such a manner, a "first pad surface exposure process" of exposing the surface of the pad electrode PAD1 at the side portion of the first semiconductor chip 100 is performed.

(f) Test of First Semiconductor Chip 100

Figure 10F:
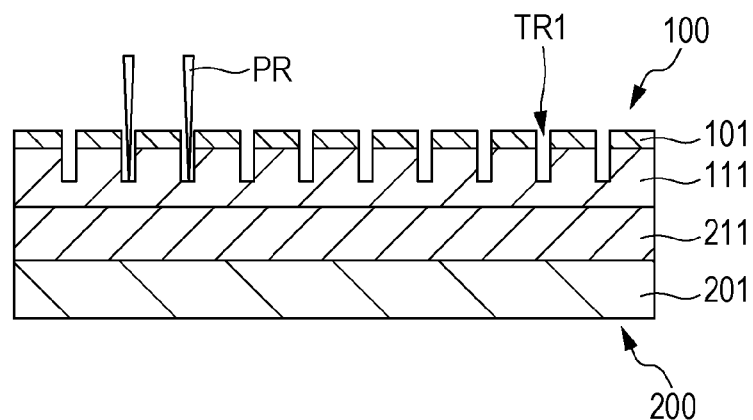

Next, as shown in FIG. 10F, the first semiconductor chip 100 is tested.

Here, a pair of electrometric probers PR is inserted in the groove TR1 which is formed by the process, thereby testing the first semiconductor chip 100. That is, in the "first chip test process", in the state of the wafer in which the plurality of first semiconductor chips 100 are provided, whether or not each first semiconductor chip 100 is able to exhibit the prescribed characteristics of an image sensor.

Specifically, as shown in FIG. 13, the probers PR come into contact with the surface of the pad electrode PAD1 which is exposed in the scribe areas LA1 and LA2, thereby measuring the electrical characteristics of the first semiconductor chip 100. In addition, on the basis of the measurement result, in the test of the first semiconductor chip 100, whether the chip has passed the test is determined. If the test is passed, the procedure advances to the following process. In contrast, if the test is failed, for example, manufacturing is stopped.

(g) Provision of Glass Substrate 300

Figure 10G:
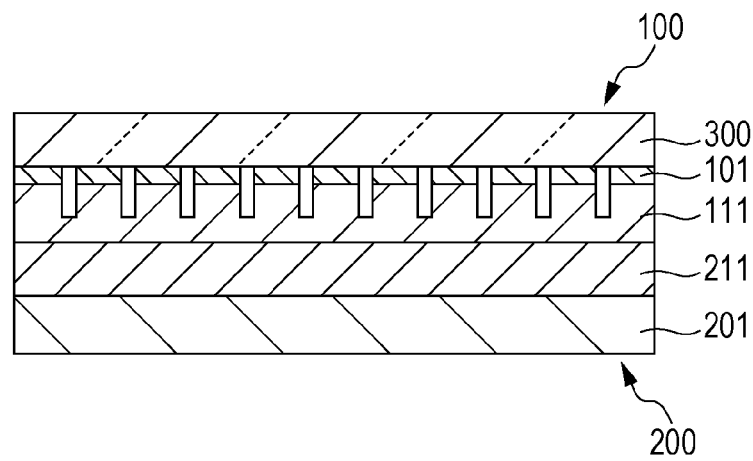

Next, as shown in FIG. 10G, the glass substrate 300 is provided.

Here, the glass substrate 300 is provided on the surface of the semiconductor substrate 101 opposite to the surface thereof on which the wiring layer 111 is provided.

Specifically, as shown in FIG. 14, the glass substrate 300 is bonded by the adhesive layer 301.

By providing the glass substrate 300, it is possible to prevent particles, which are generated in subsequent processes such as the dicing process, from mixing in the first semiconductor chip 100. Thus, it is possible to improve reliability of the apparatus and a yield ratio.

(h) Formation of Groove TR2

Figure 11H:
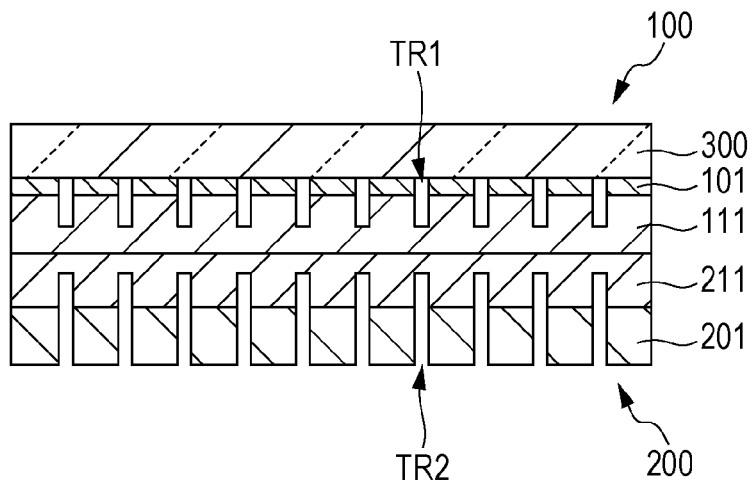
FIGS. 11H to 11J are diagrams illustrating the method of manufacturing the solid-state imaging device according to embodiment 1 of the disclosure.

Next, as shown in FIG. 11H, an etching process is performed on the semiconductor substrate 201 and the wiring layer 211, thereby forming grooves TR2.

Here, the etching process is performed on the semiconductor substrate 201 so as to make holes which penetrate the semiconductor substrate 201.

In addition, the etching process is performed on the wiring layer 211 so as to remove a part of the wiring layer 211.

Specifically, as shown in FIG. 15, the etching process is performed on the scribe areas LA1 and LA2 so as to expose the surface of the pad electrode PAD2 which is formed to be connected to the wiring portions 211$h$, thereby providing the grooves TR2.

In such a manner, a "second pad surface exposure process" of exposing the surface of the pad electrode PAD2 at the side portion of the second semiconductor chip 200 is performed.

(i) Test of Second Semiconductor Chip 200

Figure 11I:
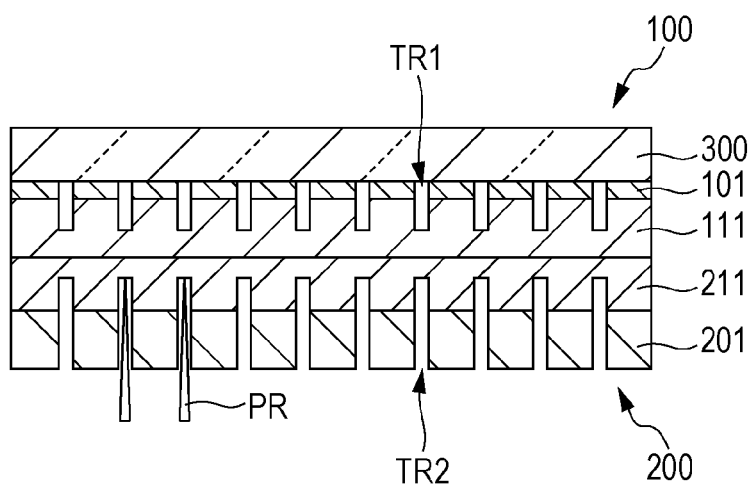

Next, as shown in FIG. 11I, the second semiconductor chip 200 is tested.

Here, a pair of electrometric probers PR is inserted in the groove TR2 which is formed by the process, thereby testing the second semiconductor chip 200. That is, in the "second chip test process", in the state of the wafer in which the plurality of second semiconductor chips 200 are provided, whether or not each second semiconductor chip 200 is able to exhibit the prescribed characteristics of an image sensor.

Specifically, as shown in FIG. 16, the probers PR come into contact with the surface of the pad electrode PAD2 which is exposed in the scribe areas LA1 and LA2, thereby measuring the electrical characteristics of the second semiconductor chip 200. In addition, on the basis of the measurement result, in the test of the second semiconductor chip 200, whether the chip has passed the test is determined. If the test is passed, the procedure advances to the following process. In contrast, if the test is failed, for example, manufacturing is stopped.

(j) Formation of Groove TR3

Figure 11J:
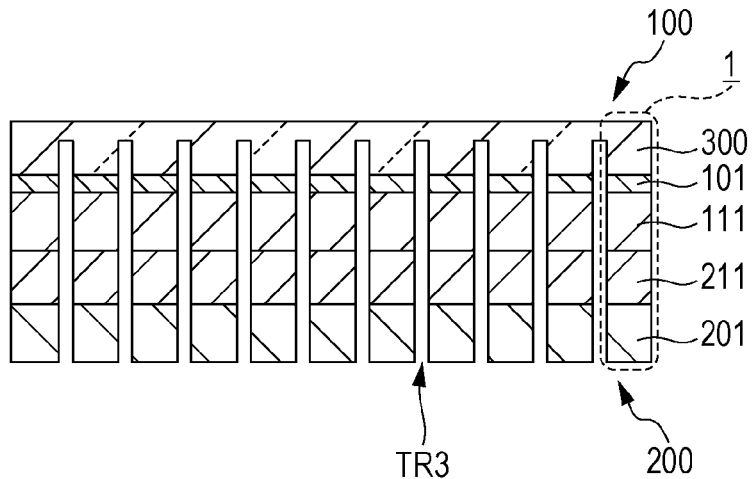

Next, as shown in FIG. 11J, a dicing process is performed on the wiring layers 111 and 211 and the glass substrate 300, thereby forming grooves TR3.

Here, the dicing process is performed so as to make holes that connect the grooves TR1, which are formed between the plurality of first semiconductor chips 100 in the above-mentioned process flow, to the grooves TR2 which are formed between the plurality of second semiconductor chips 200.

In addition, the dicing process is performed on the glass substrate 300 so as to remove a part of the glass substrate 300. That is, a half-cut is performed such that a part of the glass substrate 300 remains.

Specifically, as shown in FIG. 17, the dicing is performed such that, in the respective wiring layers 111 and 211 of the first semiconductor chip 100 and the second semiconductor chip 200, the side surfaces of the wiring portions 111$h$ and 211$h$ are exposed on the sidewall surface, thereby forming the grooves TR3.

Thereby, the solid-state imaging device 1, which is formed by bonding the first semiconductor chip 100 and the second semiconductor chip 200, is combined with a part of the glass substrate 300.

Furthermore, the pad electrodes PAD1 and PAD2, which are used in the test, are also removed by the polishing at the time of the dicing process of exposing the side surfaces of the wiring portions 111$h$ and 211$h$.

In such a manner, a "side surface exposure process" is performed. Here, the side surface exposure process is a process of exposing the side surfaces of the wiring portions 111$h$ of the first semiconductor chip 100 and the wiring portions 211$h$ of the second semiconductor chip 200 at the side portion of the stacked body in which the first semiconductor chip 100 and the second semiconductor chip 200 are stacked.

(k) Formation of Insulation Film 400

Next, as shown in FIG. 18, the insulation film 400 is formed.

Here, the side portion of the semiconductor substrate 101, which constitutes the first semiconductor chip 100, and the area from the side portion to the upper surface of the semiconductor substrate 201, which constitutes the second semiconductor chip 200, are covered by, for example, resin such as epoxy resin, thereby forming an insulation film 400.

In this case, the insulation film 400 is formed such that the side surfaces of the wiring portions 111$h$ and 211$h$ are still exposed on the sidewall surfaces of the respective wiring layers 111 and 211. For example, by using a printing technique of a printed wiring substrate, the insulation film 400 is formed.

(l) Formation of Conductive Layer 401

Next, as shown in FIG. 19, the conductive layer 401 is formed.

Here, the conductive layer 401 is formed to cover both side portions of the wiring layer 111, which constitutes the first semiconductor chip 100, and the wiring layer 211 which constitutes the second semiconductor chip 200.

That is, the conductive layer 401 is formed such that the conductive layer 401 electrically interconnects the wiring portions 111$h$ and 211$h$ which is exposed at the side portions of the wiring layers 111 and 211. Although not shown in the drawing, the conductive layer 401 is formed in a stripe shape so as to correspond to the wiring portions 111h and 211h such as a power source wiring portion and a signal wiring portion, and thus electrically interconnects the first semiconductor chip 100 and the second semiconductor chip 200.

In addition, with such a configuration, the conductive layer 401 is formed to extend from the side portion of the wiring layer 211, which constitutes the second semiconductor chip 200, to the upper surface, with the insulation film 400 interposed therebetween. As described, the conductive layer 401 is formed to function as a connection pad on the upper surface of the wiring layer 211.

(m) Formation of Bump 402

Next, as shown in FIG. 20, the bump 402 is formed.

Here, the bump 402 is formed on the surface of the semiconductor substrate 201 opposite to the surface thereof on which the wiring layer 211 is provided, with the insulation film 400 and the conductive layer 401 interposed therebetween. That is, the bump 402 is formed on the portion, in which the conductive layer 401 functions as a connection pad, on the upper surface of the wiring layer 211.

(n) Separation into Solid-State Imaging Device 1

Next, as shown in FIG. 4, the solid-state imaging devices 1 are separated.

Here, the wafer, which is provided with the plurality of solid-state imaging devices 1 each having the first semiconductor chip 100 and the second semiconductor chip 200 stacked, is separated into pieces each of which corresponds to each solid-state imaging device 1.

Specifically, the glass substrate 300 is cut into a plurality of pieces along the grooves TR3, whereby the wafer is separated into the solid-state imaging devices 1. That is, the glass substrate 300, which connects the plurality of solid-state imaging device 1, is separated into pieces each of which corresponds to each solid-state imaging device 1.

(C) Summary

As described above, in the embodiment, the solid-state imaging device 1 as a semiconductor device has the first semiconductor chip 100 and the second semiconductor chip 200 which is stacked on the first semiconductor chip 100. The first semiconductor chip 100 includes the wiring portions (first wiring portions) 111h of which the side surfaces are exposed at the side portion thereof. Further, the second semiconductor chip 200 includes the wiring portions (second wiring portions) 211h of which the side surfaces are exposed at the side portion thereof. In addition, the side surfaces of the respective wiring portions 111h and 211h, which are exposed at the side portions of the first semiconductor chip 100 and the second semiconductor chip 200, are covered by the conductive layer 401. That is, the conductive layer 401 electrically interconnects the wiring portions 111h and 211h (refer to FIG. 4).

As described above, in the embodiment, the plurality of semiconductor chips 100 and 200 are electrically connected at the side wall portion, and thus it is not necessary to provide the pad electrodes on the surface of the semiconductor substrate in order to electrically connect both of them. Accordingly, in the embodiment, it is possible to reduce the occupied area of the apparatus, and thus it is possible to easily achieve miniaturization.

Further, in the embodiment, the second semiconductor chip 200 is stacked on and supported by the first semiconductor chip 100, and then the semiconductor substrate 101 is thinned. Hence, in the embodiment, thinning can be uniformly performed. Accordingly, it is possible to easily improve manufacturing efficiency, lower costs, and improve reliability.

Further, in the embodiment, the surface of the pad electrode PAD1 of the first semiconductor chip 100 is exposed, and then the first semiconductor chip 100 is tested by using the surface of the pad electrode PAD1. In addition, the glass substrate 300 is provided above the surface of the pad electrode PAD1. Subsequently, the surface of the pad electrode PAD2 of the second semiconductor chip 200 is exposed, and then the second semiconductor chip 200 is tested by using the surface of the pad electrode PAD2. Hence, both of the first semiconductor chip 100 and the second semiconductor chip 200 can be tested. Accordingly, it is possible to easily improve manufacturing efficiency, lower costs, and improve reliability.

Furthermore, the above description was given of the case where each of the first semiconductor chip 100 and the second semiconductor chip 200 is separately tested, but the disclosure is not limited to this. The tests of the respective chips may be omitted, and the test of the apparatus may be performed in a finally stacked chip state.

2. Embodiment 2

(A) Configuration of Device

FIG. 21 is a diagram illustrating principal sections of a semiconductor device according to embodiment 2 of the disclosure. FIG. 21 shows, similarly to FIG. 4, a cross-sectional surface of the end portion of the semiconductor device.

As shown in FIG. 21, the semiconductor device 1b includes a first semiconductor chip 100b, a second semiconductor chip 200b, an insulation film 400, a conductive layer 401, and a bump 402.

As shown in FIG. 21, the semiconductor device 1b has a "3-dimensional multilayer chip structure", and the first semiconductor chip 100b and the second semiconductor chip 200b are bonded to each other. In the embodiment, similarly to embodiment 1, respective wiring portions 111hb and 211hb of the first semiconductor chip 100b and the second semiconductor chip 200b are electrically connected through the conductive layer 401 at the side portions thereof. However, the configurations of the first semiconductor chip 100b and the second semiconductor chip 200b are different from those in embodiment 1. As described, the embodiment includes the same points as and different points from embodiment 1. Hence, a repeated description of the same parts is omitted.

(A-1) Regarding First Semiconductor Chip 100b

The first semiconductor chip 100b includes, as shown in FIG. 21, a semiconductor substrate 101b and a wiring layer 111b, where the wiring layer 111b is provided on the surface of the semiconductor substrate 101b.

The first semiconductor chip 100b is opposed to the second semiconductor chip 200b, and is bonded to the second semiconductor chip 200b through the surfaces opposed to each other. Here, the wiring layer 111b of the first semiconductor chip 100b is disposed to be opposed to the wiring layer 211b of the second semiconductor chip 200b. Thus, the surfaces of the wiring layers 111b and 211b opposed to each other are bonded to each other.

In addition, in the first semiconductor chip 100b, as shown in FIG. 21, the side portion of the semiconductor substrate 101b is covered by the insulation film 400. Further, in the first semiconductor chip 100b, the side portion of the wiring layer 111b is covered by the conductive layer 401.

In addition, in the first semiconductor chip 100b, as shown in FIG. 21, semiconductor elements 22b are provided on a side of the surface on which the wiring layer 111b is provided in the semiconductor substrate 101b.

The semiconductor elements 22b include MIM capacitors, and are formed to constitute a DRAM chip (a memory chip). For example, each semiconductor element 22b includes the MIM capacitor which is formed by using $Ta_2O_5$ or $ZrO_2$ as a capacitor insulation film. Otherwise, the semiconductor elements 22b may be formed to constitute a flash memory.

The wiring layer 111b includes, as shown in FIG. 21, similarly to embodiment 1, a plurality of wiring portions 111hb and an insulation layer 111zb, and is provided such that the plurality of wiring portions 111hb are covered by the insulation layer 111zb.

In the wiring layer 111b, each wiring portion 111hb is appropriately formed to be electrically connected to each semiconductor element 22b.

Otherwise, as shown in FIG. 21, in the side portion of the wiring layer 111b, the wiring portions 111hb are formed to extend from the inside of the wiring layer 111b to the side portion thereof. These wiring portions 111hb are provided such that the side surfaces of the wiring portions 111hb are exposed on the sidewall surface of the wiring layer 111b.

Here, the plurality of wiring portions 111hb are provided to be stacked with intervals in the depth direction z. Accordingly, the plurality of wiring portions 111hb are provided such that the respective side surfaces thereof are exposed.

(A-2) Regarding Second Semiconductor Chip 200b

The second semiconductor chip 200b includes, as shown in FIG. 21, a semiconductor substrate 201b and a wiring layer 211b, where the wiring layer 211b is provided on the surface of a semiconductor substrate 201b.

The second semiconductor chip 200b is opposed to the first semiconductor chip 100b, and is bonded to the first semiconductor chip 100b through the surfaces opposed to each other. Here, in the second semiconductor chip 200b, the wiring layer 211b is disposed to be opposed to the wiring layer 111b of the first semiconductor chip 100b. In addition, the opposed surfaces of the wiring layers 111b and 211b are bonded to each other.

In addition, in the second semiconductor chip 200b, as shown in FIG. 21, the side portion of the semiconductor substrate 201b is covered by the insulation film 400. Further, in the second semiconductor chip 200b, the side portion of the wiring layer 211b is covered by the conductive layer 401.

In the second semiconductor chip 200b, as shown in FIG. 21, semiconductor elements 220b are provided on the semiconductor substrate 201b which is a silicon substrate. Each semiconductor element 220b is, for example, an MOS transistor, and the gate thereof is formed of, for example, polysilicon. The semiconductor elements 220b are formed to constitute an arithmetic processing circuit in the second semiconductor chip 200b.

In addition, the semiconductor elements 220b are covered, as shown in FIG. 21, by the wiring layer 211b.

The wiring layer 211b includes, as shown in FIG. 21, wiring portions 211hb and an insulation layer 211zb, and is formed such that the wiring portions 211hb are electrically connected to the circuits constituted by the semiconductor elements 220b and the like in the insulation layer 211zb.

Further, the respective wiring portions 211hb are provided, as shown in FIG. 21, such that the side surfaces of the wiring portions 211hb are exposed on the sidewall surface of the wiring layer 211b. Specifically, in the side portion of the wiring layer 211b, the plurality of wiring portions 211hb are provided to be stacked with intervals in the depth direction z. Accordingly, the plurality of wiring portions 211hb are provided such that the respective side surfaces thereof are exposed.

(A-3) Others

The insulation film 400 is provided, as shown in FIG. 21, so as to cover the area from the side portion to the upper surface of the semiconductor substrate 101b constituting the first semiconductor chip 100b. Further, the insulation film 400 is provided to cover the side portion of the semiconductor substrate 201b constituting the second semiconductor chip 200b.

The conductive layer 401 is formed, as shown in FIG. 21, to cover the side portion of the wiring layer 111b constituting the first semiconductor chip 100b. Further, the conductive layer 401 is also formed to cover the side portion of the wiring layer 211b constituting the second semiconductor chip 200b.

Specifically, the conductive layer 401 is integrally formed between both exposed side surfaces of the wiring portions 111hb and 211hb so as to electrically connect both wiring portions 111hb and 211hb on the sidewall surface.

Further, the conductive layer 401 is formed to extend from the side portion to the upper surface of the wiring layer 111b constituting the first semiconductor chip 100b with the insulation film 400 interposed therebetween. In addition, in the semiconductor substrate 101b constituting the first semiconductor chip 100b, a bump 402 is provided on the surface opposite to the surface, on which the wiring layer 111b is provided, with the insulation film 400 and the conductive layer 401 interposed therebetween.

(B) Manufacturing Method

Hereinafter, principal sections of a method of manufacturing the semiconductor device 1b will be described.

FIGS. 22A to 29 are diagrams illustrating a method of manufacturing a semiconductor device according to embodiment 2 of the disclosure.

Here, FIGS. 22A to 23G sequentially show processes of manufacturing the semiconductor device 1b.

Figure 26:
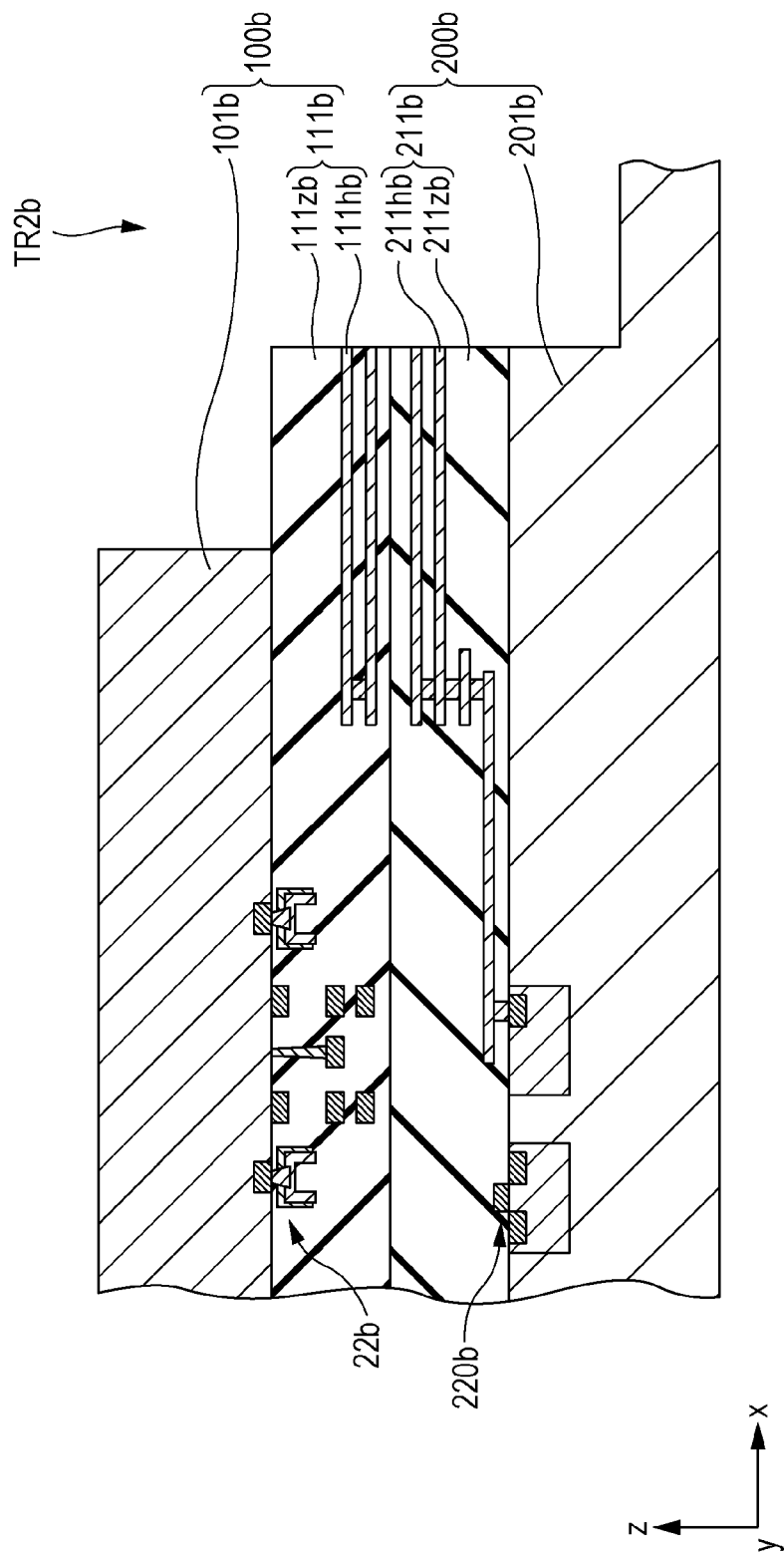
FIG. 26 is a diagram illustrating the method of manufacturing the semiconductor device according to embodiment 2 of the disclosure.

FIGS. 24 to 26 are diagrams illustrating principal sections of the semiconductor device which are formed by the processes shown in FIGS. 22A to 23G, and show, similarly to FIG. 21, the cross-sectional surface of the end portion of the semiconductor device 1b.

Figure 23E:
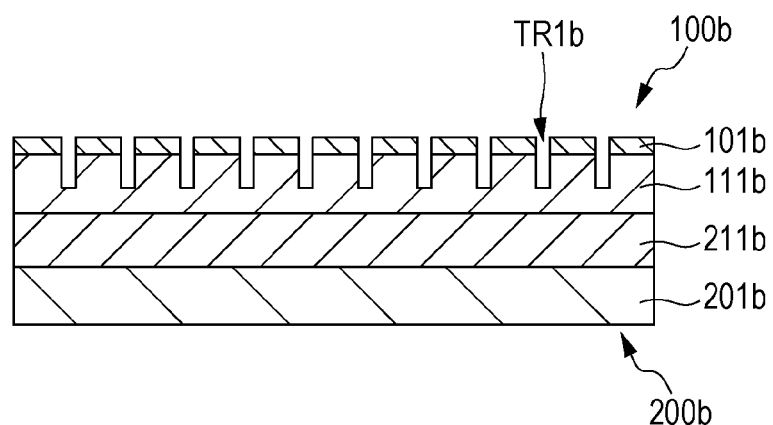
FIGS. 23E to 23G are diagrams illustrating the method of manufacturing the semiconductor device according to embodiment 2 of the disclosure.

Specifically, FIG. 24 shows a part of the diagram shown in FIG. 23E in an enlarged manner. FIG. 25 shows a part of the diagram shown in FIG. 23F in an enlarged manner. FIG. 26 shows a part of the diagram shown in FIG. 23G in an enlarged manner.

Figure 27:
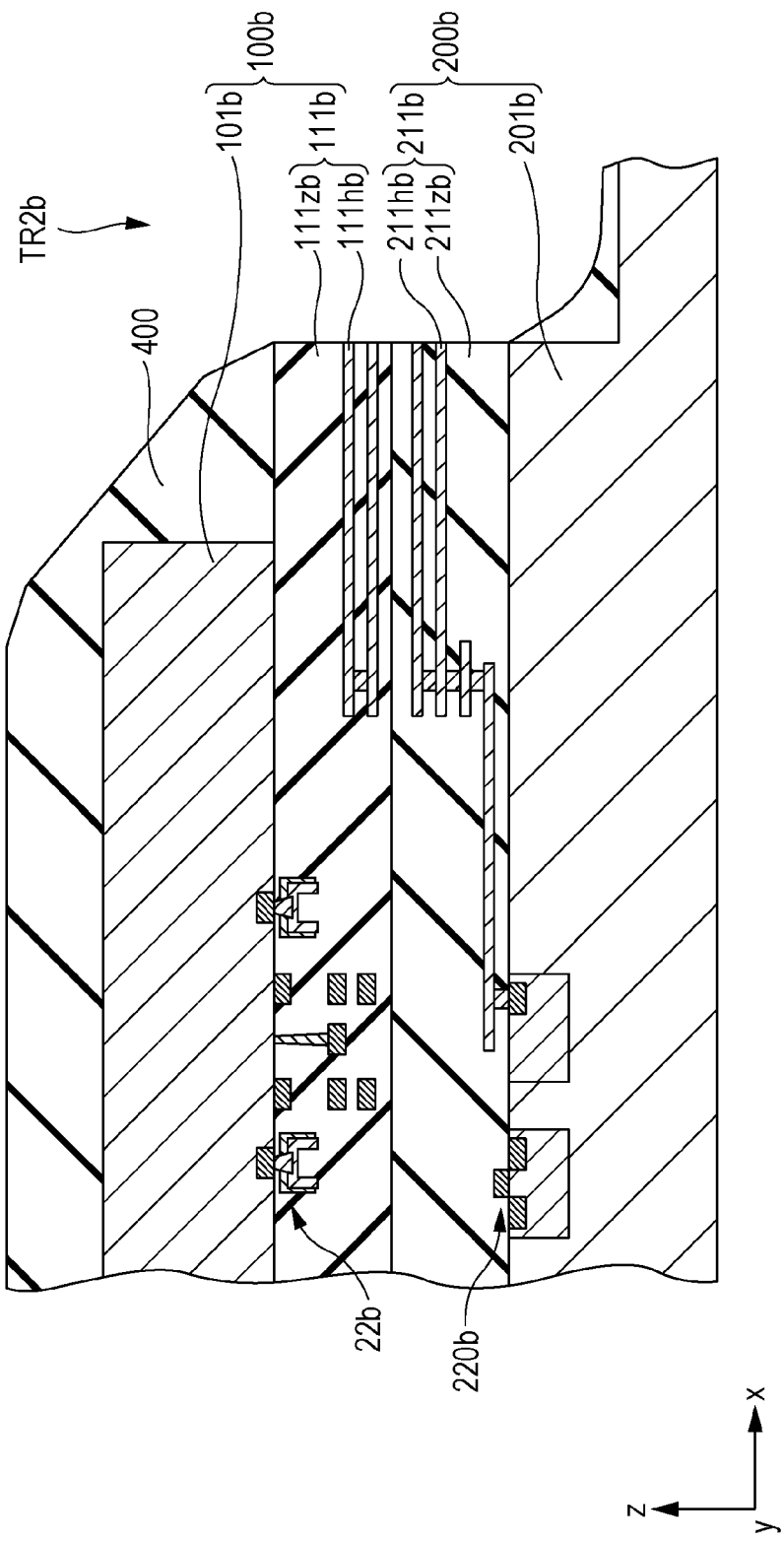
FIG. 27 is a diagram illustrating the method of manufacturing the semiconductor device according to embodiment 2 of the disclosure.
Figure 28:
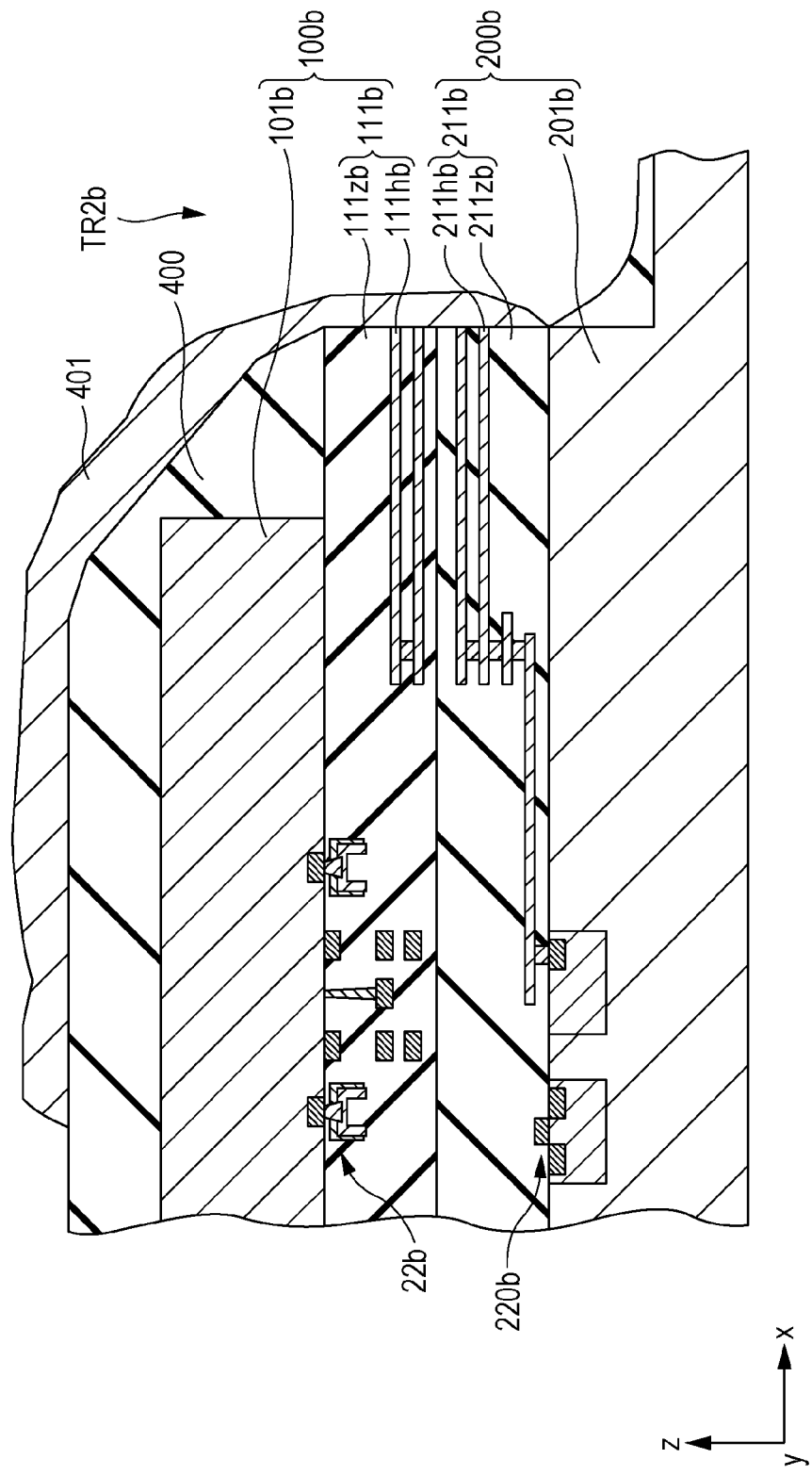
FIG. 28 is a diagram illustrating the method of manufacturing the semiconductor device according to embodiment 2 of the disclosure.
Figure 29:
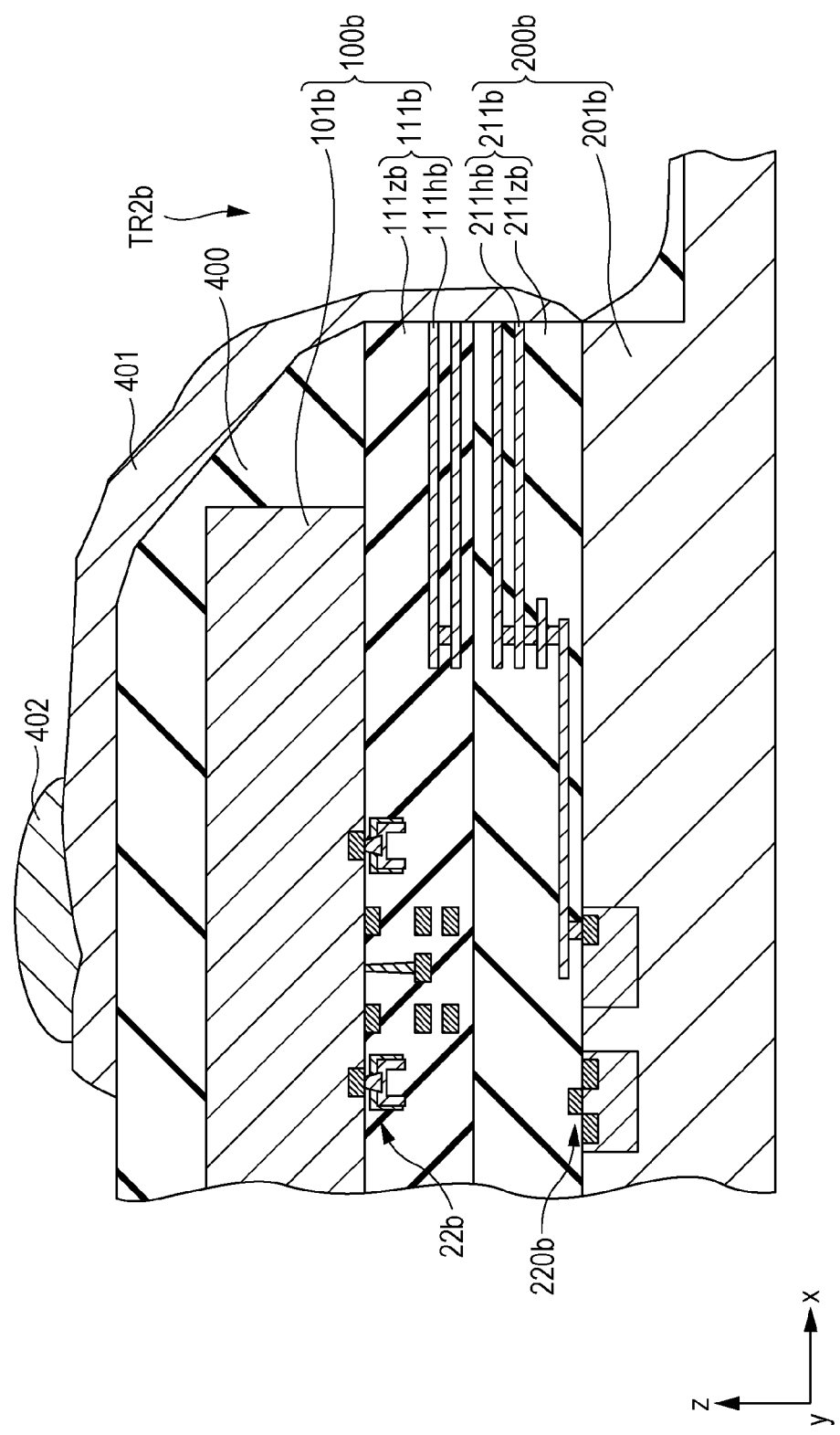
FIG. 29 is a diagram illustrating the method of manufacturing the semiconductor device according to embodiment 2 of the disclosure.

In addition, FIGS. 27 to 29 show processes of manufacturing the semiconductor device subsequent to the processes of FIGS. 22A to 23G. FIGS. 27 to 29 show, similarly to FIG. 21, a cross-sectional surface of the end portion of the semiconductor device 1b.

In the embodiment, as shown in FIGS. 22A to 29, a wafer, in which a plurality of semiconductor device 1b are provided, is divided through the processes of (a) to (j), and the semiconductor device 1b shown in FIG. 21 and the like is manufactured.

The detailed description of the processes will be described.

(a) Formation of Wiring Layer 111b of First Semiconductor Chip 100b

Figure 22A:
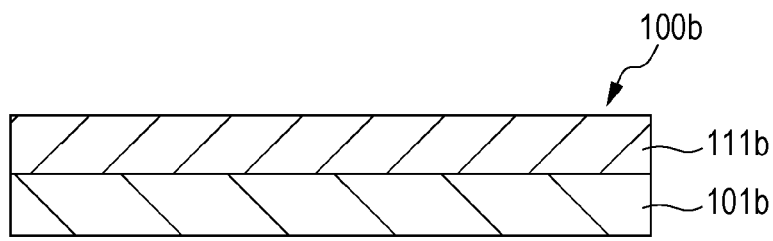
FIGS. 22A to 22D are diagrams illustrating the method of manufacturing the semiconductor device according to embodiment 2 of the disclosure.

First, as shown in FIG. 22A, the wiring layer 111b of the first semiconductor chip 100b is formed.

Although not shown in FIG. 22A, the semiconductor elements 22b are formed on the semiconductor substrate 101b of which the thickness is, for example, several hundreds of μm (refer to FIG. 21 and the like). In addition, the wiring layer 111b is formed to cover one surface of the semiconductor substrate 101b.

(b) Formation of Wiring Layer 211b of Second Semiconductor Chip 200b

Figure 22B:
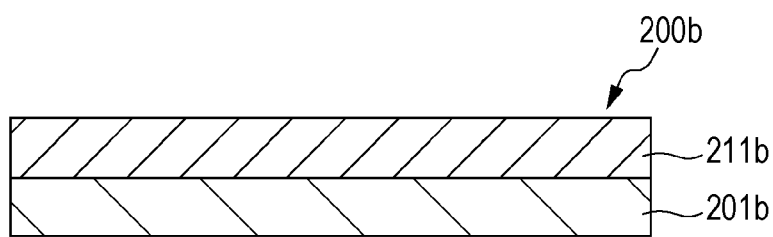

Next, as shown in FIG. 22B, the wiring layer 211b of the second semiconductor chip 200b is formed.

Although not shown in FIG. 22B, the semiconductor elements 220b are formed on the semiconductor substrate 201b (refer to FIG. 21 and the like). In addition, the wiring layer 211b is formed to cover one surface of the semiconductor substrate 201b.

(c) Bonding of Semiconductor Substrates 101b and 201b

Figure 22C:
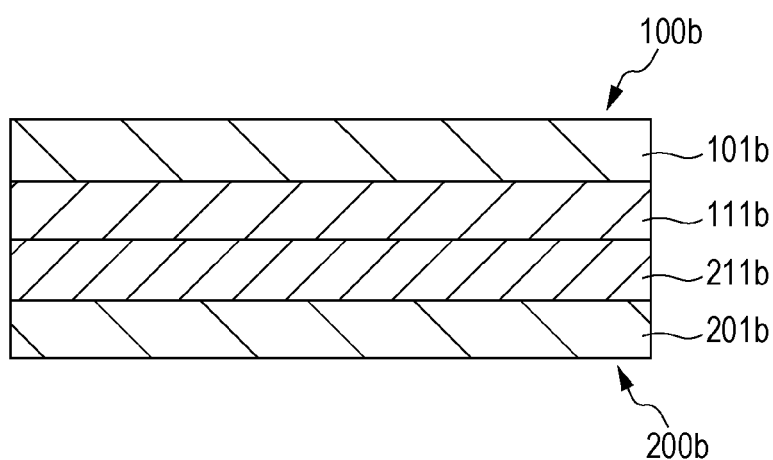

Next, as shown in FIG. 22C, two semiconductor substrates 101b and 201b are opposed and bonded to each other.

Here, the wiring layers 111b and 211b of the semiconductor substrates 101b and 201b are opposed to each other, and the opposed surfaces are bonded to each other. For example, both are bonded to each other by an adhesive.

(d) Thinning of Semiconductor Substrate 101b

Figure 22D:
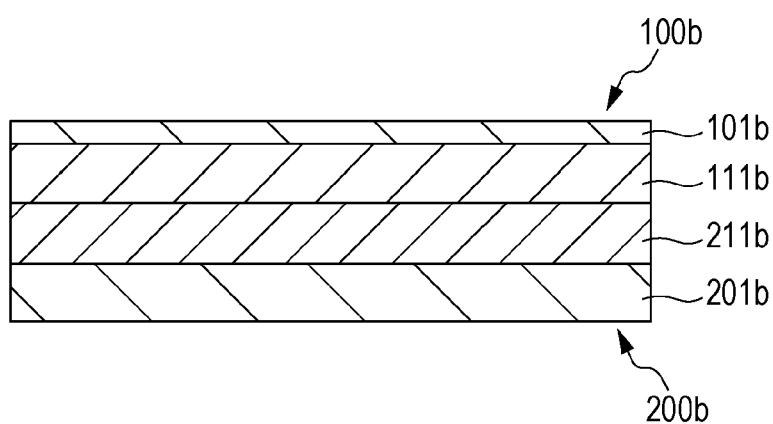

Next, as shown in FIG. 22D, the semiconductor substrate 101b is thinned.

Here, by polishing the surface of the semiconductor substrate 101b opposite to the surface thereof on which the wiring layer 111b is provided, a thinning process is performed on the semiconductor substrate 101b.

Thereby, for example, the semiconductor substrate 101b is thinned such that the thickness thereof is 2 to 10 µm.

(e) Formation of Groove TR1

Next, as shown in FIG. 23E, an etching process is performed on the semiconductor substrate 101b and the wiring layer 111b, thereby forming grooves TR1b.

Here, the etching process is performed on the semiconductor substrate 101b so as to make holes which penetrate the semiconductor substrate 101b.

In addition, the etching process is performed on the wiring layer 111b so as to form recesses which do not penetrate the wiring layer 111b.

Specifically, as shown in FIG. 24, the etching process is performed on the scribe areas of the semiconductor device 1b so as to expose the surface of the pad electrode PAD1 connected to the wiring portions 111hb, thereby providing the grooves TR1b.

(f) Test of First Semiconductor Chip 100b

Figure 23F:
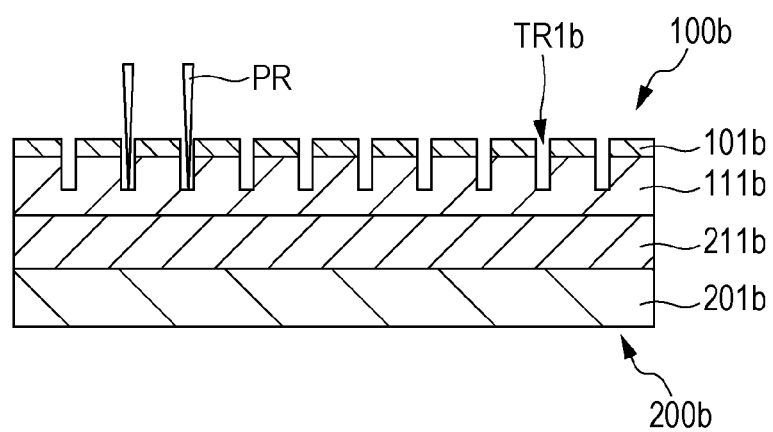

Next, as shown in FIG. 23F, the first semiconductor chip 100b is tested.

Here, a pair of electrometric probers PR is inserted in the groove TR1b which is formed by the process, thereby testing the first semiconductor chip 100b. That is, in the state of the wafer in which the plurality of first semiconductor chips 100 are provided, whether or not each first semiconductor chip 100b is able to exhibit the prescribed characteristics of a memory.

Specifically, as shown in FIG. 25, the probers PR come into contact with the surface of the pad electrode PAD1 which is exposed in the scribe areas, thereby measuring the electrical characteristics of the first semiconductor chip 100b. In addition, on the basis of the measurement result, in the test of the first semiconductor chip 100b, whether the chip has passed the test is determined. If the test is passed, the procedure advances to the following process. In contrast, if the test is failed, for example, manufacturing is stopped.

(g) Formation of Groove TR2b

Figure 23G:
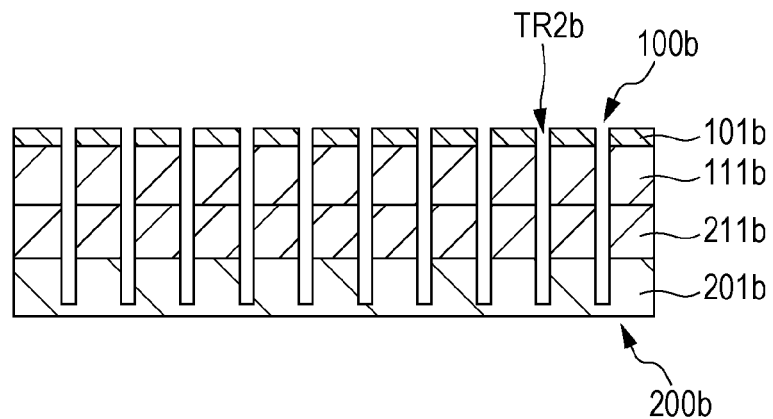

Next, as shown in FIG. 23G, an etching process is performed on the semiconductor substrate 201b and the wiring layer 211b, thereby forming grooves TR2b.

Here, the dicing is further performed on the portions of the grooves TR1b which are formed between the plurality of first semiconductor chips 100b through the above-mentioned process, whereby a part of the semiconductor substrate 201b is made to remain.

Specifically, as shown in FIG. 26, the dicing is performed such that, in the respective wiring layers 111b and 211b of the first semiconductor chip 100b and the second semiconductor chip 200b, the side surfaces of the wiring portions 111hb and 211hb are exposed on the sidewall surface, thereby forming the grooves TR2b.

Thereby, the semiconductor device 1b, which is formed by bonding the first semiconductor chip 100b and the second semiconductor chip 200b, is combined with a part of the semiconductor substrate 201b.

Furthermore, the pad electrode PAD1, which is used in the test, is also removed by the polishing in the dicing process.

(h) Formation of Insulation Film 400

Next, as shown in FIG. 27, the insulation film 400 is formed.

Here, the area from the side portion to the upper surface of the semiconductor substrate 101b, which constitutes the first semiconductor chip 100b, and the side portion of the semiconductor substrate 201b, which constitutes the second semiconductor chip 200b, are covered by, for example, resin such as epoxy resin, thereby forming an insulation film 400.

In this case, the insulation film 400 is formed such that the side surfaces of the wiring portions 111hb and 211hb are still exposed on the sidewall surfaces of the respective wiring layers 111b and 211b. For example, by using a printing technique of a printed wiring substrate, the insulation film 400 is formed.

(i) Formation of Conductive Layer 401

Next, as shown in FIG. 28, the conductive layer 401 is formed.

Here, the conductive layer 401 is formed to cover both side portions of the wiring layer 111b, which constitutes the first semiconductor chip 100b, and the wiring layer 211b which constitutes the second semiconductor chip 200b.

That is, the conductive layer 401 is formed such that the conductive layer 401 electrically interconnects the wiring portions 111hb and 211hb which are exposed at the side portions of the wiring layers 111b and 211b.

In addition, with such a configuration, the conductive layer 401 is formed to extend from the side portion of the wiring layer 111b, which constitutes the first semiconductor chip 100b, to the upper surface, with the insulation film 400 interposed therebetween. As described, the conductive layer 401 is formed to function as a connection pad on the upper surface of the wiring layer 111b.

(j) Formation of Bump 402

Next, as shown in FIG. 29, the bump 402 is formed.

Here, the bump 402 is formed on the surface of the semiconductor substrate 101b opposite to the surface thereof on which the wiring layer 111b is provided, with the insulation film 400 and the conductive layer 401 interposed therebetween. That is, the bump 402 is formed on the portion, in which the conductive layer 401 functions as a connection pad, on the upper surface of the wiring layer 111b.

(k) Separation into Semiconductor Device 1b

Next, as shown in FIG. 21, the semiconductor devices 1b are separated.

Here, the semiconductor substrate 201b, which connects the plurality of semiconductor device 1b, is separated into pieces each of which corresponds to each semiconductor device 1b.

(C) Summary

As described above, in the embodiment, the semiconductor device 1b as a semiconductor device has the first semiconductor chip 100b and the second semiconductor chip 200b which is stacked on the first semiconductor chip 100b. The first semiconductor chip 100b includes the wiring portions (first wiring portions) 111hb of which the side surfaces are exposed at the side portion thereof. Further, the second semiconductor chip 200b includes the wiring portions (second wiring portions) 211hb of which the side surfaces are exposed at the side portion thereof. In addition, the side surfaces of the respective wiring portions 111hb and 211hb, which are exposed at the side portions of the first semiconductor chip 100b and the second semiconductor chip 200b, are covered by the conductive layer 401. That is, the conductive layer 401 electrically interconnects the wiring portions 111hb and 211hb (refer to FIG. 21).

As described above, in the embodiment, similarly to embodiment 1, the plurality of semiconductor chips 100b and 200b are electrically connected at the side wall portion, and thus it is not necessary to provide the pad electrodes on the surface of the semiconductor substrate in order to electrically connect both of them. Accordingly, in the embodiment, it is possible to reduce the occupied area of the apparatus, and thus it is possible to easily achieve miniaturization.

Further, in the embodiment, the first semiconductor chip 100b, which is a memory chip, is thinned. Hence, it is possible to suppress occurrence of soft errors which are caused by damage to storage data.

Figure 30:
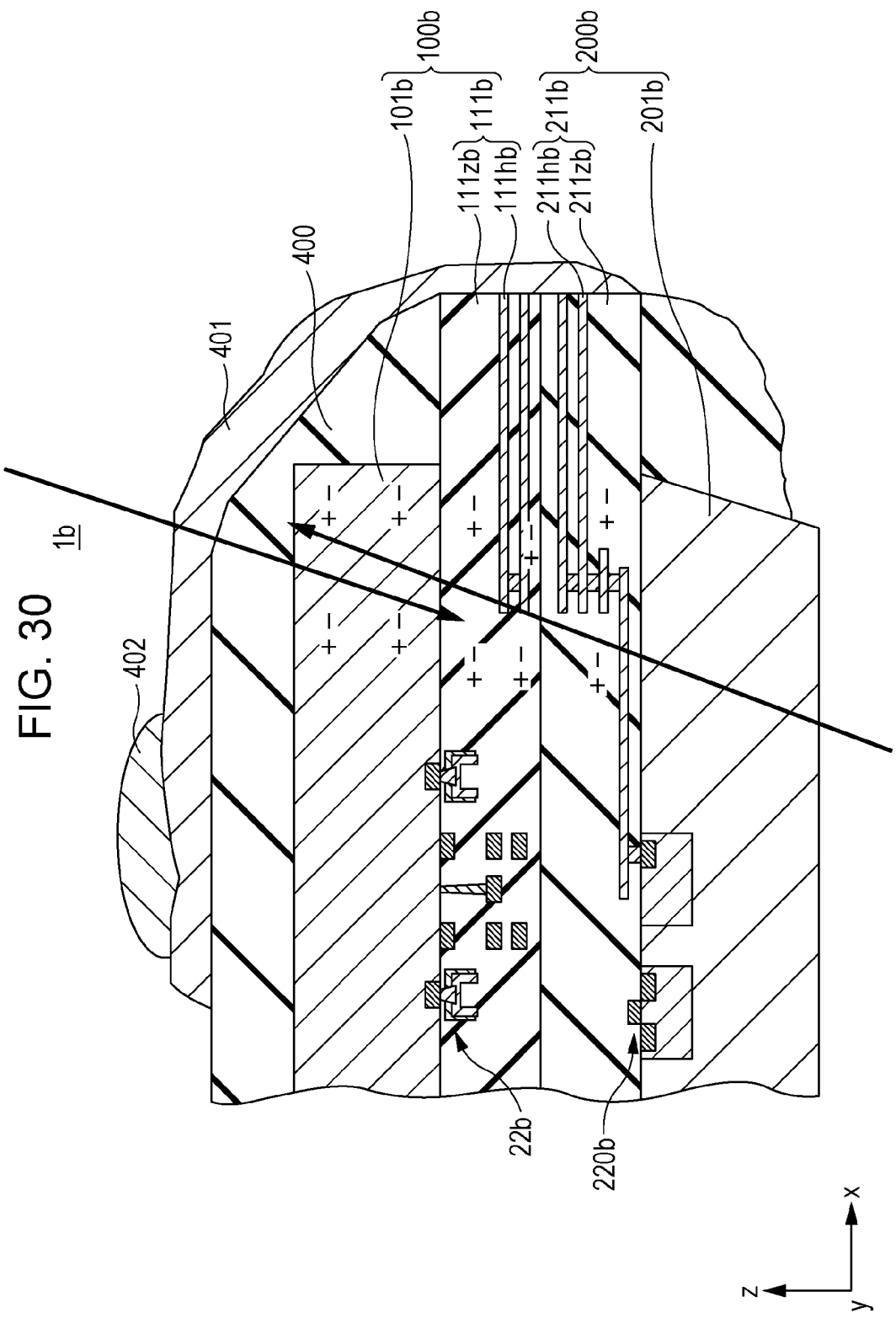
FIG. 30 is a diagram illustrating a situation in which particles of alpha rays or cosmic rays are incident in the semiconductor device according to embodiment 2 of the disclosure.

FIG. 30 is a diagram illustrating a situation in which particles of alpha rays or cosmic rays are incident in the semiconductor device 1b according to embodiment 2 of the disclosure.

As shown in FIG. 30, when alpha rays or cosmic rays are incident, electron-hole pairs are generated, thereby damaging storage data in the first semiconductor chip 100b as a memory chip. Thus, soft errors may occur.

However, by thinning the first semiconductor chip 100b, it is possible to suppress occurrence of electron-hole pairs. Accordingly, it is possible to suppress occurrence of the soft errors caused by damage to the storage data, and thus it is possible to improve reliability of the apparatus.

For example, by setting a film thickness of the memory chip in a range of 5 to 15 µm, the memory chip has a film thickness equal to $\frac{1}{10}$ to $\frac{1}{80}$ of a film thickness of the normal memory chip. Therefore, it is possible to reduce a probability of occurrence of the soft errors up to $\frac{1}{10}$ or less of the probability of the normal memory chip.

3. Embodiment 3

(A) Configuration of Device

Figure 31:
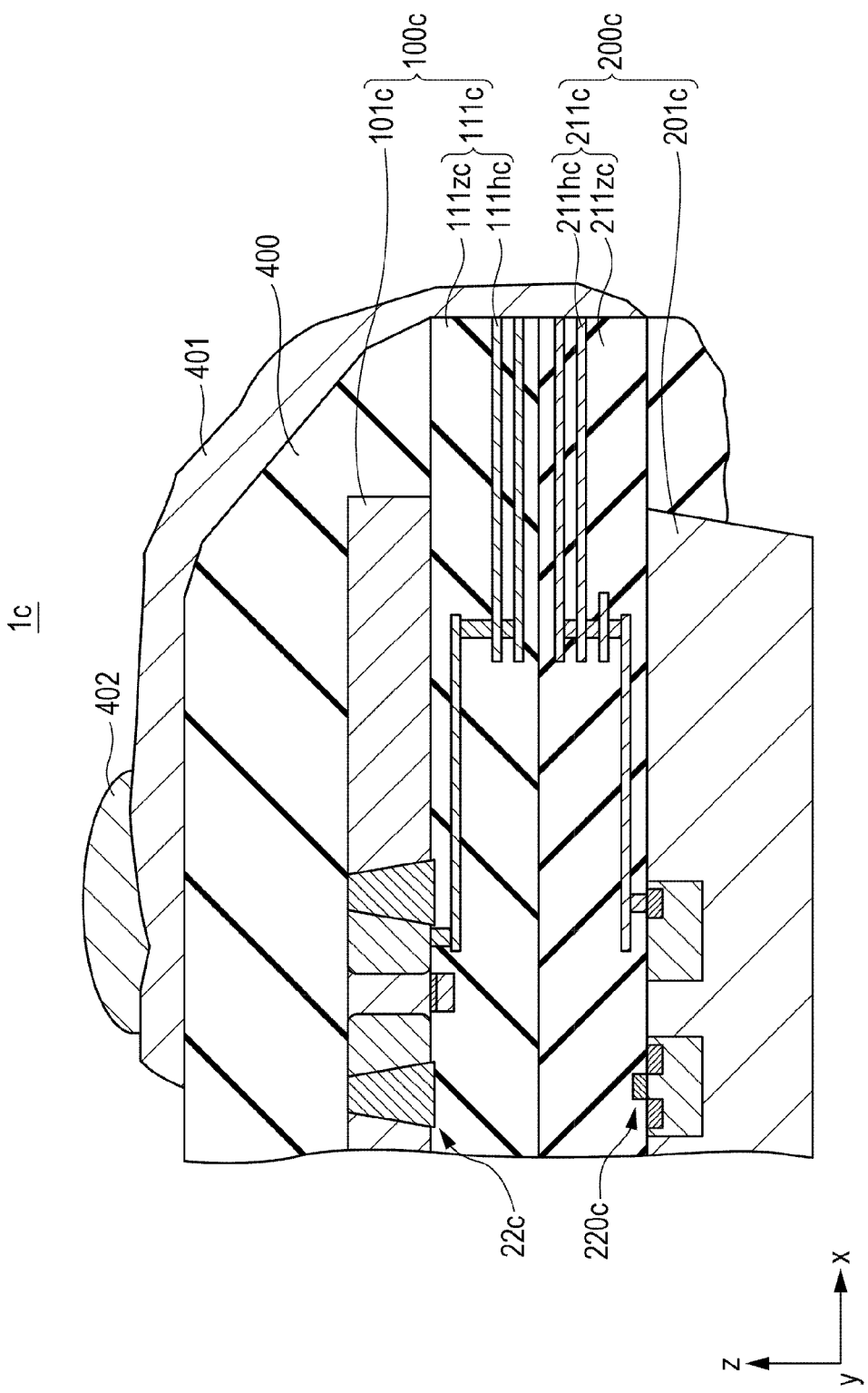
FIG. 31 is a diagram illustrating principal sections of a semiconductor device according to embodiment 3 of the disclosure.

FIG. 31 is a diagram illustrating principal sections of a semiconductor device according to embodiment 3 of the disclosure. FIG. 31 shows, similarly to FIG. 21, a cross-sectional surface of the end portion of the semiconductor device.

As shown in FIG. 31, the semiconductor device 1c includes a first semiconductor chip 100c, a second semiconductor chip 200c, an insulation film 400, a conductive layer 401, and a bump 402.

As shown in FIG. 31, the semiconductor device 1c has a "3-dimensional multilayer chip structure", and the first semiconductor chip 100c and the second semiconductor chip 200c are bonded to each other. In the embodiment, similarly to embodiment 2, respective wiring portions 111hc and 211hc of the first semiconductor chip 100c and the second semiconductor chip 200c are electrically connected through the conductive layer 401 at the side portions thereof. However, the configurations of the first semiconductor chip 100c and the second semiconductor chip 200c are different from those in embodiment 2. As described, the embodiment includes the same points as and different points from embodiment 2. Hence, a repeated description of the same parts is omitted.

(A-1) Regarding First Semiconductor Chip 100c

The first semiconductor chip 100c includes, as shown in FIG. 31, a semiconductor substrate 101c and a wiring layer 111c, where the wiring layer 111c is provided on the surface of the semiconductor substrate 101c.

In the first semiconductor chip 100c, similarly to embodiment 2, semiconductor elements 22c are provided on a side of the surface on which the wiring layer 111c is provided in the semiconductor substrate 101c.

Here, each semiconductor element 22c is formed to include, contrary to embodiment 2, for example, an MOS transistor. The embodiment is different from embodiment 2 in that the semiconductor elements 22c are formed by thinning a SOI (Silicon on Insulator) substrate such that the first semiconductor chip 100c functions as a high-speed device. For example, by setting the film thickness of the semiconductor layer to 0.05 µm or less, a fully-depleted (FD) SOI device can be formed. Further, by setting the film thickness of the semiconductor layer to 0.1 µm or less, a partially-depleted (PD) SOI device can be formed.

Otherwise, the first semiconductor chip 100c is formed to be the same as that of embodiment 2.

That is, as shown in FIG. 31, in the side portion of the wiring layer 111c, the wiring portions 111hc are formed to extend from the inside of the wiring layer 111c to the side portion thereof. These wiring portions 111hc are provided such that the side surfaces of the wiring portions 111hc are exposed on the sidewall surface of the wiring layer 111c.

(A-2) Regarding Second Semiconductor Chip 200c

The second semiconductor chip 200c includes, as shown in FIG. 31, a semiconductor substrate 201c and a wiring layer 211c, where the wiring layer 211c is provided on the surface of a semiconductor substrate 201c.

In the second semiconductor chip 200c, similarly to embodiment 2, semiconductor elements 220c are provided on a side of the surface on which the wiring layer 211c is provided in the semiconductor substrate 201c.

The semiconductor elements 220c are formed, similarly to embodiment 2, so as to constitute an arithmetic processing circuit in the second semiconductor chip 200c.

Otherwise, the second semiconductor chip 200c is formed to be the same as that of embodiment 2.

That is, as shown in FIG. 31, in the side portion of the wiring layer 211c, the wiring portions 211hc are formed to extend from the inside of the wiring layer 211c to the side portion thereof. These wiring portions 211hc are provided such that the side surfaces of the wiring portions 211hc are exposed on the sidewall surface of the wiring layer 211c.

(A-3) Others

The insulation film 400, the conductive layer 401, and the bump 402, which are members other than the first semiconductor chip 100c and the second semiconductor chip 200c, are provided to be the same as that of embodiment 2.

(B) Manufacturing Method

Hereinafter, principal sections of a method of manufacturing the semiconductor device 1c will be described.

FIGS. 32A to 41 are diagrams illustrating a method of manufacturing a semiconductor device according to embodiment 3 of the disclosure.

Here, FIGS. 32A to 33G sequentially show processes of manufacturing the semiconductor device 1c.

FIG. 34 to FIG. 38 are diagrams illustrating principal sections of the semiconductor device which are formed by the processes shown in FIGS. 32A to 33G, and show, similarly to FIG. 31, the cross-sectional surface of the end portion of the semiconductor device 1c.

Figure 32A:
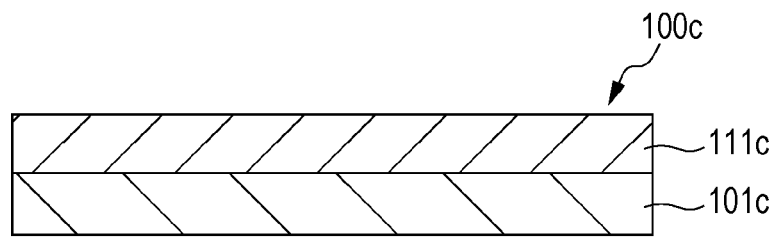
FIGS. 32A to 32D are diagrams illustrating the method of manufacturing the semiconductor device according to embodiment 3 of the disclosure.
Figure 33E:
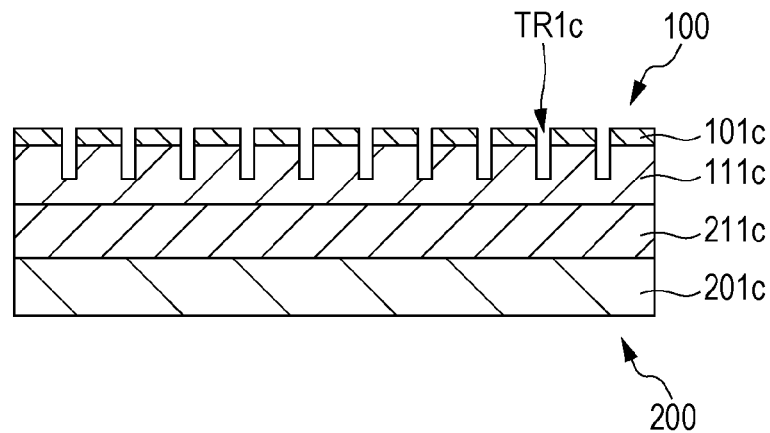
FIGS. 33E to 33G are diagrams illustrating the method of manufacturing the semiconductor device according to embodiment 3 of the disclosure.
Figure 33F:
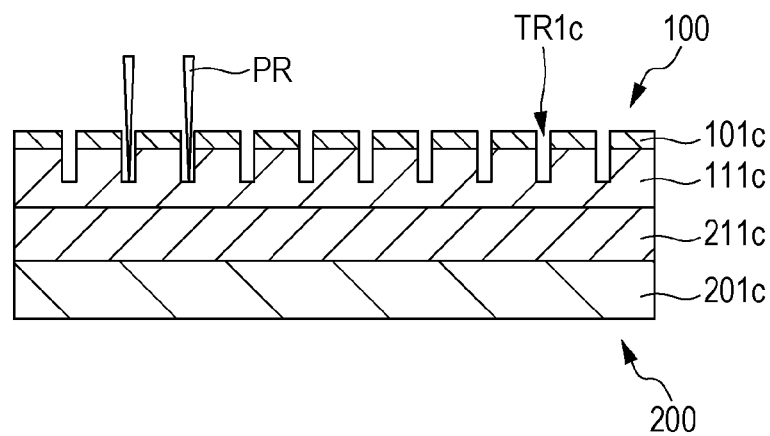
Figure 33G:
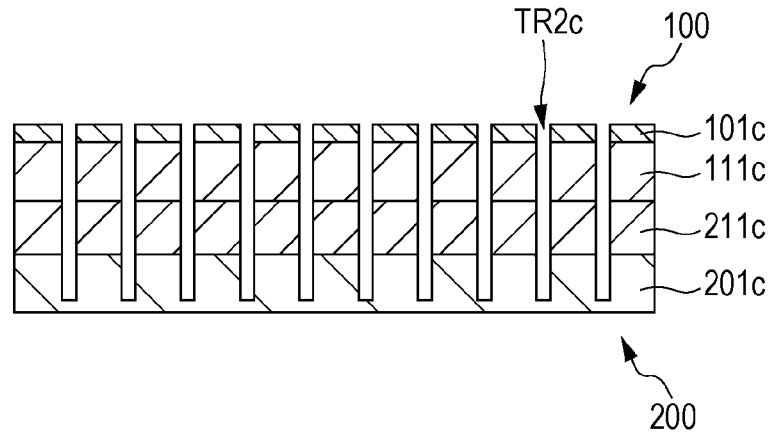
Figure 34:
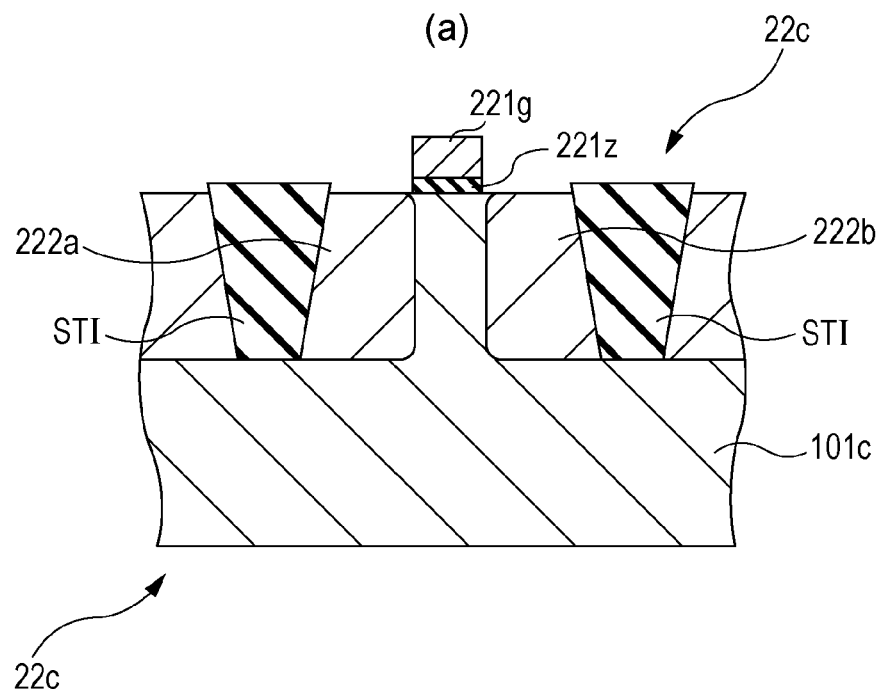
FIG. 34 is a diagram illustrating the method of manufacturing the semiconductor device according to embodiment 3 of the disclosure.
Figure 35:
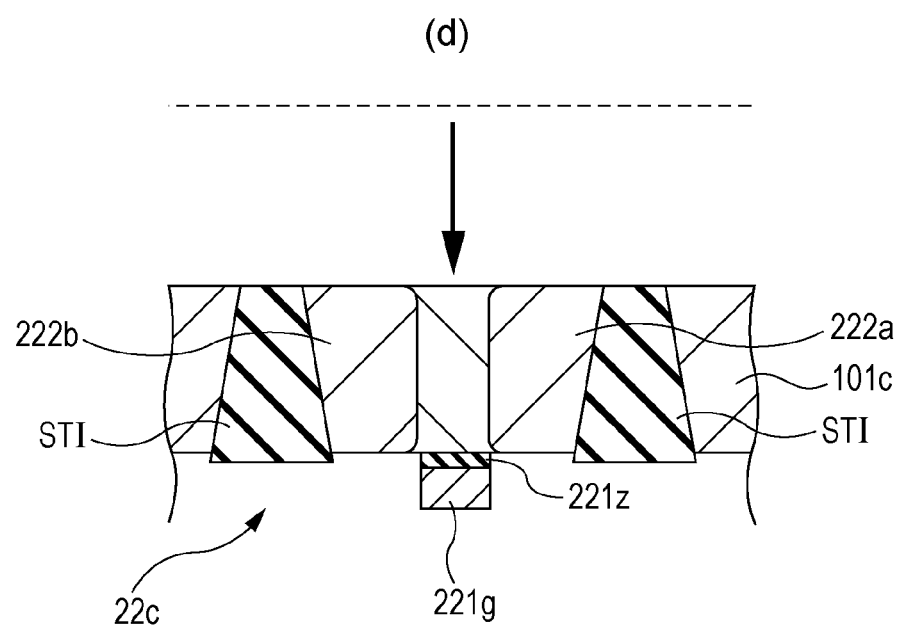
FIG. 35 is a diagram illustrating the method of manufacturing the semiconductor device according to embodiment 3 of the disclosure.
Figure 36:
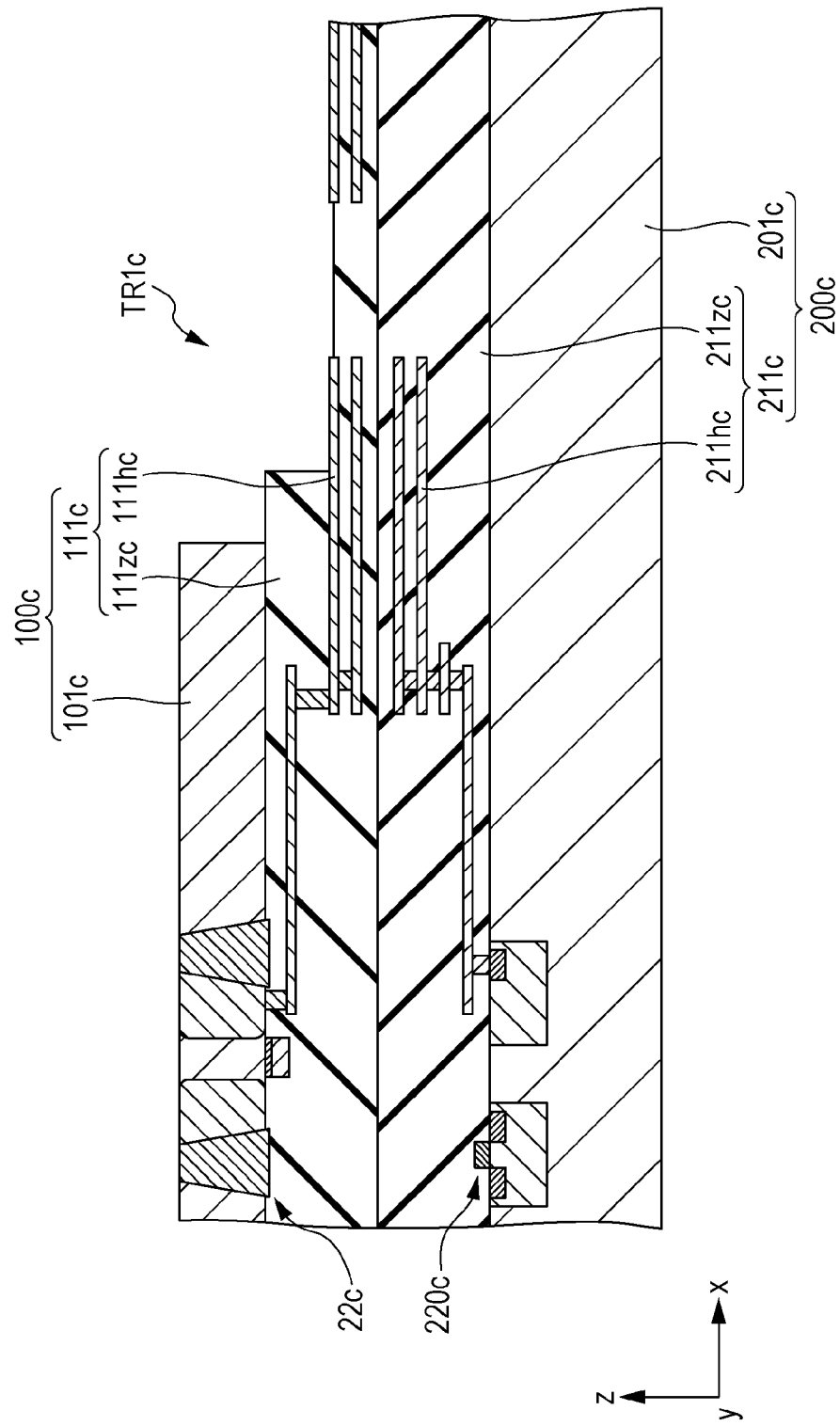
FIG. 36 is a diagram illustrating the method of manufacturing the semiconductor device according to embodiment 3 of the disclosure.
Figure 37:
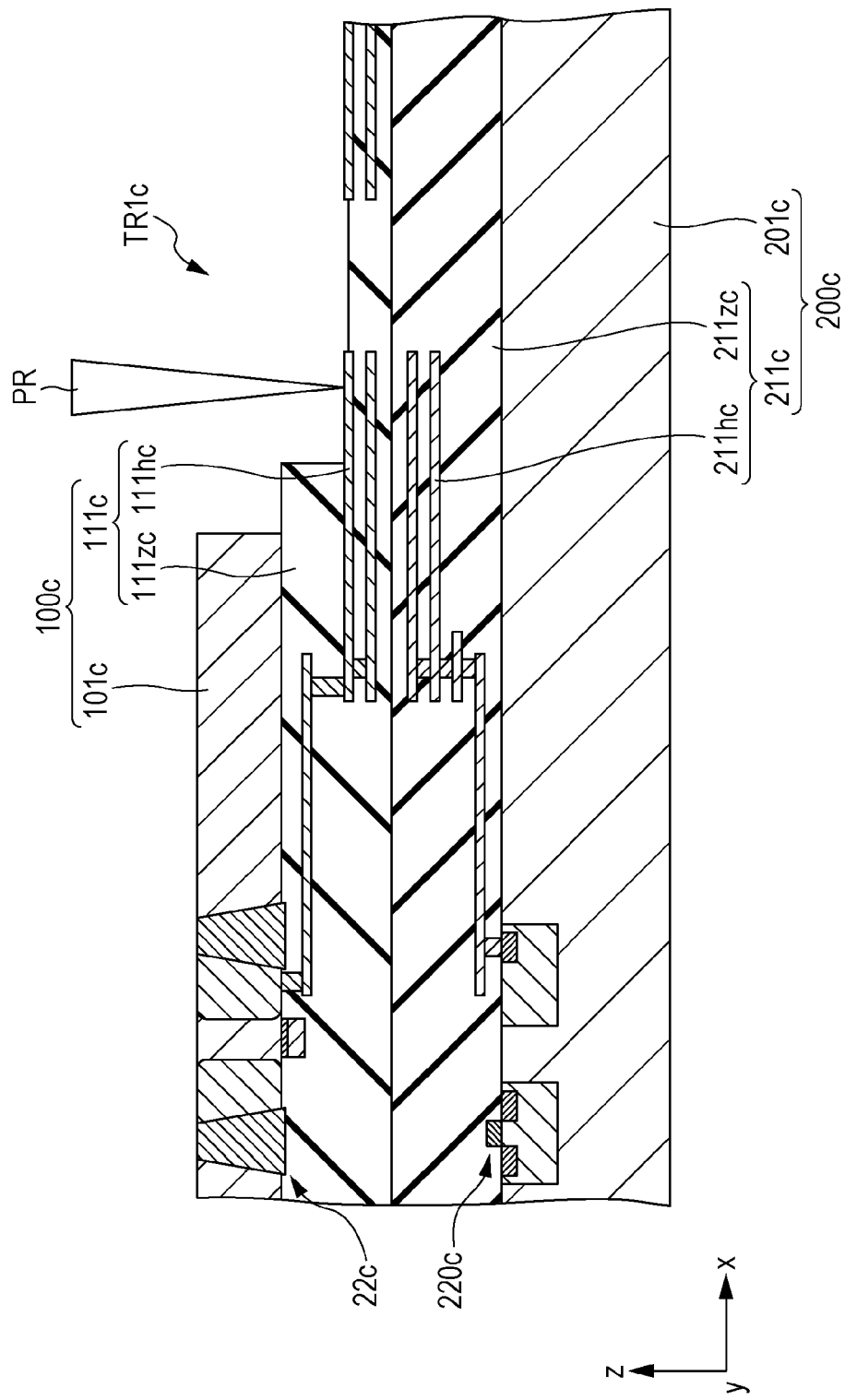
FIG. 37 is a diagram illustrating the method of manufacturing the semiconductor device according to embodiment 3 of the disclosure.
Figure 38:
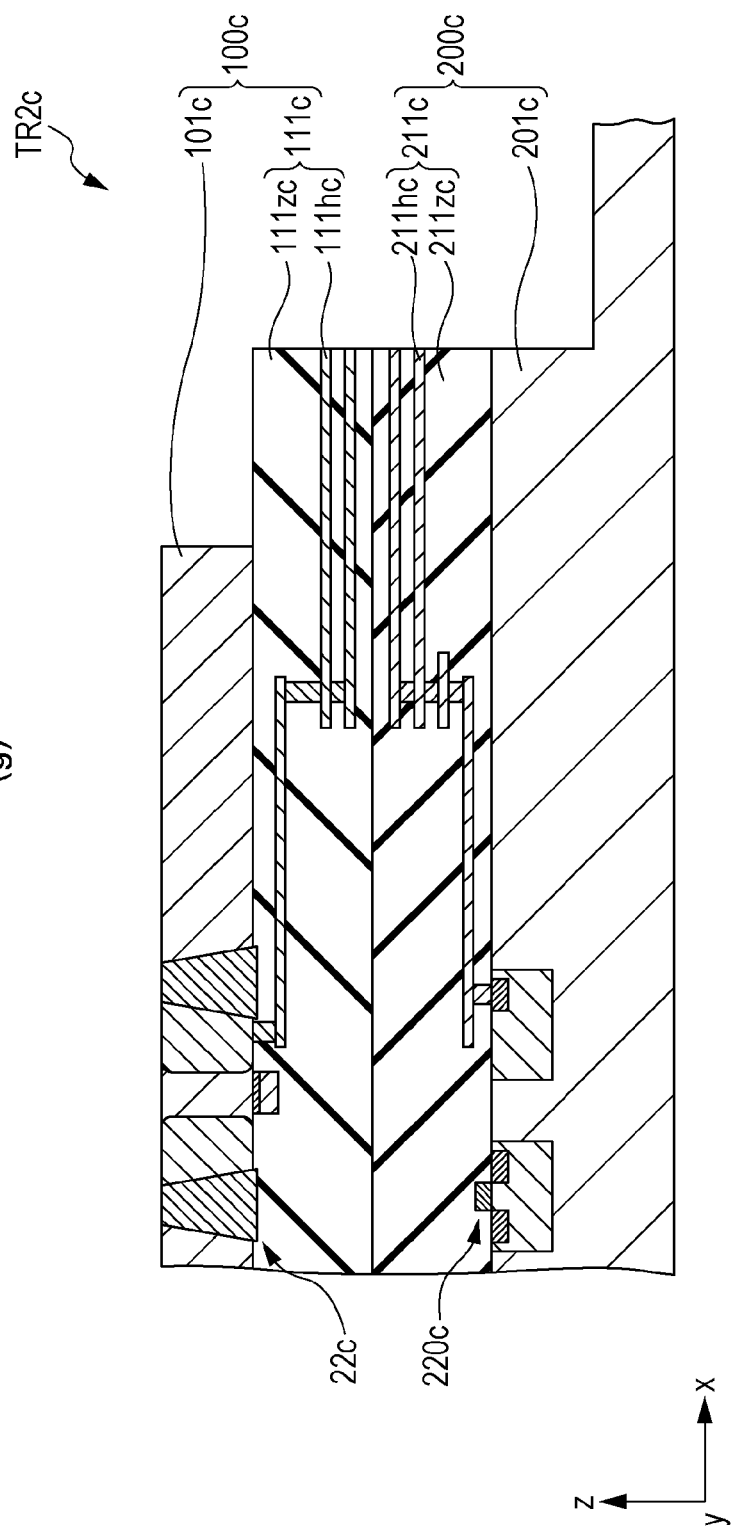
FIG. 38 is a diagram illustrating the method of manufacturing the semiconductor device according to embodiment 3 of the disclosure.

Specifically, FIG. 34 shows a part of the diagram shown in FIG. 32A in an enlarged manner. FIG. 35 shows a part of the diagram shown in FIG. 32D in an enlarged manner. FIG. 36 shows a part of the diagram shown in FIG. 33E in an enlarged manner. FIG. 37 shows a part of the diagram shown in FIG. 33F in an enlarged manner. FIG. 38 shows a part of the diagram shown in FIG. 33G in an enlarged manner.

Figure 39:
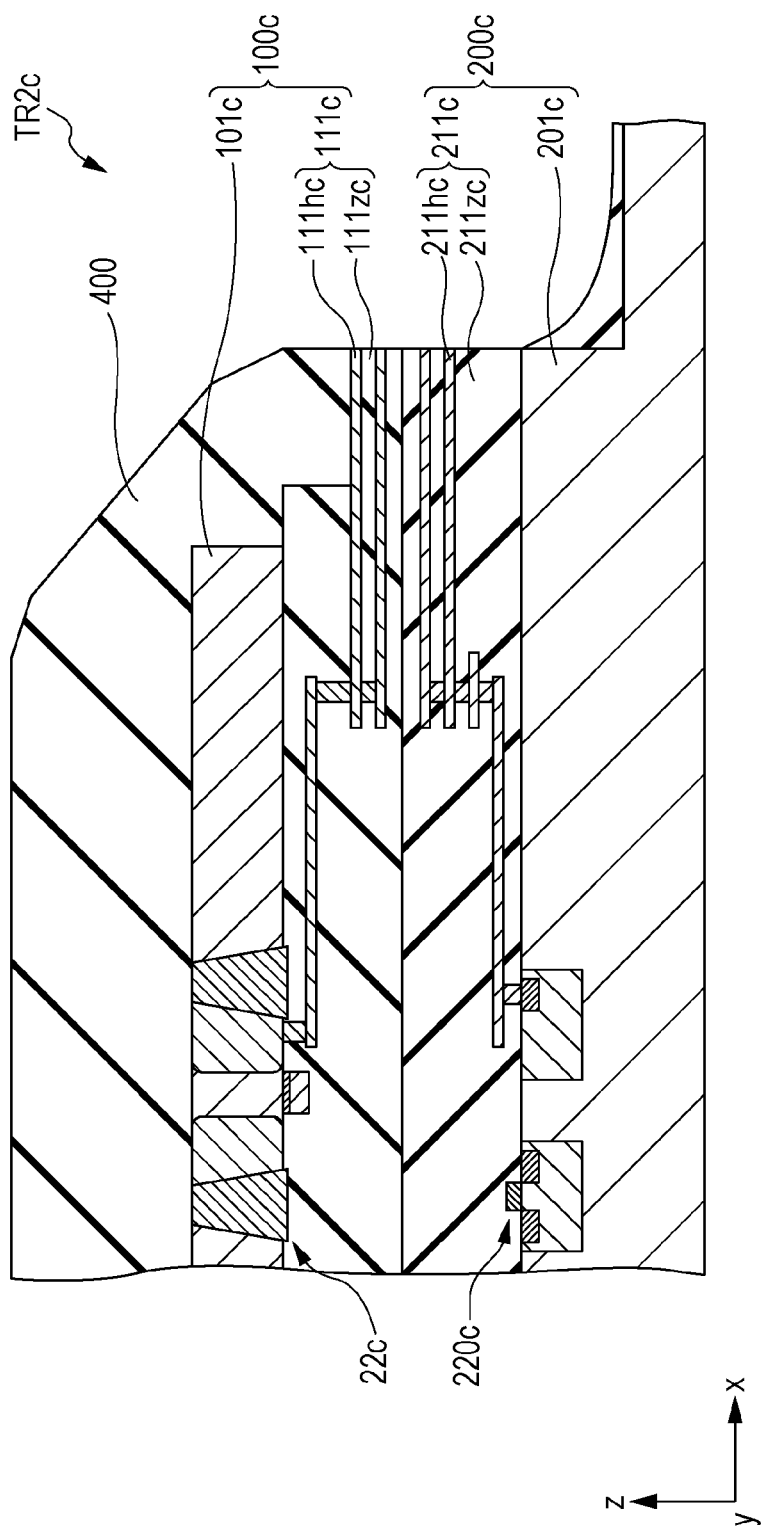
FIG. 39 is a diagram illustrating the method of manufacturing the semiconductor device according to embodiment 3 of the disclosure.
Figure 40:
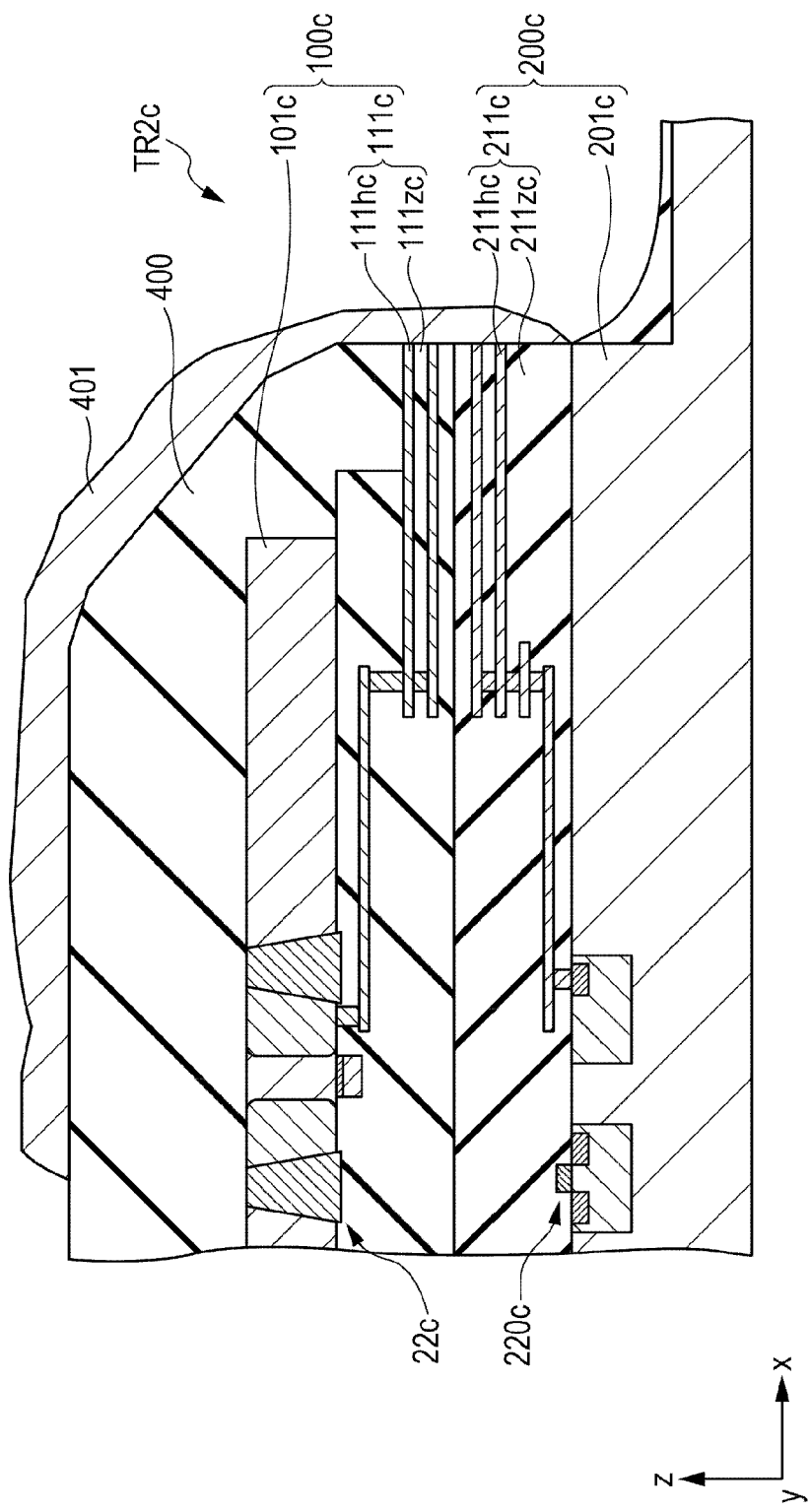
FIG. 40 is a diagram illustrating the method of manufacturing the semiconductor device according to embodiment 3 of the disclosure.
Figure 41:
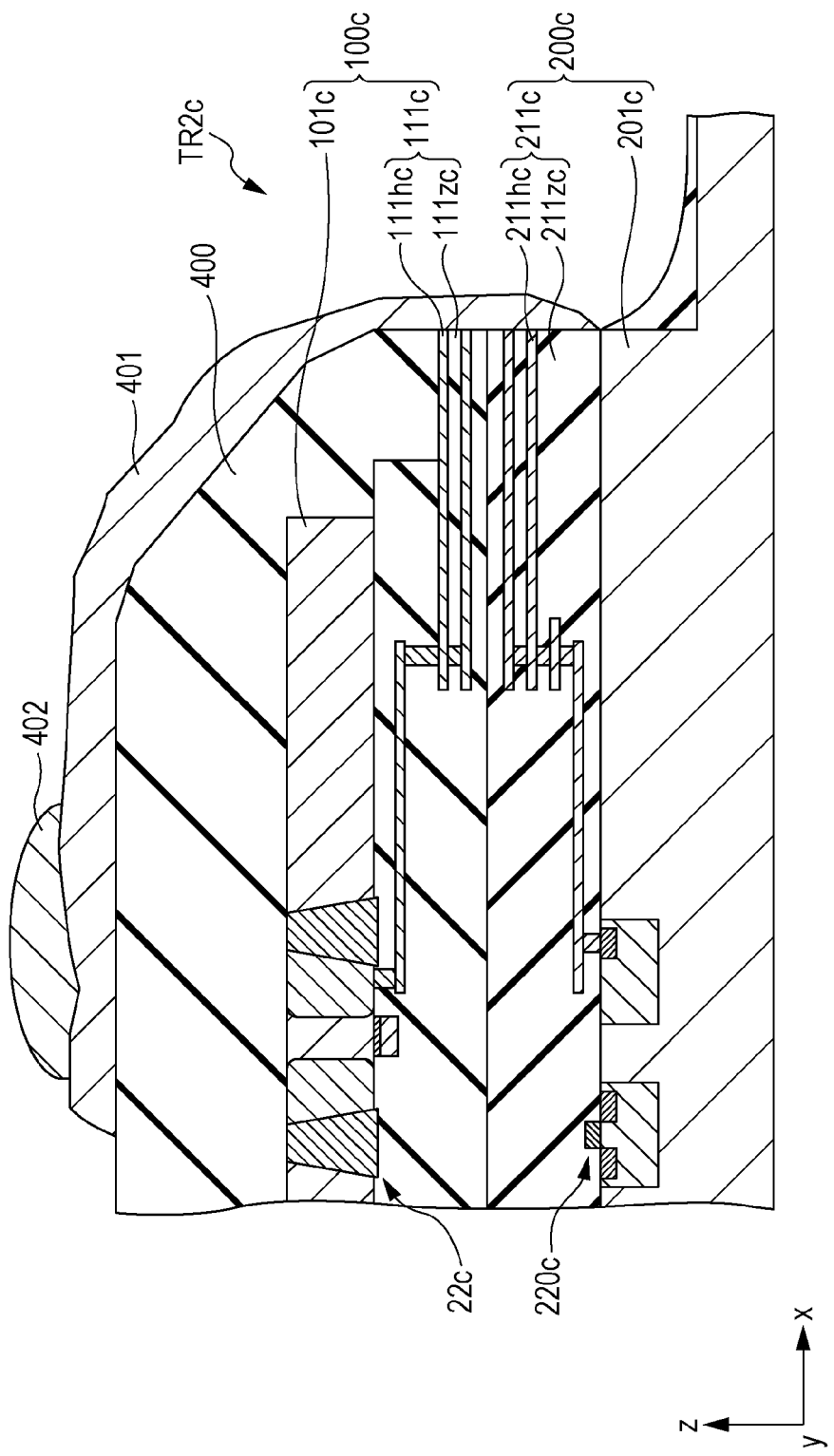
FIG. 41 is a diagram illustrating the method of manufacturing the semiconductor device according to embodiment 3 of the disclosure.

In addition, FIGS. 39 to 41 show processes of manufacturing the semiconductor device subsequent to the processes of FIGS. 32A to 33G. FIGS. 39 to 41 show, similarly to FIG. 31, a cross-sectional surface of the end portion of the semiconductor device 1c.

In the embodiment, as shown in FIGS. 32A to 41, a wafer, in which a plurality of semiconductor devices 1c are provided, is divided through the processes of (a) to (j), and the semiconductor device 1c shown in FIG. 31 and the like is manufactured.

The detailed description of the processes will be described.

(a) Formation of Wiring Layer 111c of First Semiconductor Chip 100c

First, as shown in FIG. 32A, the wiring layer 111c of the first semiconductor chip 100c is formed.

Although not shown in FIG. 32A, for example, the SOI substrate is provided as the semiconductor substrate 101c. In addition, the semiconductor elements 22c are formed on the semiconductor substrate 101c as the SOI substrate (refer to FIG. 31 and the like).

For example, as shown in FIG. 34, the MOS transistor is formed as the semiconductor element 22c.

Specifically, an element isolation portion STI is formed on the upper layer portion of the semiconductor substrate 101c (a portion of the silicon layer of the SOI substrate). The element isolation portion STI is formed by forming a trench on the upper layer portion of the semiconductor substrate 101c and subsequently embedding an insulation material inside the trench. For example, $SiO_2$ and $Si_3N_4$ may be embedded for the formation. That is, the element isolation portion STI is formed in a STI (Shallow Trench Isolation) structure.

Then, the semiconductor element 22c is provided in the area isolated by the element isolation portion STI. Here, a gate insulation film 221z is formed on the upper surface of the semiconductor substrate 101c, and subsequently a gate electrode 221g is provided on the gate insulation film 221z. In addition, by using the gate electrode 221g as a self-alignment mask, impurities are implanted as ions into the semiconductor substrate 101c, whereby source/drain areas 222a and 222b are formed.

Thereafter, similarly to embodiment 2, the wiring layer 111c is formed to cover one surface of the semiconductor substrate 101c.

(b) Formation of Wiring Layer 211c of Second Semiconductor Chip 200c

Figure 32B:
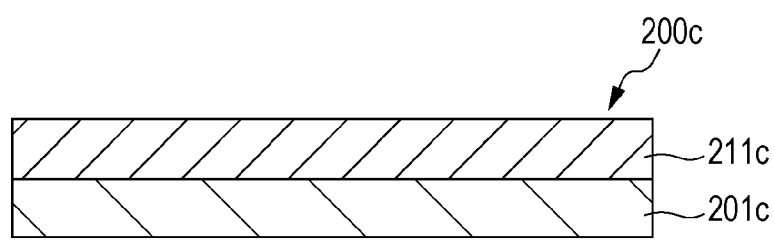

Next, as shown in FIG. 32B, the wiring layer 211c of the second semiconductor chip 200c is formed.

Although not shown in FIG. 32B, the semiconductor elements 220c are formed on the semiconductor substrate 201c (refer to FIG. 31 and the like). In addition, the wiring layer 211c is formed to cover one surface of the semiconductor substrate 201c.

(c) Bonding of Semiconductor Substrates 101c and 201c

Figure 32C:
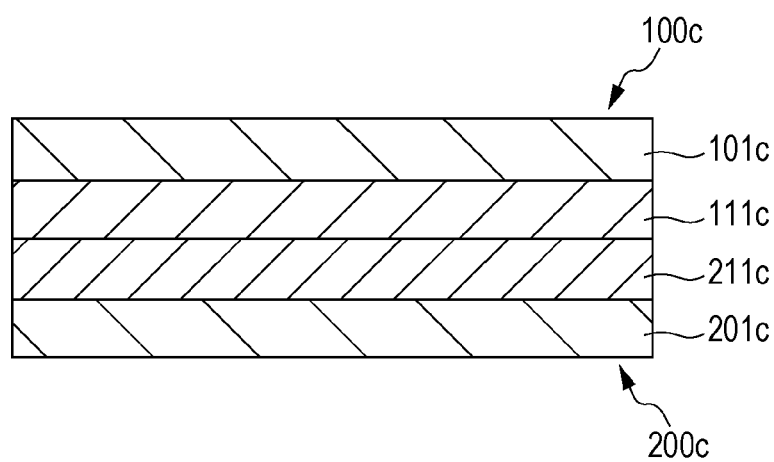

Next, as shown in FIG. 32C, two semiconductor substrates 101c and 201c are opposed and bonded to each other.

Here, the wiring layers 111c and 211c of the semiconductor substrates 101c and 201c are opposed to each other, and the opposed surfaces are bonded to each other. For example, both are bonded to each other by an adhesive.

(d) Thinning of Semiconductor Substrate 101c

Figure 32D:
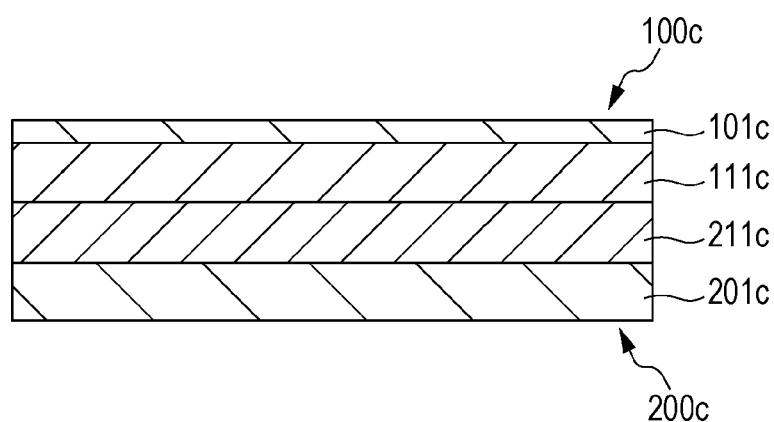

Next, as shown in FIG. 32D, the semiconductor substrate 101c is thinned.

Here, by polishing the surface of the semiconductor substrate 101c opposite to the surface thereof on which the wiring layer 111c is provided, a thinning process is performed on the semiconductor substrate 101c.

Thereby, for example, the semiconductor substrate 101c is thinned such that the thickness thereof is 2 to 10 µm.

Specifically, as shown in FIG. 35, the element isolation portion STI is used as a polishing stopper, and the thinning process is terminated.

(e) Formation of Groove TR1

Next, as shown in FIG. 33E, an etching process is performed on the semiconductor substrate 101c and the wiring layer 111c, thereby forming grooves TR1c.

Here, the etching process is performed on the semiconductor substrate 101c so as to make holes which penetrate the semiconductor substrate 101c.

In addition, the etching process is performed on the wiring layer 111c so as to form recesses which do not penetrate the wiring layer 111c.

Specifically, as shown in FIG. 36, the etching process is performed on the scribe areas of the plurality of semiconductor chips 100c so as to expose the surface of the pad electrode PAD1 connected to the wiring portions 111hc, thereby providing the grooves TR1c.

(f) Test of First Semiconductor Chip 100c

Next, as shown in FIG. 33F, the first semiconductor chip 100c is tested.

Here, a pair of electrometric probers PR is inserted in the groove TR1c which is formed by the process, thereby testing the first semiconductor chip 100c. That is, in the state of the wafer in which the plurality of first semiconductor chips 100c are provided, whether or not each first semiconductor chip 100c is able to exhibit the prescribed characteristics of a high-speed device.

Specifically, as shown in FIG. 37, the probers PR come into contact with the surface of the pad electrode PAD1 which is exposed in the scribe areas, thereby measuring the electrical characteristics of the first semiconductor chip 100c. In addition, on the basis of the measurement result, in the test of the first semiconductor chip 100c, whether the chip has passed the test is determined. If the test is passed, the procedure advances to the following process. In contrast, if the test is failed, for example, manufacturing is stopped.

(g) Formation of Groove TR2c

Next, as shown in FIG. 33G, an etching process is performed on the semiconductor substrate 201c and the wiring layer 211c, thereby forming grooves TR2c.

Here, the dicing is further performed on the portions of the grooves TR1c which are formed between the plurality of first semiconductor chips 100c through the above-mentioned process, whereby a part of the semiconductor substrate 201c is made to remain.

Specifically, as shown in FIG. 38, the dicing is performed such that, in the respective wiring layers 111c and 211c of the first semiconductor chip 100c and the second semiconductor chip 200c, the side surfaces of the wiring portions 111hc and 211hc are exposed on the sidewall surface, thereby forming the grooves TR2c.

Thereby, the semiconductor device 1c, which is formed by bonding the first semiconductor chip 100c and the second semiconductor chip 200c, is combined with a part of the semiconductor substrate 201c.

Furthermore, the pad electrode PAD1, which is used in the test, is also removed by the polishing in the dicing process.

(h) Formation of Insulation Film 400

Next, as shown in FIG. 39, the insulation film 400 is formed.

Here, the area from the side portion to the upper surface of the semiconductor substrate 101c, which constitutes the first semiconductor chip 100c, and the side portion of the semiconductor substrate 201c, which constitutes the second semiconductor chip 200c, are covered by, for example, resin such as epoxy resin, thereby forming an insulation film 400.

In this case, the insulation film 400 is formed such that the side surfaces of the wiring portions 111hc and 211hc are still exposed on the sidewall surfaces of the respective wiring layers 111c and 211c. For example, by using a printing technique of a printed wiring substrate, the insulation film 400 is formed.

(i) Formation of Conductive Layer 401

Next, as shown in FIG. 40, the conductive layer 401 is formed.

Here, the conductive layer 401 is formed to cover both side portions of the wiring layer 111c, which constitutes the first semiconductor chip 100c, and the wiring layer 211c which constitutes the second semiconductor chip 200c.

That is, the conductive layer 401 is formed such that the conductive layer 401 electrically interconnects the wiring portions 111hc and 211hc which is exposed at the side portions of the wiring layers 111c and 211c.

In addition, with such a configuration, the conductive layer 401 is formed to extend from the side portion of the wiring layer 111c, which constitutes the first semiconductor chip 100c, to the upper surface, with the insulation film 400 interposed therebetween. As described, the conductive layer 401 is formed to function as a connection pad on the upper surface of the wiring layer 111c.

(j) Formation of Bump 402

Next, as shown in FIG. 41, the bump 402 is formed.

Here, the bump 402 is formed on the surface of the semiconductor substrate 101c opposite to the surface thereof on which the wiring layer 111c is provided, with the insulation film 400 and the conductive layer 401 interposed therebetween. That is, the bump 402 is formed on the portion, in which the conductive layer 401 functions as a connection pad, on the upper surface of the wiring layer 111c.

(k) Separation into Semiconductor Device 1c

Next, as shown in FIG. 31, the semiconductor devices 1c are separated.

Here, the semiconductor substrate 201c, which connects the plurality of semiconductor device 1c, is separated into pieces each of which corresponds to each semiconductor device 1c.

(C) Summary

As described above, in the embodiment, the semiconductor device 1c as a semiconductor device has the first semiconductor chip 100c and the second semiconductor chip 200c which is stacked on the first semiconductor chip 100c. The first semiconductor chip 100c includes the wiring portions (first wiring portions) 111hc of which the side surfaces are exposed at the side portion thereof. Further, the second semiconductor chip 200c includes the wiring portions (second wiring portions) 211hc of which the side surfaces are exposed at the side portion thereof. In addition, the side surfaces of the respective wiring portions 111hc and 211hc, which are exposed at the side portions of the first semiconductor chip 100c and the second semiconductor chip 200c, are covered by the conductive layer 401. That is, the conductive layer 401 electrically interconnects the wiring portions 111hc and 211hc (refer to FIG. 31).

As described above, in the embodiment, similarly to embodiment 1, the plurality of semiconductor chips 100c and 200c are electrically connected at the side wall portion, and thus it is not necessary to provide the pad electrodes on the surface of the semiconductor substrate in order to electrically connect both of them. Accordingly, in the embodiment, it is possible to reduce the occupied area of the apparatus, and thus it is possible to easily achieve miniaturization.

4. Embodiment 4

(A) Configuration of Device

Figure 42:
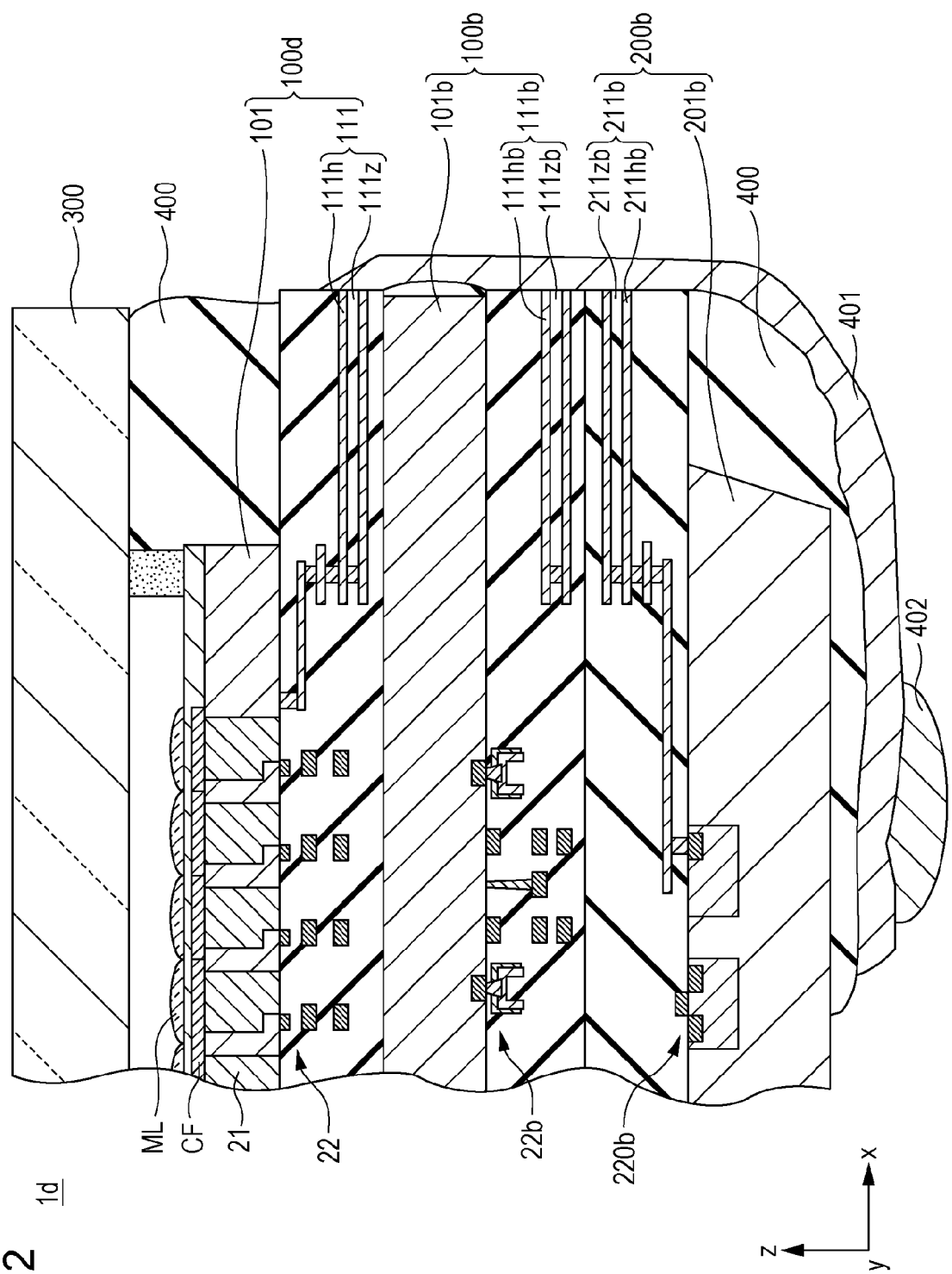
FIG. 42 is a diagram illustrating principal sections of a semiconductor device according to embodiment 4 of the disclosure.

FIG. 42 is a diagram illustrating principal sections of a semiconductor device according to embodiment 4 of the disclosure. FIG. 42 shows, similarly to FIG. 21, a cross-sectional surface of the end portion of the semiconductor device.

As shown in FIG. 42, the semiconductor device 1d includes, similarly to embodiment 2, a first semiconductor chip 100b, a second semiconductor chip 200b, an insulation film 400, a conductive layer 401, and a bump 402. Otherwise, the semiconductor device 1d further has, contrary to embodiment 1, a third semiconductor chip 100d and a glass substrate 300d. In addition, embodiment 4 is different from embodiment 2 in positions at which the insulation film 400, the conductive layer 401, and the bump 402 are respectively provided. As described, the embodiment includes the same points as and different points from embodiment 2. Hence, a repeated description of the same parts is omitted.

As shown in FIG. 42, the semiconductor device 1d has a "3-dimensional multilayer chip structure", and similarly to embodiment 2, the first semiconductor chip 100b and the second semiconductor chip 200b are bonded to each other.

Otherwise, the third semiconductor chip 100d is bonded to a surface of the first semiconductor chip 100b opposite to the surface thereof to which the second semiconductor chip 200b is bonded.

The third semiconductor chip 100d is configured to be the same as the first semiconductor chip 100 according to embodiment 1. That is, the third semiconductor chip 100d is a "backside illuminated type" image sensor chip, and includes the semiconductor substrate 101 and the wiring layer 111, where the wiring layer 111 is provided on the surface of a semiconductor substrate 101.

In addition, as shown in FIG. 42, the glass substrate 300 is bonded to the surface of the third semiconductor chip 100d opposite to the surface thereof opposed to the first semiconductor chip 100b.

The insulation film 400 is provided, as shown in FIG. 42, so as to cover the side portion of the semiconductor substrate 101b constituting the first semiconductor chip 100b. Further, the insulation film 400 is provided to cover the area from the side portion the lower surface of the semiconductor substrate 201b constituting the second semiconductor chip 200b. In addition, the insulation film 400 is provided to cover the side portion of the semiconductor substrate 101 constituting the third semiconductor chip 100d.

The insulation film 400 is provided, as shown in FIG. 42, so as to cover the side portion of the wiring layer 111b constituting the first semiconductor chip 100b, similarly to embodiment 2. Further, the conductive layer 401 is also formed to cover the side portion of the wiring layer 211b constituting the second semiconductor chip 200b. Furthermore, in the embodiment, the conductive layer 401 is also formed to cover the side portion of the wiring layer 111 constituting the third semiconductor chip 100d.

Specifically, as shown in FIG. 42, in the respective wiring layers 111b, 211b, and 111 of the first semiconductor chip 100b, the second semiconductor chip 200b, and the third semiconductor chip 100d, the side surfaces of the wiring portions 111hb, 211hb, and 111h are exposed on the sidewall surface. The conductive layer 401 integrally covers the exposed side surfaces of the wiring portions 111h, 211h, and 111 so as to electrically connect wiring portions 111h, 211h, and 111 to each other.

Further, as shown in FIG. 42, the conductive layer 401 is formed to extend from the side portion to the upper surface of the wiring layer 211b constituting the second semiconductor chip 200b with the insulation film 400 interposed therebetween. In addition, in the semiconductor substrate 201b constituting the second semiconductor chip 200b, a bump 402 is provided on the surface opposite to the surface, on which the wiring layer 211b is provided, with the insulation film 400 and the conductive layer 401 interposed therebetween.

Furthermore, in the embodiment, the first semiconductor chip 100b functions as a memory chip for storing data signals which are output from the third semiconductor chip 100d. Further, the second semiconductor chip 200b functions, similarly to the second semiconductor chip 200 of embodiment 1, as a signal processing logic chip for processing data signals which are output from the third semiconductor chip 100d.

(B) Summary

As described above, in the embodiment, the semiconductor device 1d as a semiconductor device has not only the first semiconductor chip 100b and the second semiconductor chip 200b but also the third semiconductor chip 100d which is stacked on the first semiconductor chip 100b. The third semiconductor chip 100d includes the wiring portions 111h of which the side surfaces are exposed at the side portion thereof. In addition, in the respective wiring portions 111hb, 211hb, and 111h of the respective semiconductor chips 100b, 200b, and 100d, the side surfaces thereof, which are exposed at the side portions of the chips, are covered by the conductive layer 401. That is, the conductive layer 401 electrically interconnects the wiring portions (refer to FIG. 42).

As described above, in the embodiment, similarly to embodiment 2, the plurality of semiconductor chips 100b, 200b, and 100d are electrically connected at the side wall portion, and thus it is not necessary to provide the pad electrodes on the surface of the semiconductor substrate in order to electrically connect the respective chips. Accordingly, in the embodiment, it is possible to reduce the occupied area of the apparatus, and thus it is possible to easily achieve miniaturization.

5. Others

In the application of the disclosure, the disclosure is not limited to the above-mentioned embodiments, and may employ various modified examples.

In the above descriptions of the embodiments, when the semiconductor device is the solid-state imaging device, the solid-state imaging device is applied to a camera. However, the disclosure is not limited to this. Similarly to a scanner or a copier, the disclosure may be applied to other electronic apparatuses each having the solid-state imaging device.

Further, in the above descriptions of the embodiments, two or three semiconductor chips are stacked. However, the disclosure is not limited to this. The disclosure may be applied to a case where four or more semiconductor chips are stacked.

Otherwise, the respective embodiments may be appropriately combined.

Furthermore, in the embodiments, the solid-state imaging device 1, the semiconductor devices 1b, 1c, and 1d correspond to the semiconductor device of the disclosure. Further, in the embodiments, the photodiode 21 corresponds to the photoelectric conversion portion of the disclosure. Further, in the embodiments, the first semiconductor chips 100, 100b, and 100c and the third semiconductor chip 100d correspond to the first semiconductor chip of the disclosure. Further, in the embodiments, the second semiconductor chips 200, 200b, and 200c correspond to the second semiconductor chip of the disclosure. Further, in the embodiments, the wiring layers 111, 111b, 111c, and 111d correspond to the first wiring layer of the disclosure. Further, in the embodiments, the wiring portions 111h, 111hb, 111hc, and 111hd correspond to the first wiring portion of the disclosure. Further, in the embodiments, the wiring layers 211, 211b, and 211c correspond to the second wiring layer of the disclosure. Further, in the embodiments, the wiring portions 211h, 211hb, and 211hc correspond to the second wiring portion of the disclosure. Further, in the embodiments, the conductive layer 401 corresponds to the conductive layer of the disclosure. Further, in the embodiments, the semiconductor substrates 101, 101b, and 101c correspond to the first semiconductor substrate of the disclosure. Further, in the embodiments, the semiconductor substrates 201, 201b, and 201c correspond to the second semiconductor substrate of the disclosure. Further, in the embodiments, the pad electrode PAD1 corresponds to the first pad electrode of the disclosure. Further, in the embodiments, the pad electrode PAD2 corresponds to the second pad electrode of the disclosure. Further, in embodiment 1 mentioned above, the process shown in FIG. 9A or the like corresponds to the first wiring layer formation process of the disclosure. Further, in embodiment 1 mentioned above, the process shown in FIG. 9B or the like corresponds to the second wiring layer formation process of the disclosure. Further, in embodiment 1 mentioned above, the process shown in FIG. 9C or the like corresponds to the chip stacking process of the disclosure. Further, in embodiment 1 mentioned above, the process shown in FIG. 9D or the like corresponds to the thinning process of the disclosure. Further, in embodiment 1 mentioned above, the process shown in FIG. 10E or the like corresponds to the first pad surface exposure process of the disclosure. Further, in embodiment 1 mentioned above, the process shown in FIG. 10F corresponds to the first chip test process of the disclosure. Further, in embodiment 1 mentioned above, the process shown in FIG. 10G or the like corresponds to the substrate provision process of the disclosure. Further, in embodiment 1 mentioned above, the process shown in FIG. 11H or the like corresponds to the second pad surface exposure process of the disclosure. Further, in embodiment 1 mentioned above, the process shown in FIG. 11I or the like corresponds to the second chip test process of the disclosure. Further, in embodiment 1 mentioned above, the process shown in FIG. 11J or the like corresponds to the side surface exposure process of the disclosure. Further, in embodiment 1 mentioned above, the process shown in FIG. 19 or the like corresponds to the conductive layer formation process of the disclosure.

The present application contains subject matter related to that disclosed in Japanese Priority Patent Application JP 2010-196639 filed in the Japan Patent Office on Sep. 2, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a first semiconductor chip; and
a second semiconductor chip that is stacked on the first semiconductor chip,
wherein,
the first semiconductor chip includes a first semiconductor substrate on which is stacked a first insulating layer with a first wiring portion therein of which first wiring portion a side surface is exposed at a side portion of the first semiconductor chip,
the second semiconductor chip includes a second semiconductor substrate on which is stacked a second insulating layer with a second wiring portion therein of which second wiring portion a side surface is exposed at a side portion of the second semiconductor chip,
the first and second insulating layers are opposed to each other, and opposed surfaces of the first semiconductor chip and the second semiconductor chip are bonded to each other;
the respective side surfaces of the first wiring portion and the second wiring portion, which are exposed at the side portions of the first semiconductor chip and the second semiconductor chip, are covered by a conductive layer, and the first wiring portion and the second wiring portion are electrically connected to each other through the conductive layer, and
the first semiconductor substrate is thinner than the second semiconductor substrate.

2. The semiconductor device according to claim 1, wherein:
the first semiconductor chip is thinner than the second semiconductor chip.

3. The semiconductor device according to claim 2, wherein:
the first semiconductor chip includes pixels each of which includes a photoelectric conversion portion, and
for each pixel, the photoelectric conversion portion is configured to receive incident light which is incident from a surface of the first semiconductor chip on a side opposite to a surface thereof on which the second semiconductor chip is stacked.

4. The semiconductor device according to claim 2, wherein the first semiconductor chip includes a semiconductor memory element.

5. The semiconductor device according to claim 2, wherein the first semiconductor chip includes a semiconductor element which on a SOI (Silicon on Insulator) substrate.

6. The semiconductor device according to claim 3, wherein the second semiconductor chip includes a signal processing circuit.

7. A method of manufacturing a semiconductor device comprising:
forming a first semiconductor chip;
stacking a second semiconductor chip on the first semiconductor chip;
exposing a side surface of a first wiring portion, which is formed on the first semiconductor chip, and a side surface of a second wiring portion, which is formed on the second semiconductor chip, at a side portion of a stacked body in which the first semiconductor chip and the second semiconductor chip are stacked; and
electrically connecting the first wiring portion and the second wiring portion to each other by providing a conductive layer so as to cover the side surfaces of the first wiring portion and the second wiring portion which are exposed at side portions of the first semiconductor chip and the second semiconductor chip
wherein,
the first semiconductor chip includes a first insulation layer, with the first wiring layer therein, stacked on a first semiconductor substrate,
the second semiconductor chip includes a second insulation layer, with the second wiring layer therein, stacked on a second semiconductor substrate,
in the stacking of the second semiconductor chip on the first semiconductor chip, the first and second insulation layers are placed in opposition, and opposed surfaces of the first semiconductor chip and the second semiconductor chip are bonded to each other,
the forming of the first semiconductor chip further includes thinning the first semiconductor substrate, and
in the thinning of the first semiconductor substrate, the first semiconductor substrate is thinned after the second semiconductor chip is stacked and supported on the first semiconductor chip in the stacking of the second semiconductor chip.

8. The method of manufacturing the semiconductor device according to claim 7, further comprising:
exposing a surface of a first pad electrode which is formed so as to be electrically connected to the first wiring portion at the side portion of the first semiconductor chip; and
testing the first semiconductor chip by using the first pad electrode,
wherein,
the exposing of the surface of the first pad electrode and the testing of the first semiconductor chip are performed before the exposing of the side surfaces, and
when the side surfaces of the first wiring portion and the second wiring portion are exposed in the exposing of the side surfaces, the first pad electrode is removed.

9. The method of manufacturing the semiconductor device according to claim 8, further comprising:
exposing a surface of a second pad electrode which is formed so as to be electrically connected to the second wiring portion at the side portion of the second semiconductor chip; and
testing the second semiconductor chip by using the second pad electrode,
wherein,
the exposing of the surface of the second pad electrode and the testing of the second semiconductor chip are performed before the exposing of the side surfaces, and
when the side surfaces of the first wiring portion and the second wiring portion are exposed in the exposing of the side surfaces, the second pad electrode is removed.

10. The method of manufacturing the semiconductor device according to claim 9, further comprising providing a substrate such that the substrate is opposed to a surface of the first semiconductor chip opposite to a surface thereof on which the second semiconductor chip is stacked, wherein the providing of the substrate is performed between the testing of the first semiconductor chip and the exposing of the surface of the second pad electrode.

11. An electronic apparatus including a semiconductor device, the semiconductor device comprising:
a first semiconductor chip; and a second semiconductor chip that is stacked on the first semiconductor chip, wherein, the first semiconductor chip includes a first semiconductor substrate on which is stacked a first insulating layer with a first wiring portion therein of which first wiring portion a side surface is exposed at a side portion of the first semiconductor chip, the second semiconductor chip includes a second semiconductor substrate on which his stacked a second insulating layer with a second wiring portion therein of which second wiring portion a side surface is exposed at a side portion of the second semiconductor chip, the first and second insulating layers are opposed to each other, and opposed surfaces of the first semiconductor chip and the second semiconductor chip are bonded to each other;

the respective side surfaces of the first wiring portion and the second wiring portion, which are exposed at the side portions of the first semiconductor chip and the second semiconductor chip, are covered by a conductive layer, and the first wiring portion and the second wiring portion are electrically connected to each other through the conductive layer, and the first semiconductor substrate is thinner than the second semiconductor substrate.

12. The electronic device of claim 11 wherein the first semiconductor chip is thinner than the second semiconductor chip.

13. The electronic device of claim 12, wherein:

the first semiconductor chip includes pixels each of which includes a photoelectric conversion portion, and for each pixel, the photoelectric conversion portion is configured to receive incident light which is incident from a surface of the first semiconductor chip on a side opposite to a surface thereof on which the second semiconductor chip is stacked.

14. The electronic device of claim 12, wherein the first semiconductor chip includes a semiconductor memory element.

15. The electronic device of claim 12, wherein the first semiconductor chip includes a semiconductor element which on a SOI (Silicon on Insulator) substrate.

16. The electronic device of claim 13, wherein the second semiconductor chip includes a signal processing circuit.

* * * * *